(12) United States Patent
Koezuka et al.

(10) Patent No.: US 10,002,970 B2
(45) Date of Patent: Jun. 19, 2018

(54) SEMICONDUCTOR DEVICE, MANUFACTURING METHOD OF THE SAME, OR DISPLAY DEVICE INCLUDING THE SAME

(71) Applicant: Semiconductor Energy Laboratory Co., Ltd., Atsugi-shi, Kanagawa-ken (JP)

(72) Inventors: Junichi Koezuka, Tochigi (JP); Masami Jintyou, Tochigi (JP); Yoshiaki Oikawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 236 days.

(21) Appl. No.: 15/137,087

(22) Filed: Apr. 25, 2016

(65) Prior Publication Data
US 2016/0322395 A1    Nov. 3, 2016

(30) Foreign Application Priority Data

Apr. 30, 2015 (JP) ................................. 2015-093133

(51) Int. Cl.
*H01L 29/786* (2006.01)
*H01L 27/12* (2006.01)
(Continued)

(52) U.S. Cl.
CPC ...... *H01L 29/78648* (2013.01); *G02F 1/1368* (2013.01); *G02F 1/13624* (2013.01);
(Continued)

(58) Field of Classification Search
CPC ......... H01L 29/78618; H01L 29/42384; H01L 29/49; H01L 29/4908; H01L 29/786;
(Continued)

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Eduardo A Rodela
(74) *Attorney, Agent, or Firm* — Fish & Richardson P.C.

(57) ABSTRACT

To provide a novel semiconductor device including an oxide semiconductor film. The semiconductor device includes a first transistor and a second transistor. The first transistor includes a first gate electrode, a first insulating film over the first gate electrode, a first oxide semiconductor film over the first insulating film, a source electrode electrically connected to the first oxide semiconductor film, a drain electrode electrically connected to the first oxide semiconductor film, a second insulating film over the first oxide semiconductor film, a second oxide semiconductor film functioning as a second gate electrode, over the second insulating film, and a third insulating film over the second oxide semiconductor film. The second transistor includes a third oxide semiconductor film including a channel region, a source region, and a drain region over the second insulating film, a fourth insulating film over the channel region, a third gate electrode over the fourth insulating film, and the third insulating film over the source region and the drain region.

17 Claims, 55 Drawing Sheets

(51) Int. Cl.
  *G06F 3/041* (2006.01)
  *G06F 3/044* (2006.01)
  *G02F 1/1368* (2006.01)
  *H01L 29/49* (2006.01)
  *H01L 29/423* (2006.01)
  *G02F 1/1362* (2006.01)

(52) U.S. Cl.
  CPC ............ *G06F 3/044* (2013.01); *G06F 3/0416* (2013.01); *H01L 27/1225* (2013.01); *H01L 27/1251* (2013.01); *H01L 29/42384* (2013.01); *H01L 29/49* (2013.01); *H01L 29/4908* (2013.01); *H01L 29/78645* (2013.01); *H01L 29/78687* (2013.01); *G06F 2203/04103* (2013.01)

(58) Field of Classification Search
  CPC ......... H01L 29/78687; H01L 29/78645; H01L 29/78648
  See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,859,521 | B2 | 12/2010 | Hotelling et al. |
| 7,910,490 | B2 | 3/2011 | Akimoto et al. |
| 7,920,129 | B2 | 4/2011 | Hotelling et al. |
| 7,932,521 | B2 | 4/2011 | Akimoto et al. |
| 7,994,500 | B2 | 8/2011 | Kim et al. |
| 7,995,041 | B2 | 8/2011 | Chang |
| 8,058,645 | B2 | 11/2011 | Jeong et al. |
| 8,102,476 | B2 | 1/2012 | Son et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,217,913 | B2 | 7/2012 | Hotelling et al. |
| 8,274,077 | B2 | 9/2012 | Akimoto et al. |
| 8,363,027 | B2 | 1/2013 | Hotelling et al. |
| 8,466,463 | B2 | 6/2013 | Akimoto et al. |
| 8,502,799 | B2 | 8/2013 | Hotelling et al. |
| 8,551,824 | B2 | 10/2013 | Yamazaki et al. |
| 8,629,069 | B2 | 1/2014 | Akimoto et al. |
| 8,669,550 | B2 | 3/2014 | Akimoto et al. |
| 8,786,557 | B2 | 7/2014 | Noguchi et al. |
| 8,790,959 | B2 | 7/2014 | Akimoto et al. |
| 8,796,069 | B2 | 8/2014 | Akimoto et al. |
| 8,916,424 | B2 | 12/2014 | Isobe et al. |
| 8,945,982 | B2 | 2/2015 | Yamazaki |
| 8,999,773 | B2 | 4/2015 | Hanaoka et al. |
| 9,099,562 | B2 | 8/2015 | Akimoto et al. |
| 9,117,662 | B2 | 8/2015 | Isobe et al. |
| 9,134,560 | B2 | 9/2015 | Hotelling et al. |
| 9,153,436 | B2 | 10/2015 | Yamazaki et al. |
| 9,171,957 | B2 | 10/2015 | Yamazaki |
| 9,412,876 | B2* | 8/2016 | Koezuka ............ H01L 29/78693 |
| 9,530,894 | B2* | 12/2016 | Koezuka ............... H01L 27/124 |
| 9,847,358 | B2* | 12/2017 | Koezuka ............ H01L 27/1251 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

(56) References Cited

U.S. PATENT DOCUMENTS

| | | |
|---|---|---|
| 2010/0163874 A1 | 7/2010 | Koyama et al. |
| 2010/0320458 A1 | 12/2010 | Umeda et al. |
| 2010/0320459 A1 | 12/2010 | Umeda et al. |
| 2011/0032435 A1 | 2/2011 | Kimura |
| 2011/0193083 A1 | 8/2011 | Kim et al. |
| 2011/0212569 A1 | 9/2011 | Yamazaki et al. |
| 2011/0215328 A1 | 9/2011 | Morosawa et al. |
| 2011/0263091 A1 | 10/2011 | Yamazaki |
| 2011/0284844 A1 | 11/2011 | Endo et al. |
| 2012/0119205 A1 | 5/2012 | Taniguchi et al. |
| 2013/0193432 A1 | 8/2013 | Yamazaki |
| 2013/0203214 A1 | 8/2013 | Isobe et al. |
| 2013/0267068 A1 | 10/2013 | Hanaoka et al. |
| 2013/0277672 A1 | 10/2013 | Sano et al. |
| 2014/0034954 A1 | 2/2014 | Yamazaki et al. |
| 2014/0038351 A1 | 2/2014 | Yamazaki et al. |
| 2014/0042432 A1 | 2/2014 | Yamazaki |
| 2014/0042443 A1 | 2/2014 | Yamazaki |
| 2014/0055412 A1 | 2/2014 | Teramoto |
| 2014/0063368 A1 | 3/2014 | Yamazaki et al. |
| 2014/0106504 A1 | 4/2014 | Yamazaki et al. |
| 2014/0206133 A1 | 7/2014 | Koezuka et al. |
| 2014/0267159 A1 | 9/2014 | Miyazaki et al. |
| 2015/0243738 A1 | 8/2015 | Shimomura et al. |
| 2015/0255518 A1 | 9/2015 | Watanabe et al. |
| 2015/0301422 A1 | 10/2015 | Miyake et al. |
| 2015/0303309 A1 | 10/2015 | Koezuka et al. |
| 2015/0311260 A1 | 10/2015 | Senda et al. |
| 2015/0333088 A1 | 11/2015 | Yamazaki et al. |
| 2016/0013298 A1 | 1/2016 | Yamazaki |
| 2016/0020329 A1 | 1/2016 | Koezuka et al. |
| 2017/0317115 A1* | 11/2017 | Ge .................... H01L 29/4908 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-278115 A | 11/2009 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m= 3, 4, and 5), $InGaO_3(ZnO)_3$, and $Ga_2O_3(ZnO)m$ (m= 7, 8, 9, and 16) in the $In_2O_3$—$ZnGaZ_04$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($GaZO_3$—$InZO_3$—ZnO) TFT", SID DIGEST '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID DIGEST '08 : SID International Symposium-Digest of Technical Papers, May 20, 2008, vol. 39, No. 1, pp. 1-4.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., Optical Studies of the Amorphous Liquid-Cholesteric Liquid Crystal Transition:The "Blue Phase", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering"SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID DIGEST '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-OXIDE TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 33, pp. 1330-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for DISPLAY Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID DIGEST '08 SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B) Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 53, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B.(Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides",Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

\* cited by examiner

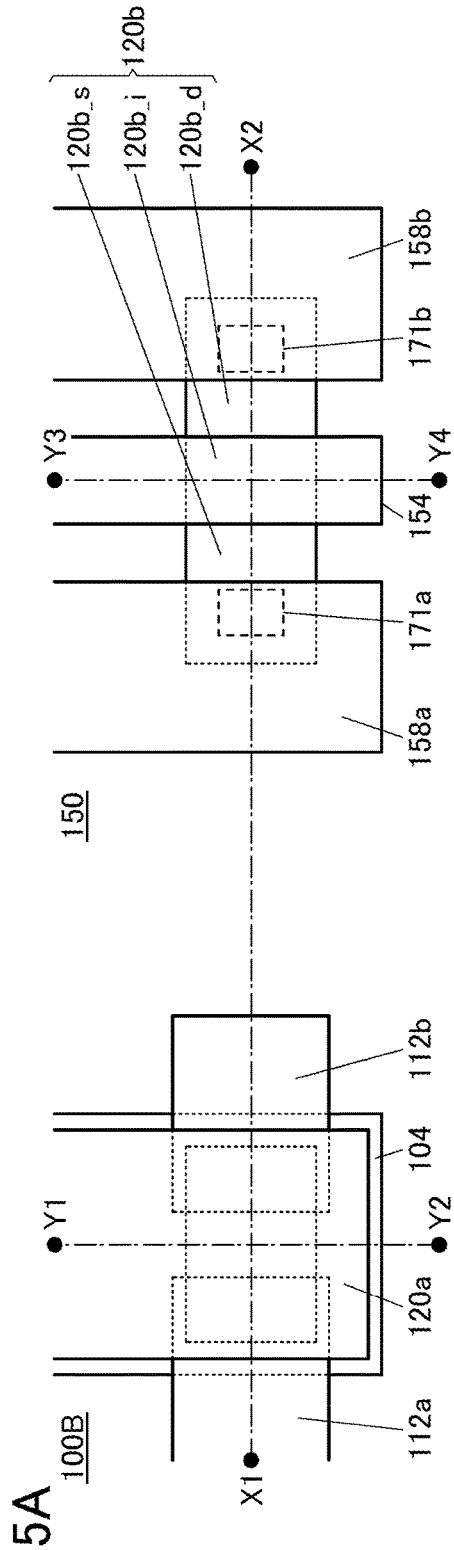
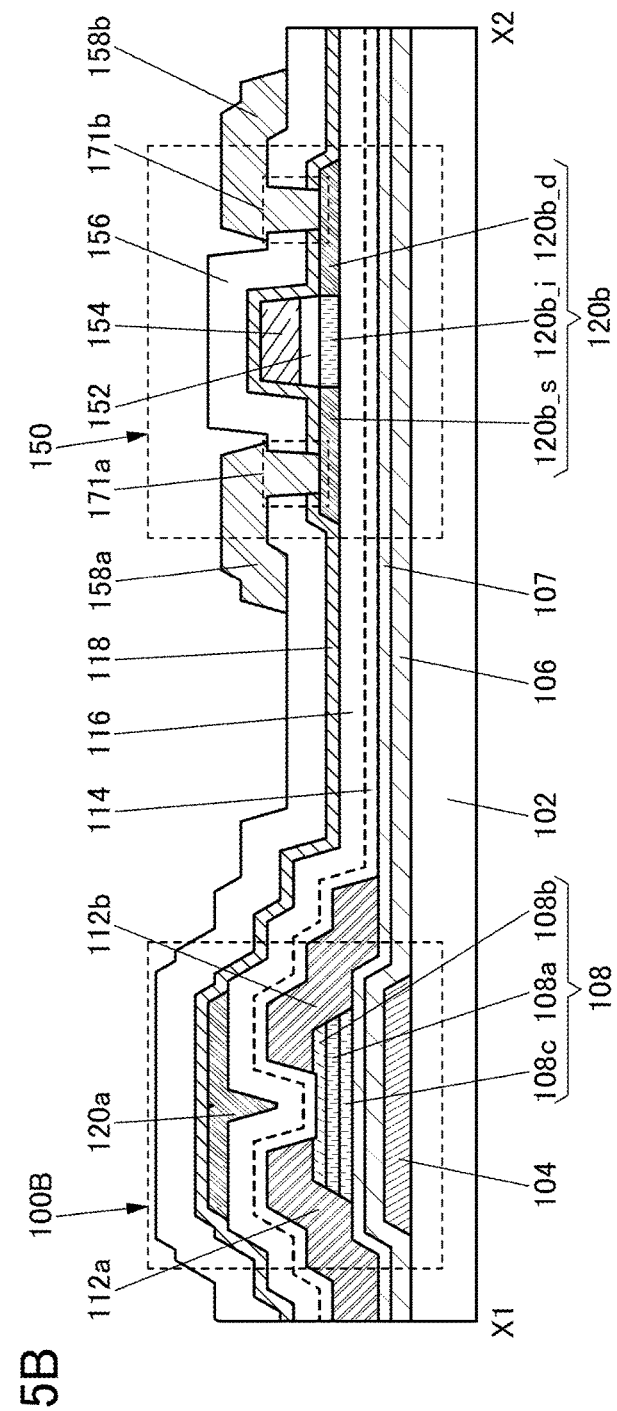

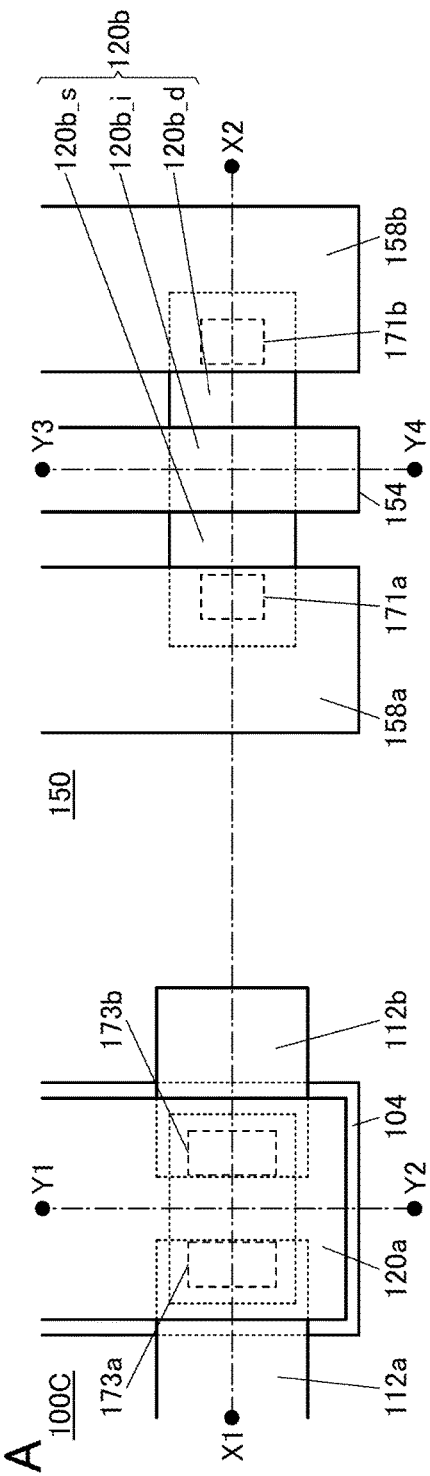
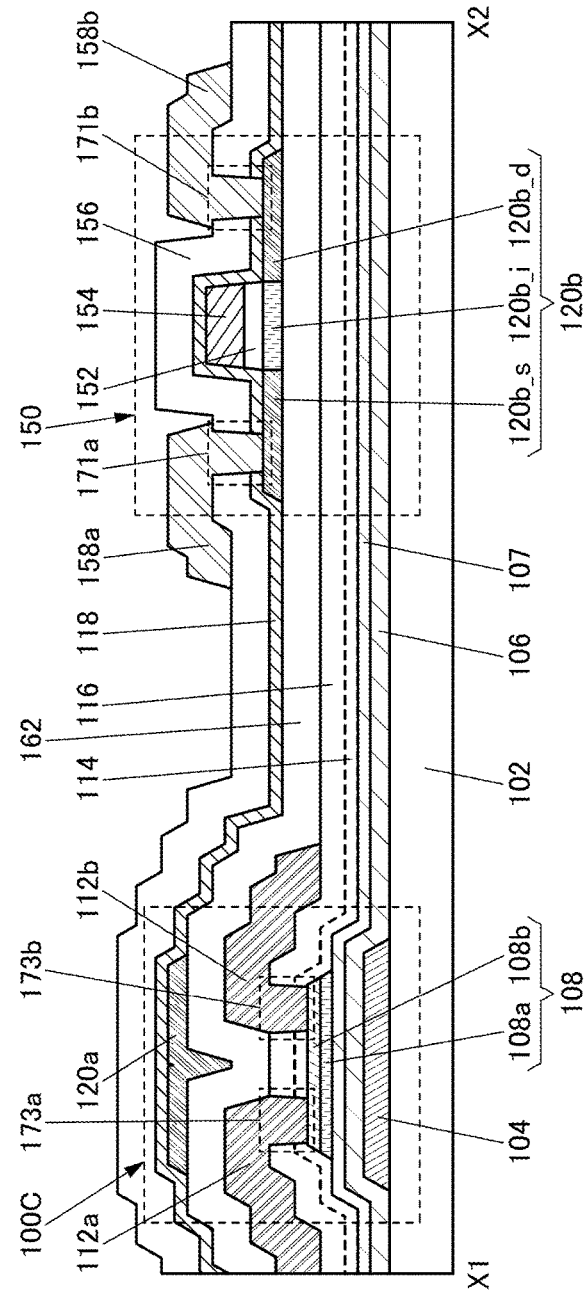
FIG. 9A
FIG. 9B

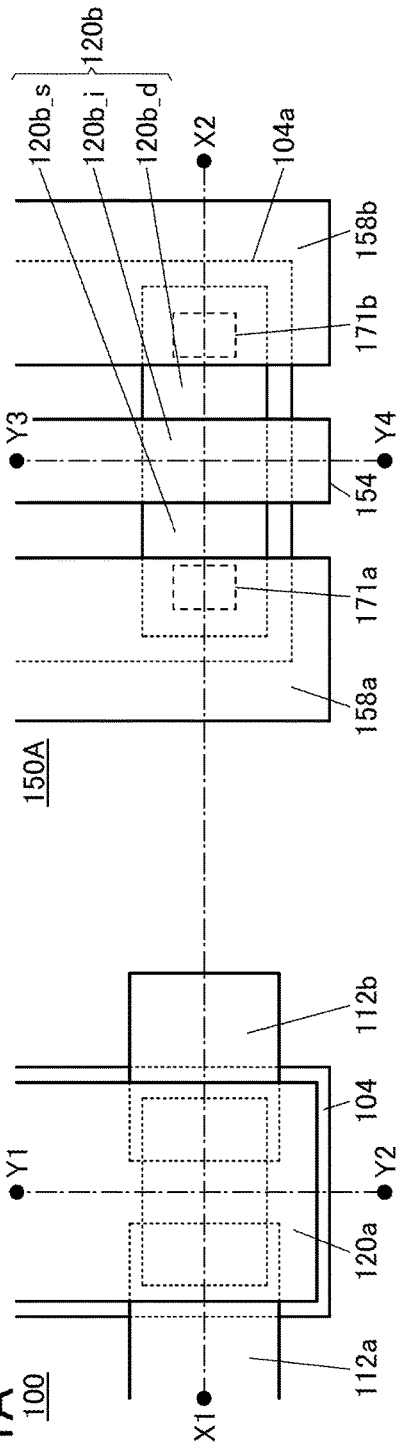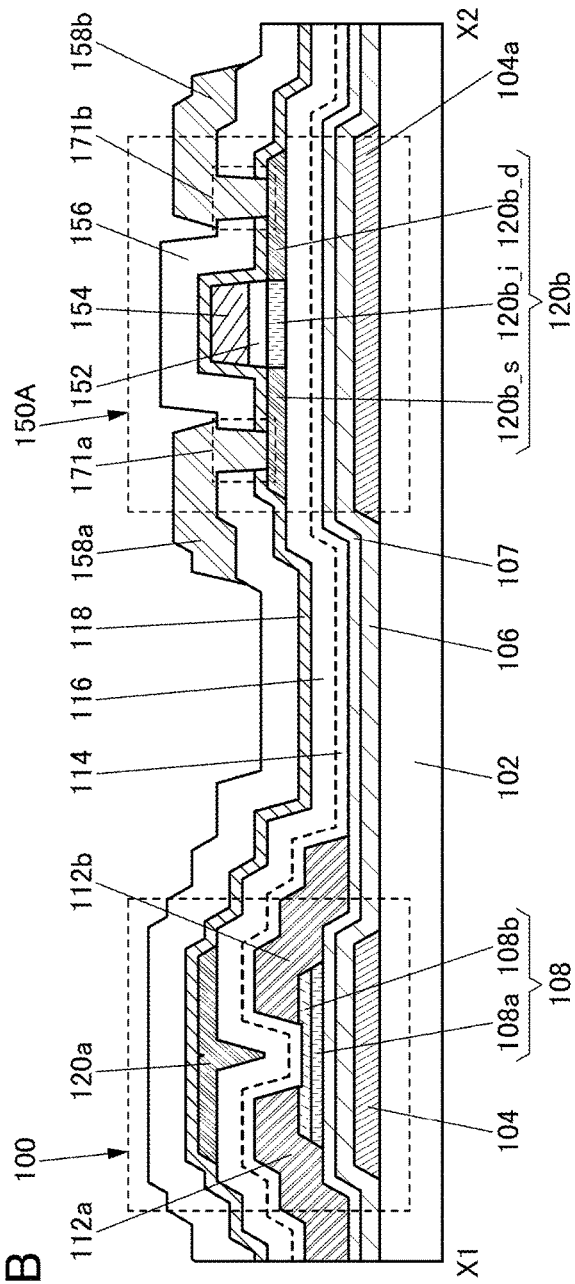

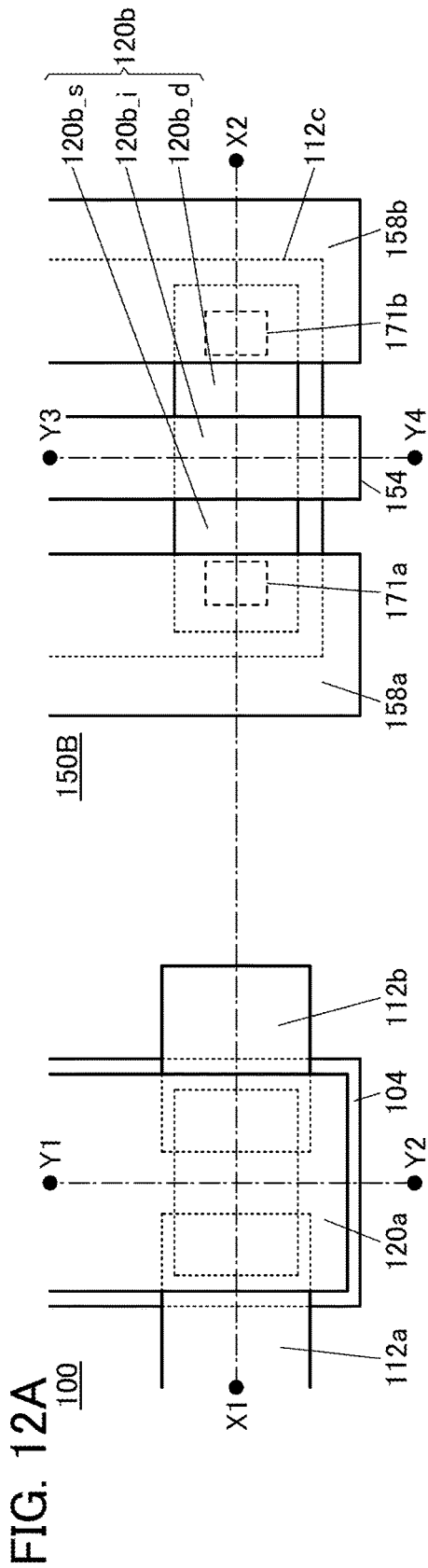
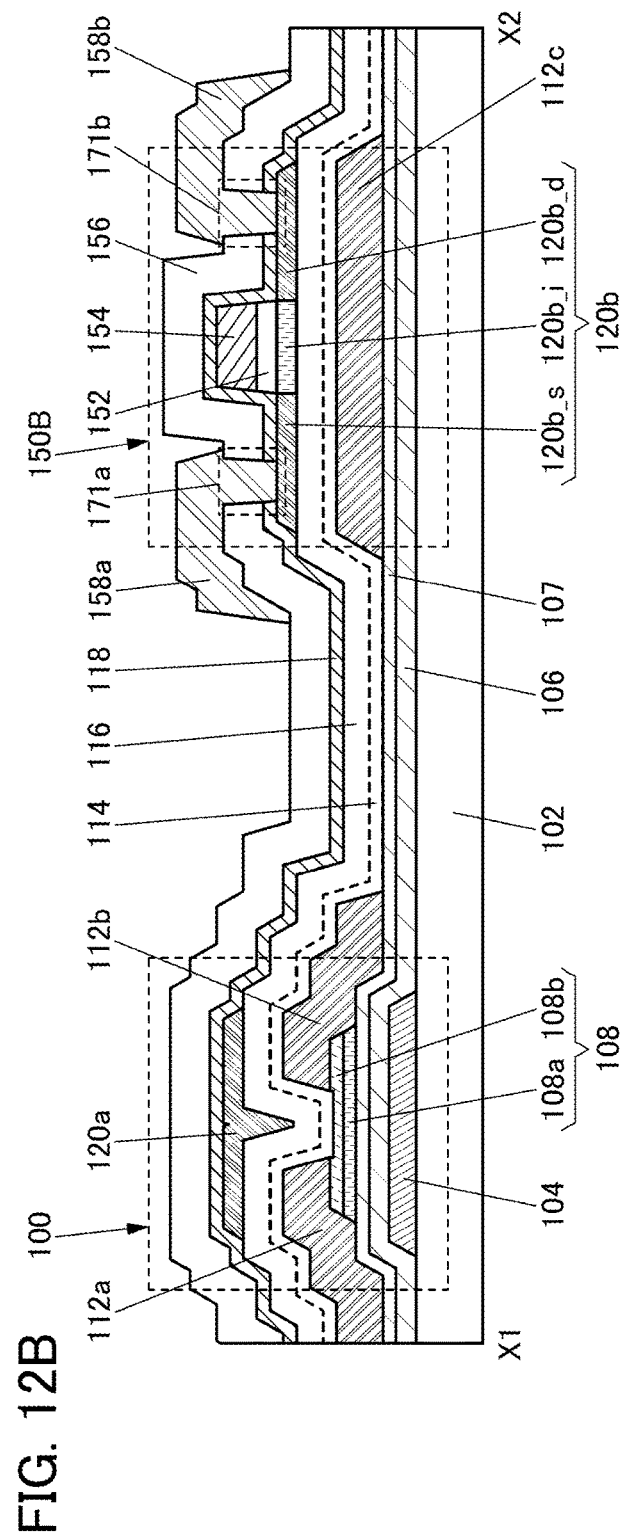
FIG. 12A
FIG. 12B

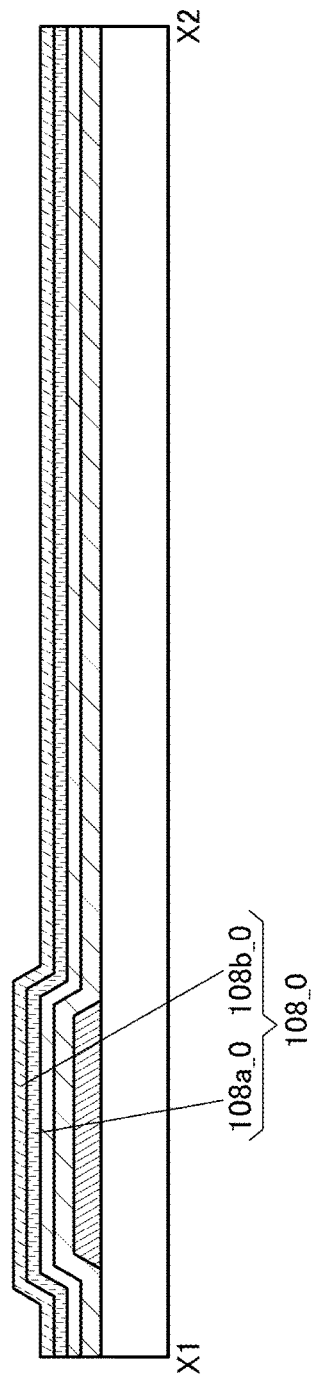
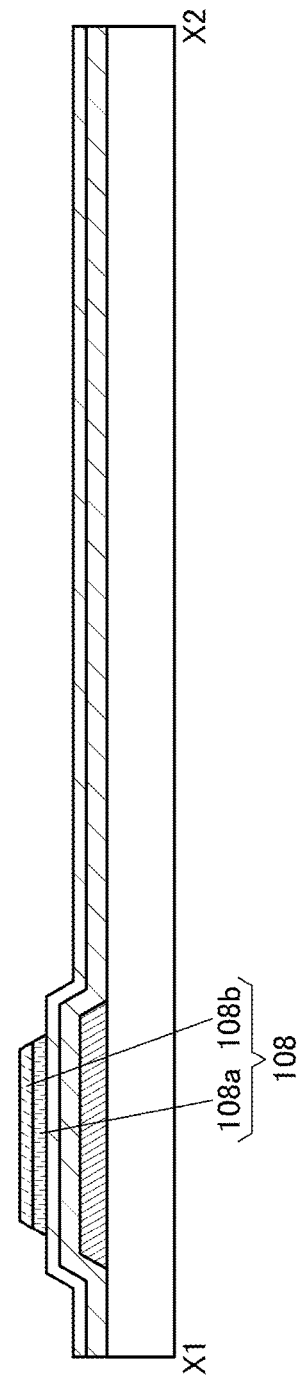
FIG. 15A
FIG. 15B

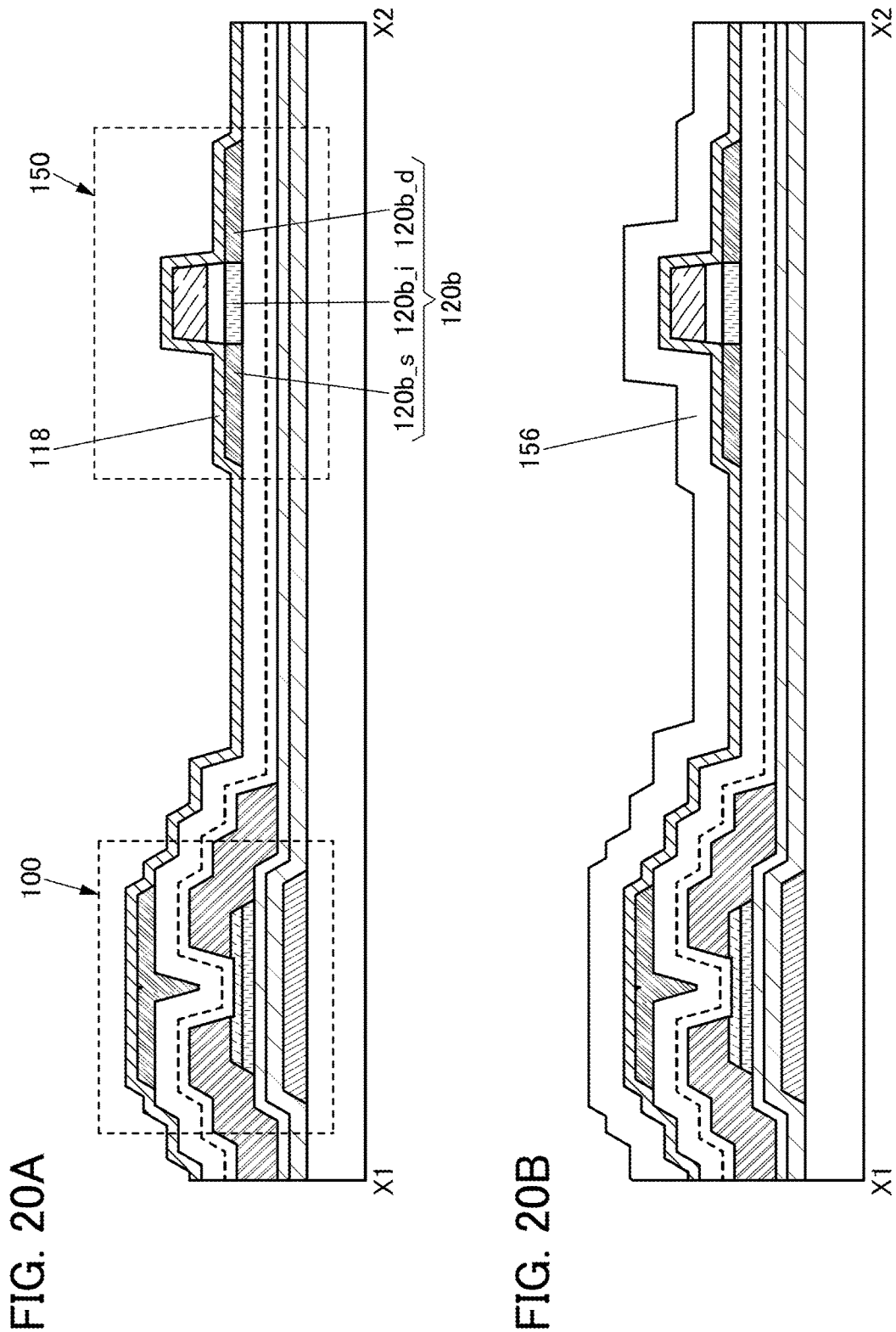

FIG. 48

| | CAAC-OS | | LTPS | | a-Si:H |
|---|---|---|---|---|---|
| | | ⑪ | form pixel electrode | | |
| | | ⑩ | form insulating film | | |
| | | ⑨ | form common electrode | | |
| | | ⑧ | form planarization film | | |
| | | ⑦ | form S/D electrodes | | |
| | | ⑥ | GI+opening to interlayer insulating film | | |
| | | | form interlayer insulating film | | |
| | | | thermal activation | | |
| ⑧ | form pixel electrode | ⑤ | p+ doping(ID) | | |
| ⑦ | form insulating film | | n-doping of entire surface(ID) | | |
| ⑥ | form common electrode | ④ | n+ doping(ID) | ⑦ | form pixel electrode |
| ⑤ | contact opening | ③ | form gate electrode | ⑥ | form insulating film |
| | form passivation film | | form GI | ⑤ | form common electrode |
| ④ | form S/D electrodes | ② | p-Si into island shape | ④ | form S/D electrodes |
| ③ | contact opening | | laser crystallization | ③ | contact opening |
| ② | form OS | | form Si | ② | form active layer |
| | form GI | | form base film | | form GI |
| ① | form gate electrode | ① | form light-blocking film | ① | form gate electrode |
| | a total of 8 masks | | a total of 11 masks | | a total of 7 masks |

SEMICONDUCTOR DEVICE, MANUFACTURING METHOD OF THE SAME, OR DISPLAY DEVICE INCLUDING THE SAME

BACKGROUND OF THE INVENTION

1. Field of the Invention

One embodiment of the present invention relates to a semiconductor device including an oxide semiconductor film. Another embodiment of the present invention relates to a display device including the semiconductor device. Another embodiment of the present invention relates to a manufacturing method of the semiconductor device including the oxide semiconductor film.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique in which a transistor using an oxide semiconductor and a self-aligned top-gate structure is manufactured is disclosed (see Patent Document 1).

REFERENCE

Patent Document

[Patent Document 1] Japanese Published Patent Application No. 2009-278115

SUMMARY OF THE INVENTION

As a transistor including an oxide semiconductor film, an inverted staggered transistor (also referred to as a transistor having a bottom-gate structure), a staggered transistor (also referred to as a transistor having a top-gate structure), and the like are given. In the case where a transistor including an oxide semiconductor film is used for a display device, an inverted staggered transistor is used more often than a staggered transistor because a manufacturing process thereof is relatively simple and manufacturing cost thereof can be kept low.

However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2160 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a staggered transistor.

In view of the foregoing problems, one object of one embodiment of the present invention is to provide a novel semiconductor device including an oxide semiconductor film. Another object of one embodiment of the present invention is to provide a method for manufacturing a novel semiconductor device. Another object of one embodiment of the present invention is to provide a method for manufacturing a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a first transistor and a second transistor. The first transistor includes a first gate electrode, a first insulating film over the first gate electrode, a first oxide semiconductor film over the first insulating film, a source electrode electrically connected to the first oxide semiconductor film, a drain electrode electrically connected to the first oxide semiconductor film, a second insulating film over the first oxide semiconductor film, a second oxide semiconductor film functioning as a second gate electrode, over the second insulating film, and a third insulating film over the second oxide semiconductor film. The second transistor includes a third oxide semiconductor film including a channel region, a source region, and a drain region over the second insulating film, a fourth insulating film over the channel region, a third gate electrode over the fourth insulating film, and the third insulating film over the source region and the drain region.

Another embodiment of the present invention is a display device including a driver circuit portion and a pixel portion. The driver circuit portion and the pixel portion include a first transistor a second transistor, respectively. The first transistor includes a first gate electrode, a first insulating film over the first gate electrode, a first oxide semiconductor film over the first insulating film, a source electrode electrically connected to the first oxide semiconductor film, a drain electrode electrically connected to the first oxide semiconductor film, a second insulating film over the first oxide semiconductor film, a second oxide semiconductor film functioning as a second gate electrode, over the second insulating film, and a third insulating film over the second oxide semiconductor film. The second transistor includes a third oxide semiconductor film including a channel region, a source region, and a drain region over the second insulating film, a fourth insulating film over the channel region, a third gate electrode over the fourth insulating film, and the third insulating film over the source region and the drain region.

In any of the above embodiments, it is preferable that the first oxide semiconductor film, the second oxide semiconductor film, and the third oxide semiconductor film each include In, M (M is Al, Ga, Y, or Sn), and Zn. In any of the above embodiments, it is preferable that at least one of the first oxide semiconductor film, the second oxide semiconductor film, and the third oxide semiconductor film include a multilayer structure. In any of the above embodiments, it is preferable that at least one of the first oxide semiconductor film, the second oxide semiconductor film, and the third oxide semiconductor film include a crystal part having c-axis alignment.

In any of the above embodiments, it is preferable that the first gate electrode and the second gate electrode be electrically connected to each other.

In any of the above embodiments, it is preferable that the second transistor further include a source electrode electrically connected to the source region and a drain electrode electrically connected to the drain region.

In any of the above embodiments, it is preferable that the third insulating film include one of or both hydrogen and nitrogen.

Another embodiment of the present invention is a display module including the display device and a touch sensor. Another embodiment of the present invention is an electronic device including the semiconductor device according to any one of the above embodiments, the display device, or the display module; and an operation key or a battery.

One embodiment of the present invention can provide a novel semiconductor device including an oxide semiconductor film. One embodiment of the present invention can provide a method for manufacturing a novel semiconductor device. One embodiment of the present invention can provide a method for manufacturing a novel display device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 5A and 5B are top views and a cross-sectional view illustrating a semiconductor device.

FIGS. 9A and 9B are top views and a cross-sectional view illustrating a semiconductor device.

FIGS. 11A and 11B are top views and a cross-sectional view illustrating a semiconductor device.

FIGS. 12A and 12B are top views and a cross-sectional view illustrating a semiconductor device.

FIGS. 15A and 15B are cross-sectional views illustrating the method for manufacturing a semiconductor device.

FIGS. 20A and 20B are cross-sectional views illustrating the method for manufacturing a semiconductor device.

FIG. 48 illustrates manufacturing processes of display devices using a horizontal electric field mode liquid crystal element.

DETAILED DESCRIPTION OF THE INVENTION

Figure 1A:
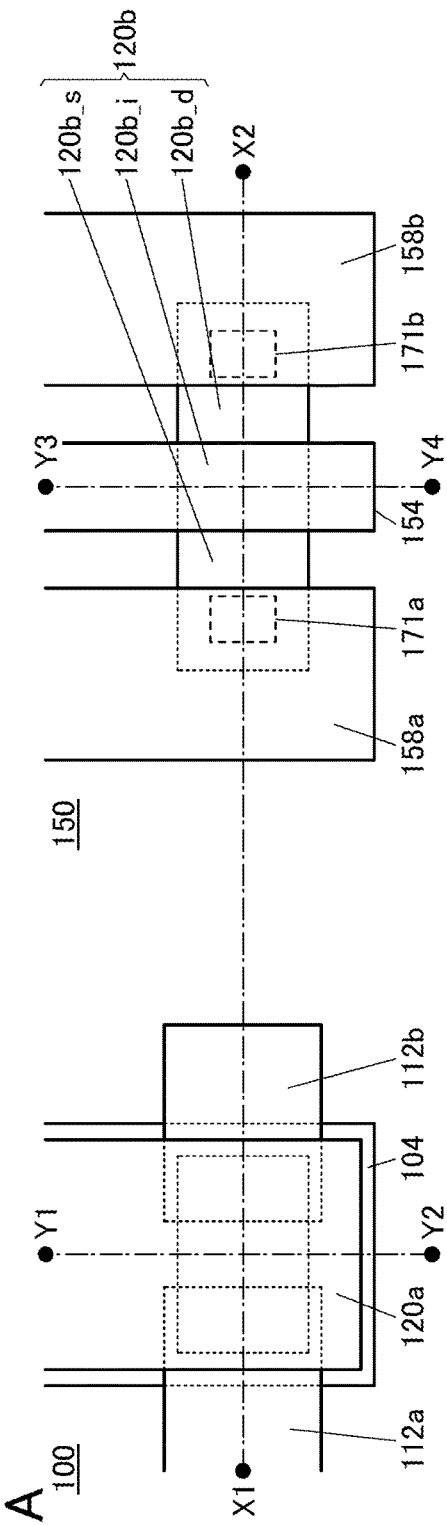
FIGS. 1A and 1B are top views and a cross-sectional view illustrating a semiconductor device.

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In describing structures of the invention with reference to the drawings in this specification and the like, common reference numerals are used for the same portions in different drawings.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification and the like, the channel width is any one of values, the maximum value, the minimum value, or the average value in a region where a channel is formed.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

A voltage usually refers to a potential difference between a given potential and a reference potential (e.g., a source potential or a ground potential (GND)). Therefore, a voltage can also be referred to as potential.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. Furthermore, a silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a semiconductor device of one embodiment of the present invention and a method of manufacturing the semiconductor device are described with reference to FIGS. 1A and 1B, FIGS. 2A and 2B, FIGS. 3A and 3B, FIG. 4, FIGS. 5A and 5B, FIG. 6, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, FIGS. 21A and 21B, and FIG. 22.

<1-1. Structure Example 1 of Semiconductor Device>

Figure 1B:
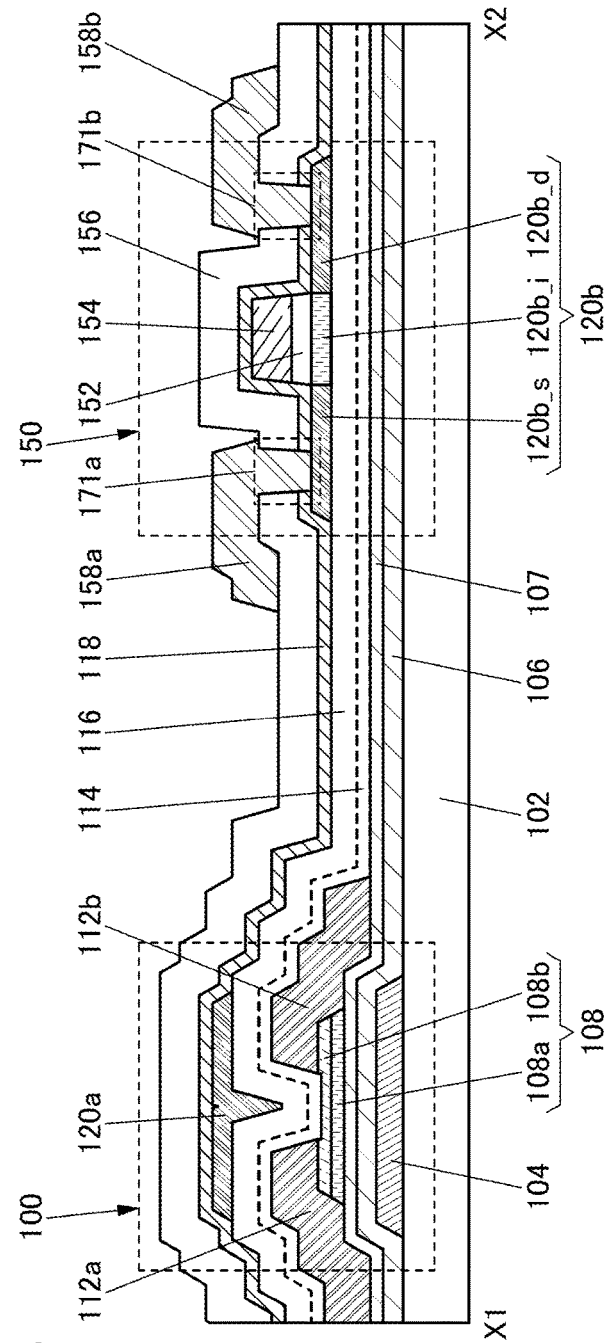
Figure 2A:
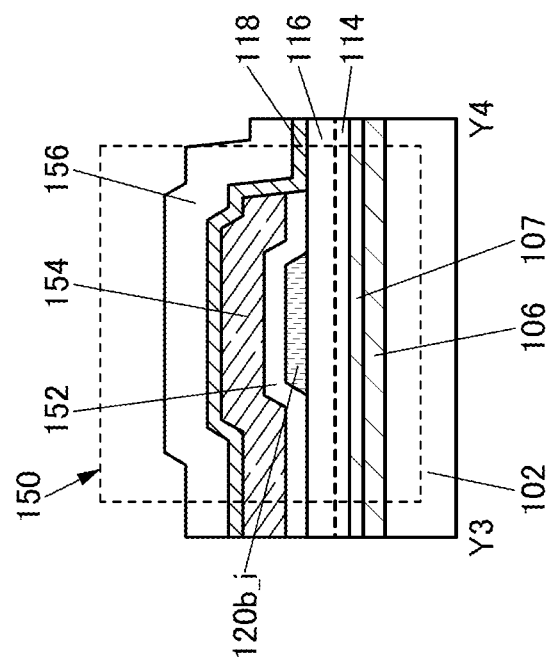
FIGS. 2A and 2B are cross-sectional views illustrating the semiconductor device.
Figure 2B:
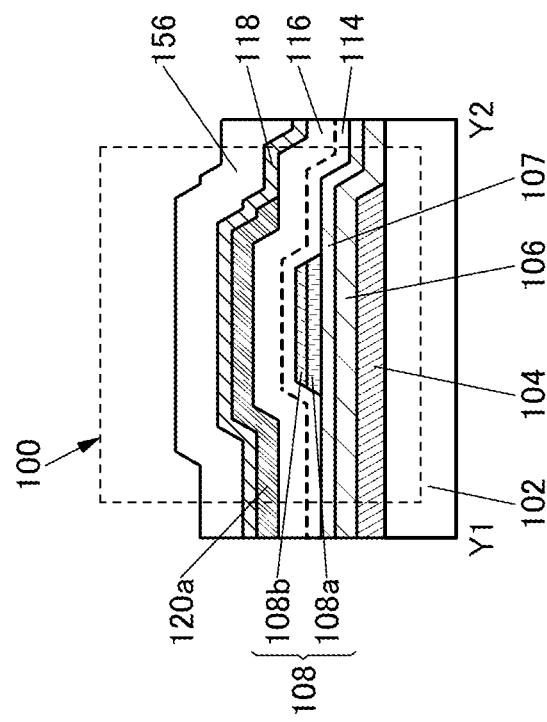

FIG. 1A is a top view of a transistor 100 and a transistor 150 that are semiconductor devices of one embodiment of the present invention. FIG. 1B is a cross-sectional view taken along the dashed-dotted line X1-X2 in FIG. 1A. FIG. 2A is a cross-sectional view taken along the dashed-dotted line Y1-Y2 in FIG. 1A, and FIG. 2B is a cross-sectional view taken along the dashed-dotted line Y3-Y4 in FIG. 1A.

Note that in FIG. 1A, some components of the transistors 100 and 150 (e.g., an insulating film serving as a gate insulating film) are not illustrated to avoid complexity. As in FIG. 1A, some components are not illustrated in some cases in top views of transistors described below. Furthermore, the direction of the dashed-dotted line X1-X2 may be called a channel length direction, and the directions of the dashed-dotted line Y1-Y2 and the dashed-dotted line Y3-Y4 may be called a channel width direction.

As shown in FIGS. 1A and 1B, the semiconductor device of one embodiment of the present invention includes the transistor 100 and the transistor 150 over the same substrate. Note that the transistor 100 is a bottom-gate transistor (also called inverted staggered transistor), and the transistor 150 is a top-gate transistor (also called staggered transistor). Structures of the transistor 100 and the transistor 150 are described in detail below.

[Structure Example of First Transistor]

The transistor 100 includes a conductive film 104 over a substrate 102, an insulating film 106 over the substrate 102 and the conductive film 104, an insulating film 107 over the insulating film 106, an oxide semiconductor film 108 over the insulating film 107, a conductive film 112a electrically connected to the oxide semiconductor film 108, a conductive film 112b electrically connected to the oxide semiconductor film 108, insulating films 114 and 116 over the oxide semiconductor film 108 and the conductive films 112a and 112b, an oxide semiconductor film 120a over the insulating film 116, and an insulating film 118 over the insulating film 116 and the oxide semiconductor film 120a.

The transistor 100 may include an insulating film 156 over the insulating film 118 as shown in FIG. 1B.

Note that in the transistor 100, the insulating films 106 and 107 function as a first gate insulating film of the transistor 100, the insulating films 114 and 116 function as a second gate insulating film of the transistor 100, and the insulating film 118 functions as a protective insulating film of the transistor 100. Note that in this specification and the like, in some cases, the insulating films 106 and 107 are collectively referred to as a first insulating film, the insulating films 114 and 116 are collectively referred to as a second insulating film, and the insulating film 118 is referred to as a third insulating film. In the transistor 100, the conductive film 104 functions as a first gate electrode, the oxide semiconductor film 120a functions as a second gate electrode, the conductive film 112a functions as a source electrode, and the conductive film 112b functions as a drain electrode.

The oxide semiconductor film 108 includes an oxide semiconductor film 108a and an oxide semiconductor film 108b over the oxide semiconductor film 108a. The oxide semiconductor film 108a and the oxide semiconductor film 108b each include In, M (M is Al, Ga, Y, or Sn), and Zn.

The oxide semiconductor film 108a preferably includes a region in which the atomic proportion of In is larger than the atomic proportion of M, for example. The oxide semiconductor film 108b preferably includes a region in which the atomic proportion of In is smaller than that in the oxide semiconductor film 108a.

The oxide semiconductor film 108a including the region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs, preferably exceed 30 cm$^2$/Vs.

For example, when the transistor with high field-effect mobility is used for a driver circuit portion of a display device, particularly for a gate driver that generates a gate signal or a source driver that supplies a data signal (particularly for a demultiplexer connected to an output terminal of a shift register included in a source driver), a semiconductor device or a display device that has a narrow frame can be provided.

Meanwhile, the oxide semiconductor film 108a including the region in which the atomic proportion of In is larger than that of M makes it easier to change electrical characteristics of the transistor 100 in light irradiation. However, in the semiconductor device of one embodiment of the present invention, the oxide semiconductor film 108b is formed over the oxide semiconductor film 108a. Furthermore, the oxide semiconductor film 108b includes the region in which the atomic proportion of In is smaller than that in the oxide semiconductor film 108a and thus has larger Eg than that of the oxide semiconductor film 108a. For this reason, the oxide semiconductor film 108 having a layered structure of the oxide semiconductor film 108a and the oxide semiconductor film 108b has high resistance to a negative bias stress test with light irradiation.

Impurities such as hydrogen or moisture entering the oxide semiconductor film 108, especially those entering a channel region of the oxide semiconductor film 108a, adversely affect the transistor characteristics and therefore cause a problem. Thus, it is preferable that the amount of impurities such as hydrogen or moisture in the channel region of the oxide semiconductor film 108a be as small as possible. Furthermore, oxygen vacancies formed in the channel region of the oxide semiconductor film 108a adversely affect the transistor characteristics and therefore cause a problem. For example, oxygen vacancies formed in the channel region of the oxide semiconductor film 108a are bonded to hydrogen to serve as carrier supply sources. The carrier supply sources generated in the channel region of the oxide semiconductor film 108a cause a change in the electrical characteristics, typically a shift in the threshold voltage, of the transistor 100 including the oxide semiconductor film 108a. Therefore, it is preferable that the amount of oxygen vacancies in the channel region of the oxide semiconductor film 108a be as small as possible.

In the transistor 100 of the present invention, oxygen or excess oxygen is added to the insulating films 107, 114, and 116 and fills the oxygen vacancies in the oxide semiconductor film 108a. Thus, the semiconductor device can have high reliability.

[Structure Example of Second Transistor]

The transistor 150 includes an oxide semiconductor film 120b including a channel region 120b_i, a source region 120b_s, and a drain region 120b_d over the insulating film 116; an insulating film 152 over the channel region 120b_i; a conductive film 154 over the insulating film 152; and the insulating film 118 over the source region 120b_s and the drain region 120b_d. The insulating film 156 is formed over the insulating film 118. An opening 171a that reaches the source region 120b_s and an opening 171b that reaches the drain region 120b_d are formed in the insulating films 118 and 156. Conductive films 158a and 158b are formed over the insulating film 156 to cover inner walls of the openings 171a and 171b.

In the transistor 150, the insulating film 152 functions as a gate insulating film. In the transistor 150, the conductive film 154 functions as a gate electrode. Note that the insulating film 152 is referred to as a fourth insulating film in some cases.

As described above, the semiconductor device of one embodiment of the present invention includes at least two transistors with different structures. One of the transistors is a dual-gate transistor in which a back gate electrode is provided in a bottom-gate transistor, like the transistor 100. The other transistor is a top-gate transistor like the transistor 150.

Note that the oxide semiconductor film 120a of the transistor 100 and the oxide semiconductor film 120b of the transistor 150 are formed by processing the same oxide semiconductor film. The oxide semiconductor film 120a functions as a back gate electrode in the transistor 100, and the oxide semiconductor film 120b functions as an active layer in the transistor 150. That is, some manufacturing steps of the transistors 100 and 150 are common, so that transistors with different structures can be provided over the same substrate.

Providing transistors with different structures over the same substrate can increase the integration degree in the semiconductor device. The transistors with different structures over the same substrate can have different functions. For example, in the case where a semiconductor device including the transistors with different structures is used for a display device, one transistor (e.g., the transistor 100) can be used in a driver circuit portion, and the other transistor (e.g., the transistor 150) can be used as a transistor in a pixel portion.

Note that the channel length directions of the transistors 100 and 150 are the same in FIGS. 1A and 1B, but the channel length directions of the transistors 100 and 150 may be different from each other. For example, the channel length directions of the transistors 100 and 150 may be orthogonal to each other.

The transistor 100 has a structure in which the insulating films in contact with the oxide semiconductor film 108, specifically, the insulating film 107 formed under the oxide semiconductor film 108 and the insulating film 114 formed over the oxide semiconductor film 108 include excess oxygen. Oxygen or excess oxygen is transferred from the insulating film 107 and the insulating film 114 to the oxide semiconductor film 108, whereby the oxygen vacancies in the oxide semiconductor film 108 can be reduced. As a result, a change in electrical characteristics of the transistor 100, particularly a change in the transistor 100 due to light irradiation, can be reduced.

Furthermore, the transistor 150 has a structure in which the insulating films in contact with the oxide semiconductor film 120b, specifically, the insulating film 116 formed under the oxide semiconductor film 120b and the insulating film 152 formed over the oxide semiconductor film 120b include excess oxygen. Oxygen or excess oxygen is transferred from the insulating film 116 and the insulating film 152 to the channel region 120b_i, whereby the oxygen vacancies in the channel region 120b_i can be reduced. As a result, a change in electrical characteristics of the transistor 150, particularly a change in the transistor 150 due to light irradiation, can be reduced.

In the transistor 100, the oxide semiconductor film 120*a* is in contact with the insulating film 118. In the transistor 150, the source region 120*b*_*s* and the drain region 120*b*_*d* are in contact with the insulating film 118. In the structure in which the oxide semiconductor film 120*a*, the source region 120*b*_*s*, and the drain region 120*b*_*d* are in contact with the insulating film 118, hydrogen included in the insulating film 118 is diffused into the oxide semiconductor films, so that the carrier density of the oxide semiconductor films can be increased. That is, the oxide semiconductor film 120*a*, the source region 120*b*_*s*, and the drain region 120*b*_*d* each function as an oxide conductor (OC).

Here, an oxide conductor is described. The oxide semiconductor films 120*a* and 120*b* function as semiconductors before a step of forming the insulating film 118. The oxide semiconductor film 120*a*, the source region 120*b*_*s*, and the drain region 120*b*_*d* function as conductors after the step of forming the insulating film 118.

To allow the oxide semiconductor film 120*a*, the source region 120*b*_*s*, and the drain region 120*b*_*d* to function as conductors, an oxygen vacancy is formed in the oxide semiconductor film 120*a*, the source region 120*b*_*s*, and the drain region 120*b*_*d* and hydrogen is added from the insulating film 118 to the oxygen vacancy, whereby a donor level is formed in the vicinity of the conduction band. As a result, the oxide semiconductor film 120*a*, the source region 120*b*_*s*, and the drain region 120*b*_*d* have higher conductivity and become conductors. The oxide semiconductor film 120*a*, the source region 120*b*_*s*, and the drain region 120*b*_*d* having become conductors can each be referred to as oxide conductor.

Note that in this embodiment, the structure in which hydrogen is added from the insulating film 118 to the oxide semiconductor film 120*a*, the source region 120*b*_*s*, and the drain region 120*b*_*d* is described, but one embodiment of the present invention is not limited to the structure. For example, another impurity may be added to the oxide semiconductor film 120*a*, the source region 120*b*_*s*, and the drain region 120*b*_*d* to form oxide conductors. Examples of the impurity include boron, carbon, nitrogen, fluorine, phosphorus, chlorine, helium, neon, argon, krypton, and xenon. Note that these impurities can be added by an ion doping method, plasma treatment, or the like.

Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

The channel region 120*b*_*i* is covered with the insulating film 152 and therefore not in contact with the insulating film 118. Thus, the channel region 120*b*_*i* functions as a semiconductor.

As described above, the oxide semiconductor film 120*a* functioning as the second gate electrode of the transistor 100 and the channel region 120*b*_*i*, the source region 120*b*_*s*, and the drain region 120*b*_*d* of the transistor 150 can be formed by processing the same oxide semiconductor film and changing the structure of the insulating film in contact with the oxide semiconductor film.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 and 150 can be manufactured with high productivity.

Specifically, in a step of forming the oxide semiconductor film 108*a*, the oxide semiconductor film 108*a* is formed by a sputtering method in an atmosphere containing an oxygen gas, whereby oxygen or excess oxygen is added to the insulating film 107 over which the oxide semiconductor film 108*a* is formed.

Furthermore, in a step of forming the oxide semiconductor films 120*a* and 120*b*, the oxide semiconductor films 120*a* and 120*b* are formed by a sputtering method in an atmosphere containing an oxygen gas, whereby oxygen or excess oxygen is added to the insulating film 116 over which the oxide semiconductor films 120*a* and 120*b* are formed. Note that in some cases, oxygen or excess oxygen is added also to the insulating film 114 and the oxide semiconductor film 108 under the insulating film 116 when oxygen or excess oxygen is added to the insulating film 116.

As described above, the semiconductor device of one embodiment of the present invention includes two transistors with different structures over the same substrate. The oxide semiconductor film functioning as the back gate electrode of one of the transistors and the oxide semiconductor film functioning as the active layer of the other transistor are formed by processing the same oxide semiconductor film, and thus, an increase in manufacturing steps can be suppressed.

<1-2. Components of Semiconductor Device>

Components of the semiconductor device of this embodiment will be described in detail below.

[Substrate]

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Films Functioning as Gate Electrode and Source and Drain Electrodes]

The conductive film 104 functioning as the gate electrode, the conductive film 112*a* functioning as the source electrode, the conductive film 112*b* functioning as the drain electrode, the conductive film 158*a* functioning as a source electrode, and the conductive film 158b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 104, 112a, 112b, 158a, and 158b may have a single-layer structure or a stacked-layer structure of two or more layers. For example, a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a titanium film; a three-layer structure of a titanium film, an aluminum film over the titanium film, and a titanium film over the aluminum film; a three-layer structure of a titanium film, a copper film over the titanium film, and a titanium film over the copper film; or the like can be used. Alternatively, an alloy film or a nitride film that contains aluminum and one or more metals selected from titanium, tantalum, tungsten, molybdenum, chromium, neodymium, and scandium may be used.

The conductive films 104, 112a, 112b, 158a, and 158b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, 112b, 158a, and 158b. Use of a Cu—X alloy film enables the manufacturing cost to be reduced because wet etching process can be used in the processing.

[First Gate Insulating Film]

As each of the insulating films 106 and 107 functioning as the gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as the channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen-excess region in the insulating film 107, the insulating film 107 is formed in an oxygen atmosphere, for example. Alternatively, oxygen may be added to the deposited insulating film 107.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 150, the physical thickness of the insulating film can be increased. This makes it possible to reduce a decrease in withstand voltage of the transistor 100 and furthermore to increase the withstand voltage, thereby reducing electrostatic discharge damage to the transistor 100.

[First Oxide Semiconductor Film]

The oxide semiconductor film 108 can be formed using the materials described above.

In the case where the oxide semiconductor film 108a is In-M-Zn oxide, the atomic ratio of metal elements in a sputtering target used for forming the In-M-Zn oxide preferably satisfies In>M Examples of the atomic ratio of metal elements in such a sputtering target include In:M:Zn=2:1:3, In:M:Zn=3:1:2, and In:M:Zn=4:2:4.1.

In the case where the oxide semiconductor film 108b is In-M-Zn oxide, the atomic ratio of metal elements in a sputtering target used for forming the In-M-Zn oxide preferably satisfies In M Examples of the atomic ratio of metal elements in such a sputtering target include In:M:Zn=1:1:1, In:M:Zn=1:1:1.2, In:M:Zn=1:3:2, In:M:Zn=1:3:4, and In:M:Zn=1:3:6.

In the case where the oxide semiconductor film 108a and the oxide semiconductor film 108b are each In-M-Zn oxide, it is preferable to use a target including polycrystalline In-M-Zn oxide as the sputtering target. The use of the target including polycrystalline In-M-Zn oxide facilitates formation of the oxide semiconductor film 108a and the oxide semiconductor film 108b having crystallinity. Note that the atomic ratios of metal elements in the oxide semiconductor film 108a and the oxide semiconductor film 108b vary from the above atomic ratio of metal elements of the sputtering target within a range of approximately ±40% in some cases. For example, when a sputtering target with an atomic ratio of In to Ga and Zn of 4:2:4.1 is used for forming the oxide semiconductor film 108a, the atomic ratio of In to Ga and Zn in the oxide semiconductor film 108a may be 4:2:3 or in the vicinity Of 4:2:3.

The energy gap of the oxide semiconductor film 108a is 2 eV or more, preferably 2.5 eV or more, further preferably 3 eV or more. The use of the oxide semiconductor film 108a having such a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108a, and an oxide semiconductor film having an energy gap more than or equal to 2.5 eV and less than or equal to 3.5 eV is preferably used as the oxide semiconductor film 108b. Furthermore, the oxide semiconductor film 108b preferably has a higher energy gap than that of the oxide semiconductor film 108a.

Each thickness of the oxide semiconductor film 108a and the oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108a. For example, the carrier density of the oxide semiconductor film 108a is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$.

Note that, without limitation to the compositions and materials described above, a material with an appropriate composition can be used depending on required semiconductor characteristics and electrical characteristics (e.g., field-effect mobility and threshold voltage) of the transistor. Further, in order to obtain required semiconductor characteristics of the transistor, it is preferable that the carrier density, the impurity concentration, the defect density, the atomic ratio of a metal element to oxygen, the interatomic distance, the density, and the like of the oxide semiconductor film 108a and the oxide semiconductor film 108b be set to be appropriate.

Note that it is preferable to use, as the oxide semiconductor film 108a and the oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". It is also possible to call this state "intrinsic" or "substantially intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width W of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2 \times 10^{20}$ atoms/cm³, preferably lower than or equal to $5 \times 10^{19}$ atoms/cm³, further preferably lower than or equal to $1 \times 10^{19}$ atoms/cm³, further preferably lower than or equal to $5 \times 10^{18}$ atoms/cm³, further preferably lower than or equal to $1 \times 10^{18}$ atoms/cm³, further preferably lower than or equal to $5 \times 10^{17}$ atoms/cm³, and further preferably lower than or equal to $1 \times 10^{16}$ atoms/cm³.

The oxide semiconductor film 108a preferably includes a region in which hydrogen concentration is smaller than that in the oxide semiconductor film 108b. A semiconductor device including the oxide semiconductor film 108a having the region in which hydrogen concentration is smaller than that in the oxide semiconductor film 108b can be increased in reliability.

When silicon or carbon that is one of elements belonging to Group 14 is included in the oxide semiconductor film 108a, oxygen vacancy is increased in the oxide semiconductor film 108a, and the oxide semiconductor film 108a becomes an n-type film. Thus, the concentration of silicon or carbon (the concentration is measured by SIMS) in the oxide semiconductor film 108a or the concentration of silicon or carbon (the concentration is measured by SIMS) in the vicinity of an interface with the oxide semiconductor film 108b is set to be lower than or equal to $2 \times 10^{18}$ atoms/cm³, preferably lower than or equal to $2 \times 10^{17}$ atoms/cm³.

In addition, the concentration of alkali metal or alkaline earth metal of the oxide semiconductor film 108a, which is measured by SIMS, is lower than or equal to $1 \times 10^{18}$ atoms/cm³, preferably lower than or equal to $2 \times 10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108a.

Furthermore, when including nitrogen, the oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm³.

The oxide semiconductor film 108a and the oxide semiconductor film 108b may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

[Second Gate Insulating Film]

The insulating films 114 and 116 function as the second gate insulating film of the transistor 100. The insulating films 114 and 116 function also as a base insulating film of the transistor 150. In addition, the insulating films 114 and 116 have a function of supplying oxygen to the oxide semiconductor films 108 and 120b. That is, the insulating films 114 and 116 contain oxygen. Furthermore, the insulating film 114 is an insulating film which can transmit oxygen. Note that the insulating film 114 functions also as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the amount of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is 1 or 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using the above-described oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

The first signal, the second signal, and the third signal correspond to signals attributed to nitrogen oxide. In other words, the lower the total density of the spin attributed to the first signal, the second signal, and the third signal is, the lower the content of nitrogen oxide in the oxide insulating film is.

The concentration of nitrogen of the above-described oxide insulating film measured by SIMS is lower than or equal to $6 \times 10^{20}$ atoms/cm$^3$.

The above-described oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. An oxide insulating film including oxygen in excess of that in the stoichiometric composition is an oxide insulating film of which the amount of released oxygen converted into oxygen atoms is greater than or equal to $1.0\times10^{19}$ atoms/cm$^3$, or greater than or equal to $3.0\times10^{20}$ atoms/cm$^3$, in TDS analysis at a temperature higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the amount of defects in the insulating film 116 be small, and typically the spin density corresponding to a signal which appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited to this. For example, a single-layer structure of the insulating film 114 may be employed.

[Second Oxide Semiconductor Film and Third Oxide Semiconductor Film]

The oxide semiconductor film 120*a* and the oxide semiconductor film 120*b* can be formed using a material and a formation method that are similar to those of the oxide semiconductor film 108.

That is, the oxide semiconductor film 120*a* and the oxide semiconductor film 120*b* include a metal element that is the same as that included in the oxide semiconductor film 108. For example, the oxide semiconductor film 108, the oxide semiconductor film 120*a*, and the oxide semiconductor film 120*b* include the same metal element; thus, the manufacturing cost can be reduced.

For example, in the case where the oxide semiconductor film 120*a* and the oxide semiconductor film 120*b* are each In-M-Zn oxide, the atomic ratio of metal elements in a sputtering target used for forming the In-M-Zn oxide preferably satisfies In≥M Examples of the atomic ratio of metal elements in such a sputtering target include In:M:Zn=2:1:3, In:M:Zn=3:1:2, and In:M:Zn=4:2:4.1.

The oxide semiconductor film 120*a* and the oxide semiconductor film 120*b* can each have a single-layer structure or a stacked-layer structure of two or more layers. Note that in the case where the oxide semiconductor films 120*a* and 120*b* each have a stacked-layer structure, the composition of the sputtering target is not limited to that described above. In the case where the oxide semiconductor films 120*a* and 120*b* each have a stacked-layer structure, the stacked-layer structure may be similar to that of the above-described oxide semiconductor film 108 (e.g., a stacked-layer structure of the oxide semiconductor film 108*a* and the oxide semiconductor film 108*b* over the oxide semiconductor film 108*a*). Alternatively, in the case where the oxide semiconductor films 120*a* and 120*b* each have a stacked-layer structure, the stacked-layer structure may be similar to the stacked-layer structure of the oxide semiconductor film 108*b* and the oxide semiconductor film 108*a* over the oxide semiconductor film 108*b*.

[Insulating Film Functioning as Protective Insulating Film of Transistor]

The insulating film 118 functions as the protective insulating film of the transistor 100. The insulating film 118 is in contact with the source region 120*b_s* and the drain region 120*b_d* of the transistor 150 and has a function of supplying an impurity to the source region 120*b_s* and the drain region 120*b_d*.

For example, the insulating film 118 includes one or both of hydrogen and nitrogen. Alternatively, the insulating film 118 includes nitrogen and silicon. The insulating film 118 has a function of blocking oxygen, hydrogen, water, an alkali metal, an alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one of or both hydrogen and nitrogen to the oxide semiconductor film 120*a*, the source region 120*b_s*, and the drain region 120*b_d*. It is particularly preferable that the insulating film 118 include hydrogen and have a function of supplying the hydrogen to the oxide semiconductor film 120*a*, the source region 120*b_s*, and the drain region 120*b_d*. The oxide semiconductor film 120*a*, the source region 120*b_s*, and the drain region 120*b_d* supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal chemical vapor deposition (CVD) method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. For example, two or more kinds of source gases may be sequentially supplied to the chamber. In this case, after the reaction of a first source gas, an inert gas is introduced, and then a second source gas is introduced so that the source gases are not mixed. Alternatively, the second source gas may be introduced after the first source gas is exhausted by vacuum evacuation instead of the introduction of the inert gas. The first source gas is adsorbed on the surface of the substrate and reacted to form a first layer; then the second source gas introduced after that is absorbed and reacted; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by a thermal CVD method such as an MOCVD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) can be used. Note that without limitation to the above combination, triethylgallium (Ga(C$_2$H$_5$)$_3$) can be used instead of trimethylgallium and diethylzinc (Zn(C$_2$H$_5$)$_2$) can be used instead of dimethylzinc.

For example, in the case where a hafnium oxide film is formed with a deposition apparatus employing ALD, two kinds of gases, i.e., ozone (O$_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, Hf[N(CH$_3$)$_2$]$_4$) and tetrakis(ethylmethylamide) hafnium) are used.

For example, in the case where an aluminum oxide film is formed using a deposition apparatus employing ALD, two kinds of gases, e.g., H$_2$O as an oxidizer and a source gas which is obtained by vaporizing liquid containing a solvent and an aluminum precursor (e.g., trimethylaluminum (TMA, Al(CH$_3$)$_3$)) are used. Examples of another material include tris(dimethylamide)aluminum, triisobutylaluminum, and aluminum tris (2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus using an ALD method, a WF$_6$ gas and a B$_2$H$_6$ gas are sequentially introduced to form an initial tungsten film, and then a tungsten film is formed using a WF$_6$ gas and an H$_2$ gas. Note that an SiH$_4$ gas may be used instead of a B$_2$H$_6$ gas.

For example, in the case where an oxide semiconductor film, e.g., an In—Ga—Zn—O film is formed with a deposition apparatus using ALD, an In(CH$_3$)$_3$ gas and an O$_3$ gas are used to form an InO layer, then a Ga(CH$_3$)$_3$ gas and an O$_3$ gas are used to form a GaO layer, and then a Zn(CH$_3$)$_2$ gas and an O$_3$ gas are used to form a ZnO layer. Note that the order of these layers is not limited to this example. A mixed compound layer such as an In—Ga—O layer, an In—Zn—O layer, or a Ga—Zn—O layer may be formed by using these gases. Note that although an H$_2$O gas which is obtained by bubbling with an inert gas such as Ar may be used instead of an O$_3$ gas, it is preferable to use an O$_3$ gas, which does not contain H.

<1-3. Structure Example 2 of Semiconductor Device>

Next, structures different from the structure shown in FIGS. 1A and 1B and FIGS. 2A and 2B are described with reference to FIGS. 3A and 3B, FIG. 4, FIGS. 5A and 5B, FIG. 6, FIGS. 7A and 7B, FIGS. 8A and 8B, FIGS. 9A and 9B, and FIGS. 10A and 10B.

Figure 3A:
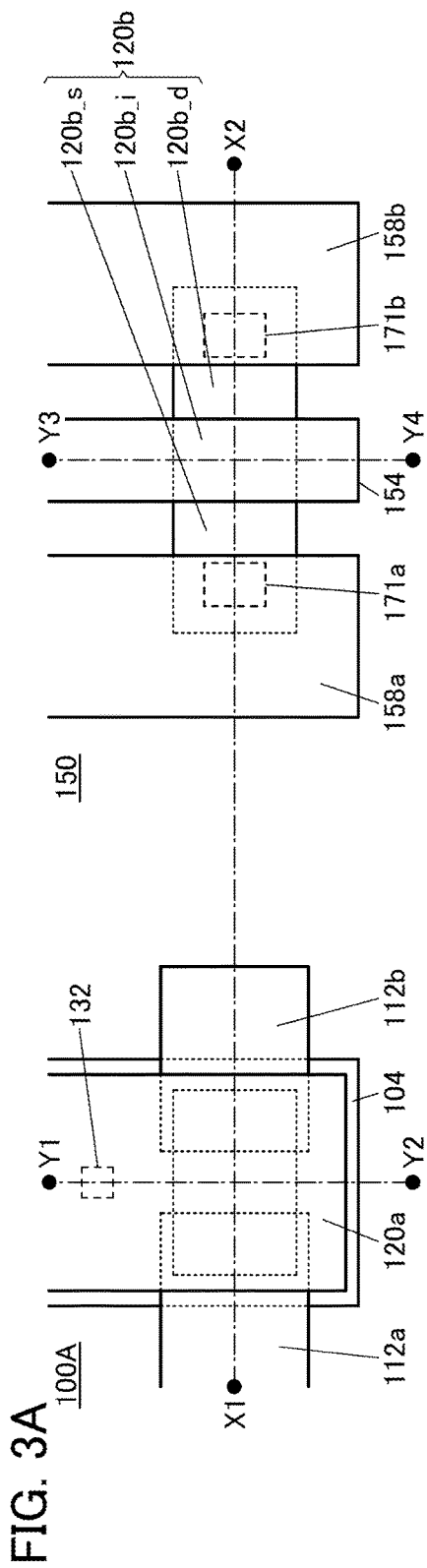
FIGS. 3A and 3B are top views and a cross-sectional view illustrating a semiconductor device.
Figure 3B:
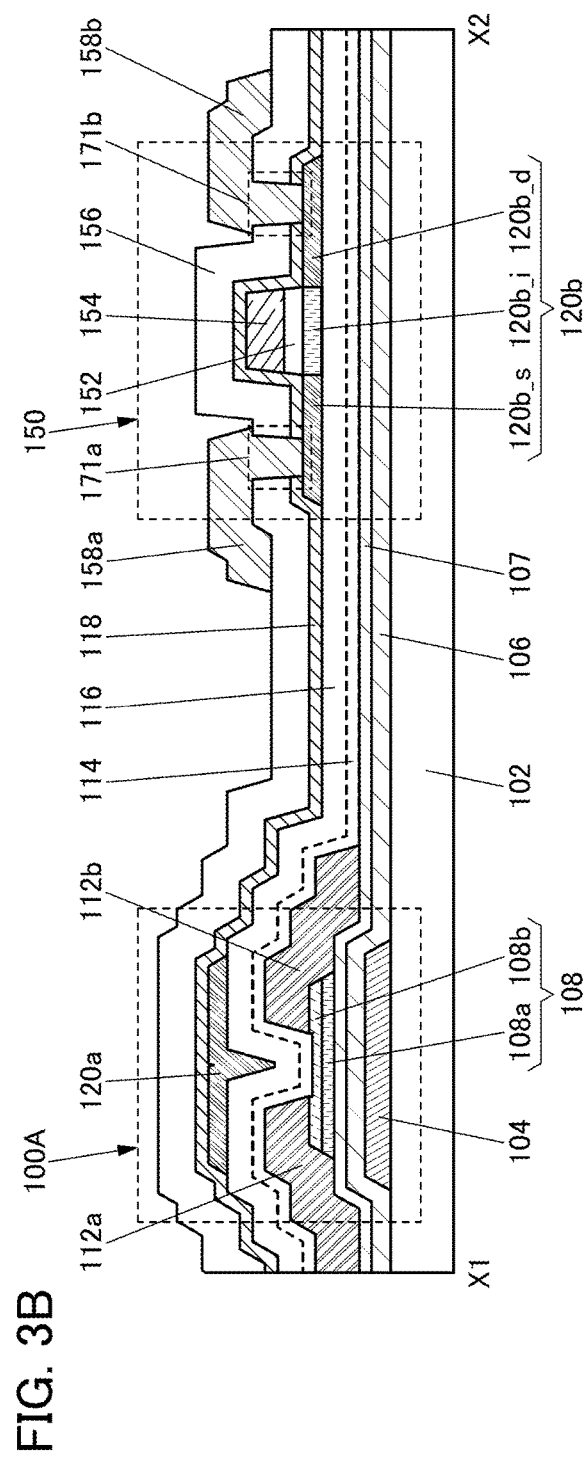
Figure 4:
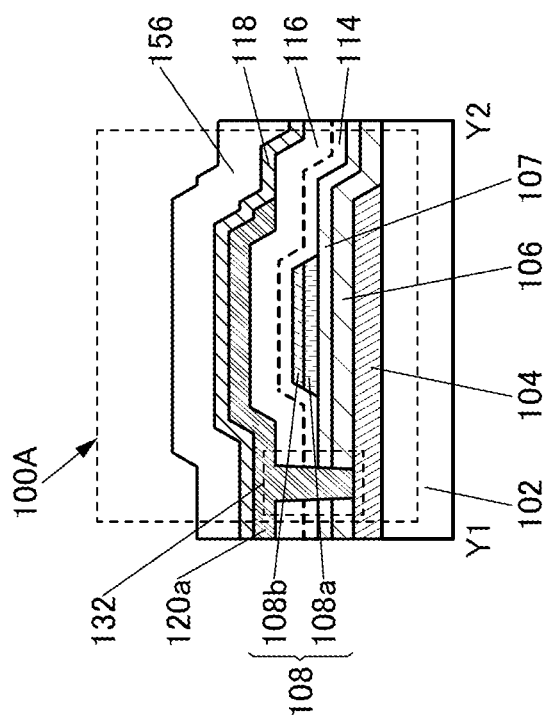
FIG. 4 is a cross-sectional view illustrating the semiconductor device.
Figure 6:
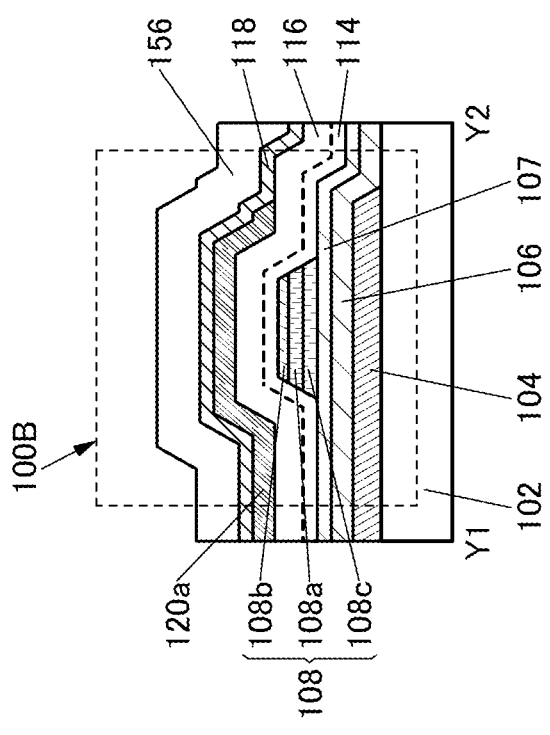
FIG. 6 is a cross-sectional view illustrating the semiconductor device.

FIG. 3A is a top view of a transistor 100A and the transistor 150 that are semiconductor devices of one embodiment of the present invention. FIG. 3B is a cross-sectional view taken along the dashed-dotted line X1-X2 in FIG. 3A. FIG. 4 is a cross-sectional view taken along the dashed-dotted line Y1-Y2 in FIG. 3A. FIG. 5A is a top view of a transistor 100B and the transistor 150 that are semiconductor devices of one embodiment of the present invention. FIG. 5B is a cross-sectional view taken along the dashed-dotted line X1-X2 in FIG. 5A. FIG. 6 is a cross-sectional view taken along the dashed-dotted line Y1-Y2 in FIG. 5A.

Figure 10A:
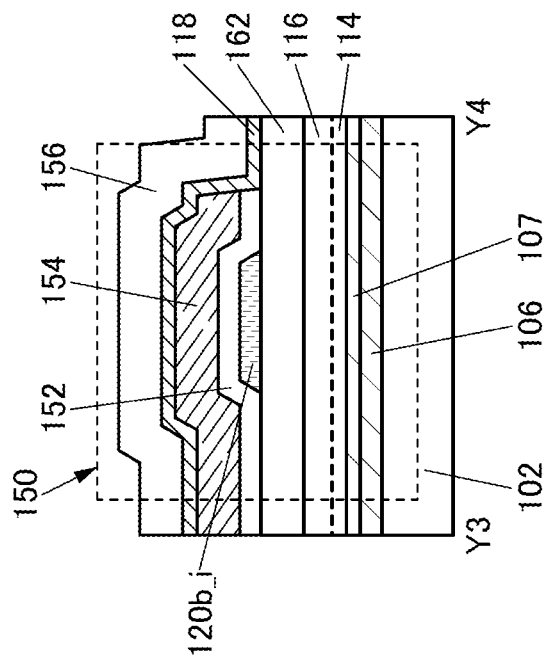
FIGS. 10A and 10B are cross-sectional views illustrating the semiconductor device.
Figure 10B:
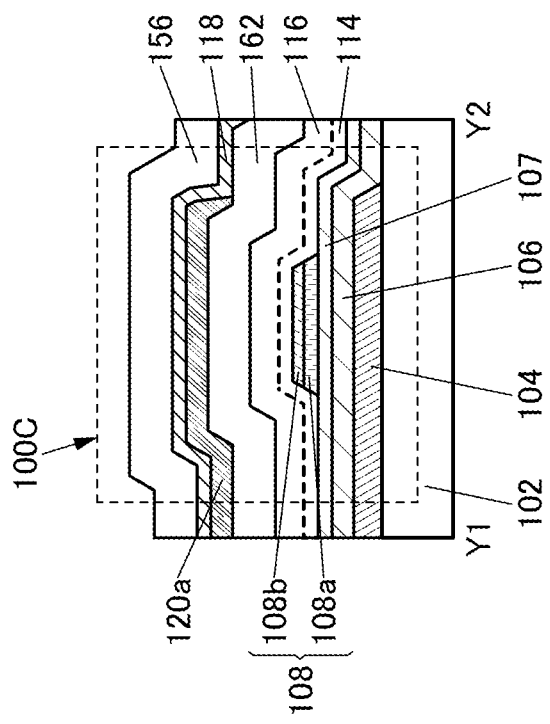

FIG. 9A is a top view of a transistor 100C and the transistor 150 that are semiconductor devices of one embodiment of the present invention. FIG. 9B is a cross-sectional view taken along the dashed-dotted line X1-X2 in FIG. 9A. FIG. 10A is a cross-sectional view taken along the dashed-dotted line Y1-Y2 in FIG. 9A, and FIG. 10B is a cross-sectional view taken along the dashed-dotted line Y3-Y4 in FIG. 9A.

A semiconductor device shown in FIGS. 3A and 3B and FIG. 4 includes the transistor 100A instead of the transistor 100 included in the semiconductor device shown in FIGS. 1A and 1B and FIGS. 2A and 2B. A semiconductor device shown in FIGS. 5A and 5B and FIG. 6 includes the transistor 100B instead of the transistor 100 included in the semiconductor device shown in FIGS. 1A and 1B and FIGS. 2A and 2B. A semiconductor device shown in FIGS. 9A and 9B and FIGS. 10A and 10B includes the transistor 100C instead of the transistor 100 included in the semiconductor device shown in FIGS. 1A and 1B and FIGS. 2A and 2B.

Therefore, in the following description, the description of the transistor 150 is omitted and details of the transistor 100A, the transistor 100B, and the transistor 100C are described.

[Structure Example of First Transistor (Variation 1)]

The transistor 100A differs from the above-described transistor 100 in that an opening 132 is provided. The other portions of the transistor 100A are similar to those in the transistor 100 and have similar effects. The portions different from those in the transistor 100 are described below.

As illustrated in FIG. 3A and FIG. 4, the oxide semiconductor film 120a functioning as the second gate electrode is connected to the conductive film 104 functioning as the first gate electrode in the opening 132 provided in the insulating films 106, 107, 114, and 116. Thus, the conductive film 104 and the oxide semiconductor film 120a are supplied with the same potential.

Note that although the structure in which the opening 132 is provided so that the conductive film 104 and the oxide semiconductor film 120a are connected to each other is described in this embodiment, one embodiment of the present invention is not limited thereto. For example, a structure in which a plurality of openings 132 are provided so that the conductive film 104 and the oxide semiconductor film 120a are connected to each other may be employed. Note that in the case where the conductive film 104 and the oxide semiconductor film 120a are not connected to each other as in the transistor 100 shown in FIGS. 1A and 1B and FIGS. 2A and 2B, it is possible to apply different potentials to the conductive film 104 and the oxide semiconductor film 120a.

As illustrated in FIG. 3B, the oxide semiconductor film 108 is positioned to face each of the conductive film 104 functioning as the first gate electrode and the oxide semiconductor film 120a functioning as the second gate electrode, and is positioned between the two films functioning as the gate electrodes. The lengths in the channel length direction and the channel width direction of the oxide semiconductor film 120*a* functioning as the second gate electrode are longer than those in the channel length direction and the channel width direction of the oxide semiconductor film 108, respectively. The top surface and the side surface of the oxide semiconductor film 108 are covered with the oxide semiconductor film 120*a* with the insulating films 114 and 116 positioned therebetween. Since the oxide semiconductor film 120*a* is connected to the conductive film 104 in the opening 132 provided in the insulating films 106, 107, 114, and 116, a side surface of the oxide semiconductor film 108 that extends in the channel width direction faces the oxide semiconductor film 120*a*.

In other words, the conductive film 104 and the oxide semiconductor film 120*a* are connected to each other in the opening 132 provided in the insulating films 106, 107, 114, and 116 and envelop the oxide semiconductor film 108 with the insulating films 106, 107, 114, and 116 therebetween.

Such a structure makes it possible that the oxide semiconductor film 108 included in the transistor 100A is electrically surrounded by electric fields of the conductive film 104 functioning as the first gate electrode and the oxide semiconductor film 120*a* functioning as the second gate electrode. A device structure of a transistor in which electric fields of a first gate electrode and a second gate electrode electrically surround an oxide semiconductor film where a channel region is formed, like in the transistor 100A, can be referred to as a Surrounded channel (S-channel) structure.

Since the transistor 100A has the S-channel structure, an electric field for inducing a channel can be effectively applied to the oxide semiconductor film 108 by the conductive film 104 functioning as the first gate electrode; therefore, the current drive capability of the transistor 100A can be improved and high on-state current characteristics can be obtained. Since the on-state current can be increased, it is possible to reduce the size of the transistor 100A. In addition, since the transistor 100A is surrounded by the conductive film 104 functioning as the first gate electrode and the oxide semiconductor film 120*a* functioning as the second gate electrode, the mechanical strength of the transistor 100A can be increased.

[Structure Example of First Transistor (Variation 2)]

The transistor 100B differs from the above-described transistor 100 in the structure of the oxide semiconductor film 108. The other portions of the transistor 100B are similar to those in the transistor 100 and have similar effects. The portions different from those in the transistor 100 are described below.

The transistor 100B has the same structure as the transistor 100 except that the oxide semiconductor film 108 has a three-layer structure. Specifically, the oxide semiconductor film 108 included in the transistor 100B includes an oxide semiconductor film 108*c* over the insulating film 107, the oxide semiconductor film 108*a* over the oxide semiconductor film 108*c*, and the oxide semiconductor film 108*b* over the oxide semiconductor film 108*a*.

Here, band structures of the insulating films in contact with the oxide semiconductor films 108*a*, 108*b*, and 108*c* and the insulating films in contact with the oxide semiconductor films 108*a* and 108*b* are described with reference to FIGS. 7A and 7B.

Figure 7A:
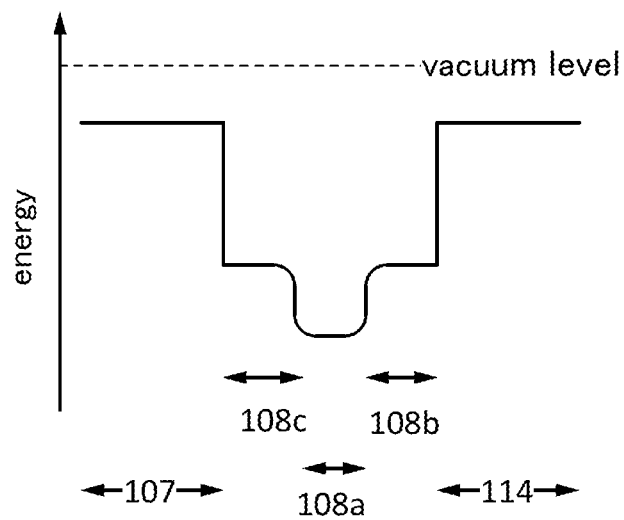
FIGS. 7A and 7B are band diagrams.

FIG. 7A shows an example of a band structure in the thickness direction of a stack including the insulating film 107, the oxide semiconductor films 108*a*, 108*b*, and 108*c*, and the insulating film 114. FIG. 7B shows an example of a band structure in the thickness direction of a stack including the insulating film 107, the oxide semiconductor films 108*a* and 108*b*, and the insulating film 114. For easy understanding, the energy level of the conduction band minimum (Ec) of each of the insulating film 107, the oxide semiconductor films 108*a*, 108*b*, and 108*c*, and the insulating film 114 is shown in the band diagrams.

FIG. 7A is a band diagram of a structure in which a silicon oxide film is used as each of the insulating films 107 and 114, an oxide semiconductor film formed using a metal oxide target having an atomic ratio of metal elements of In:Ga:Zn=1:1:1.2 is used as the oxide semiconductor film 108*c*, an oxide semiconductor film formed using a metal oxide target having an atomic ratio of metal elements of In:Ga:Zn=4:2:4.1 is used as the oxide semiconductor film 108*a*, and an oxide semiconductor film formed using a metal oxide target having an atomic ratio of metal elements of In:Ga:Zn=1:1:1.2 is used as the oxide semiconductor film 108*b*.

Figure 7B:
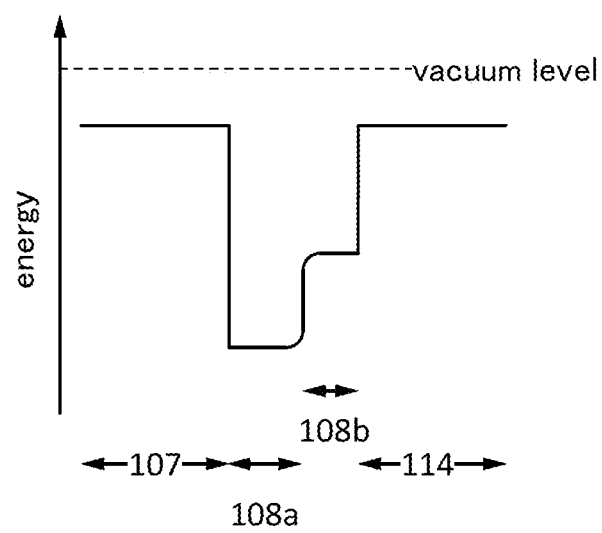

In the band structure of FIG. 7B, a silicon oxide film is used as each of the insulating films 107 and 114, an oxide semiconductor film formed using a metal oxide target having an atomic ratio of metal elements of In:Ga:Zn=4:2:4.1 is used as the oxide semiconductor film 108*a*, and an oxide semiconductor film formed using a metal oxide target having an atomic ratio of metal elements of In:Ga:Zn=1:1:1.2 is used as the oxide semiconductor film 108*b*.

As illustrated in FIG. 7A, the energy level of the conduction band minimum gradually varies between the oxide semiconductor film 108*a* and the oxide semiconductor film 108*b* and between the oxide semiconductor film 108*c* and the oxide semiconductor film 108*a*. As illustrated in FIG. 7B, the energy level of the conduction band minimum gradually varies between the oxide semiconductor film 108*a* and the oxide semiconductor film 108*b*. In other words, the energy level at the bottom of the conduction band is continuously varied or continuously connected. To obtain such a band structure, there exists no impurity, which forms a defect state such as a trap center or a recombination center for the oxide semiconductor, at the interface between the oxide semiconductor film 108*a* and the oxide semiconductor film 108*b* or at the interface between the oxide semiconductor film 108*c* and the oxide semiconductor film 108*a*.

To form a continuous junction between the oxide semiconductor film 108*a* and the oxide semiconductor film 108*b* and between the oxide semiconductor film 108*c* and the oxide semiconductor film 108*a*, it is necessary to form the films successively without exposure to the air by using a multi-chamber deposition apparatus (sputtering apparatus) provided with a load lock chamber.

With the band structure of FIG. 7A or FIG. 7B, the oxide semiconductor film 108*a* serves as a well, and a channel region is formed in the oxide semiconductor film 108*a* in the transistor with the stacked-layer structure.

By providing the oxide semiconductor film 108*b* and/or the oxide semiconductor film 108*c*, the oxide semiconductor film 108*a* is distanced from trap states that could be formed in the vicinity of the interface between the oxide semiconductor film 108*a* and the insulating film (the insulating film 107 or the insulating film 114).

In addition, in some cases, the trap states are more distant from the vacuum level than the energy level of the conduction band minimum (Ec) of the oxide semiconductor film 108*a* functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 108a. Such a structure inhibits accumulation of electrons in the trap states. As a result, the on-state current and the field-effect mobility of the transistor can be increased.

The energy level of the conduction band minimum of each of the oxide semiconductor films 108b and 108c is closer to the vacuum level than that of the oxide semiconductor film 108a. A typical difference between the energy level of the conduction band minimum of the oxide semiconductor film 108a and the energy level of the conduction band minimum of each of the oxide semiconductor films 108b and 108c is 0.15 eV or more or 0.5 eV or more and 2 eV or less or 1 eV or less. That is, the difference between the electron affinity of each of the oxide semiconductor films 108b and 108c and the electron affinity of the oxide semiconductor film 108a is 0.15 eV or more or 0.5 eV or more and 2 eV or less or 1 eV or less.

In such a structure, the oxide semiconductor film 108a serves as a main path of current. That is, the oxide semiconductor film 108a functions as the channel region, and the oxide semiconductor films 108b and 108c function as oxide insulating films. In addition, since the oxide semiconductor films 108b and 108c each include one or more metal elements included in the oxide semiconductor film 108a in which a channel region is formed, interface scattering is less likely to occur at the interface between the oxide semiconductor film 108c and the oxide semiconductor film 108a or at the interface between the oxide semiconductor film 108a and the oxide semiconductor film 108b. Thus, the transistor can have high field-effect mobility because the movement of carriers is not hindered at the interface.

To prevent each of the oxide semiconductor films 108b and 108c from functioning as part of a channel region, a material having sufficiently low conductivity is used for the oxide semiconductor films 108b and 108c. Thus, each of the oxide semiconductor films 108b and 108c can also be referred to as "oxide insulating film" owing to its physical property and/or function. Alternatively, a material which has a smaller electron affinity (a difference in energy level between the vacuum level and the conduction band minimum) than the oxide semiconductor film 108a and has a difference in energy level in the conduction band minimum from the oxide semiconductor film 108a (band offset) is used for the oxide semiconductor films 108b and 108c. Furthermore, to inhibit generation of a difference between threshold voltages due to the value of the drain voltage, it is preferable to form the oxide semiconductor films 108b and 108c using a material whose energy level of the conduction band minimum is closer to the vacuum level than the energy level of the conduction band minimum of the oxide semiconductor film 108a. For example, a difference in energy level between the conduction band minimum of the oxide semiconductor film 108b and the conduction band minimum of the oxide semiconductor films 108a and 108c is 0.2 eV or more, preferably 0.5 eV or more.

It is preferable that the oxide semiconductor films 108b and 108c not have a spinel crystal structure. This is because if the oxide semiconductor films 108b and 108c have a spinel crystal structure, constituent elements of the conductive films 112a and 112b might be diffused to the oxide semiconductor film 108a at the interface between the spinel crystal structure and another region. Note that each of the oxide semiconductor films 108b and 108c is preferably a CAAC-OS, in which case a higher blocking property against constituent elements of the conductive films 112a and 112b, for example, copper elements, is obtained.

The thickness of each of the oxide semiconductor films 108b and 108c is greater than or equal to a thickness that is capable of inhibiting diffusion of the constituent elements of the conductive films 112a and 112b to the oxide semiconductor film 108a, and less than a thickness that inhibits supply of oxygen from the insulating film 114 to the oxide semiconductor film 108a. For example, when the thickness of each of the oxide semiconductor films 108b and 108c is greater than or equal to 10 nm, diffusion of the constituent elements of the conductive films 112a and 112b to the oxide semiconductor film 108a can be inhibited. When the thickness of each of the oxide semiconductor films 108b and 108c is less than or equal to 100 nm, oxygen can be effectively supplied from the insulating film 114 to the oxide semiconductor film 108a.

Although the example where an oxide semiconductor film formed using a metal oxide target having an atomic ratio of metal elements, In:Ga:Zn=1:1:1.2, is used as each of the oxide semiconductor films 108b and 108c is described in this embodiment, one embodiment of the present invention is not limited thereto. For example, an oxide semiconductor film formed using a metal oxide target having an atomic ratio of metal elements, In:Ga:Zn=1:1:1, In:Ga:Zn=1:3:2, In:Ga:Zn=1:3:4, or In:Ga:Zn=1:3:6, may be used as each of the oxide semiconductor films 108b and 108c.

When the oxide semiconductor films 108b and 108c are formed using a metal oxide target having an atomic ratio of In:Ga:Zn=1:1:1, the oxide semiconductor films 108b and 108c have an atomic ratio of In:Ga:Zn=1:$\beta$1 (0<$\beta$1≤2):$\beta$2 (0<$\beta$2≤2) in some cases. When the oxide semiconductor films 108b and 108c are formed using a metal oxide target having an atomic ratio of In:Ga:Zn=1:3:4, the oxide semiconductor films 108b and 108c have an atomic ratio of In:Ga:Zn=1:$\beta$3 (1≤$\beta$3≤5):$\beta$4 (2≤$\beta$4≤6) in some cases. When the oxide semiconductor films 108b and 108c are formed using a metal oxide target having an atomic ratio of In:Ga:Zn=1:3:6, the oxide semiconductor films 108b and 108c have an atomic ratio of In:Ga:Zn=1:$\beta$5 (1≤$\beta$5≤5):$\beta$6 (4≤$\beta$6≤8) in some cases.

Figure 8A:
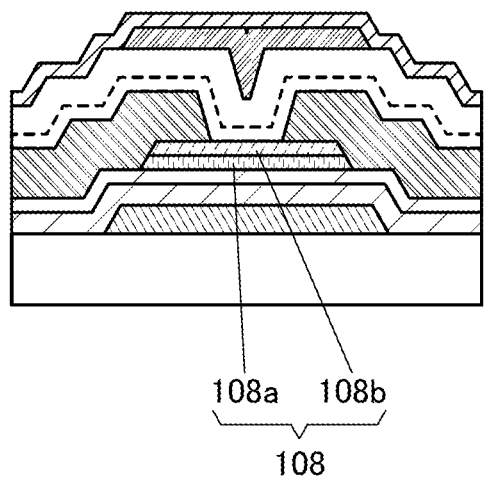
FIGS. 8A and 8B are cross-sectional views illustrating semiconductor devices.
Figure 8B:
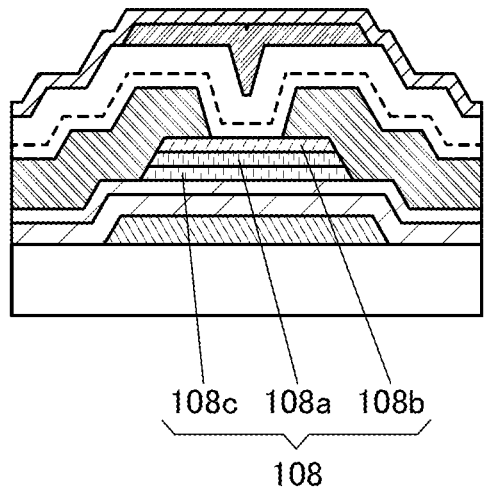

The drawings illustrate an example where the oxide semiconductor film 108b in the transistor 100 and the oxide semiconductor film 108b in the transistor 100B have a small thickness in a region which is not covered with the conductive films 112a and 112b, that is, an example where part of the oxide semiconductor film has a depressed portion. However, one embodiment of the present invention is not limited thereto, and the oxide semiconductor film does not necessarily have a depressed region in a region which is not covered with the conductive films 112a and 112b. Examples in this case are illustrated in FIGS. 8A and 8B. FIGS. 8A and 8B are cross-sectional views illustrating examples of the semiconductor device. FIG. 8A illustrates a structure where the oxide semiconductor film 108b in the above-described transistor 100 does not have a depressed portion, and FIG. 8B illustrates a structure where the oxide semiconductor film 108b in the above-described transistor 100B does not have a depressed portion.

[Structure Example of First Transistor (Variation 3)]

The transistor 100C differs from the above-described transistor 100 in the positions of the insulating films 114 and 116 and the provision of an insulating film 162. The other portions of the transistor 100C are similar to those of the transistor 100 and have similar effects.

The transistor 100C includes the conductive film 104, the insulating films 106 and 107 over the conductive film 104, the oxide semiconductor film 108 over the insulating film 107, the insulating films 114 and 116 over the oxide semiconductor film 108, the conductive films 112a and 112b over the insulating film 116, the insulating film 162 over the insulating film 116 and the conductive films 112a and 112b, the oxide semiconductor film 120a over the insulating film 162, and the insulating film 118 over the insulating film 162 and the oxide semiconductor film 120a.

Note that the conductive film 112a is electrically connected to the oxide semiconductor film 108 through an opening 173a provided in the insulating films 114 and 116. The conductive film 112b is electrically connected to the oxide semiconductor film 108 through an opening 173b provided in the insulating films 114 and 116.

The insulating film 162 can be formed using a material and a method similar to those used for forming the insulating films 114 and 116.

The transistor 100 shown in FIGS. 1A and 1B and FIGS. 2A and 2B is what is called a channel-etched transistor. The transistor 100C shown in FIGS. 9A and 9B and FIGS. 10A and 10B is what is called a channel-protective transistor. In this manner, either the channel-etched structure or the channel-protective structure can be applied to the first transistor.

<1-4. Structure Example 3 of Semiconductor Device>

Next, structures different from the structure shown in FIGS. 1A and 1B and FIGS. 2A and 2B are described with reference to FIGS. 11A and 11B, FIGS. 12A and 12B, and FIGS. 13A and 13B.

Figure 13A:
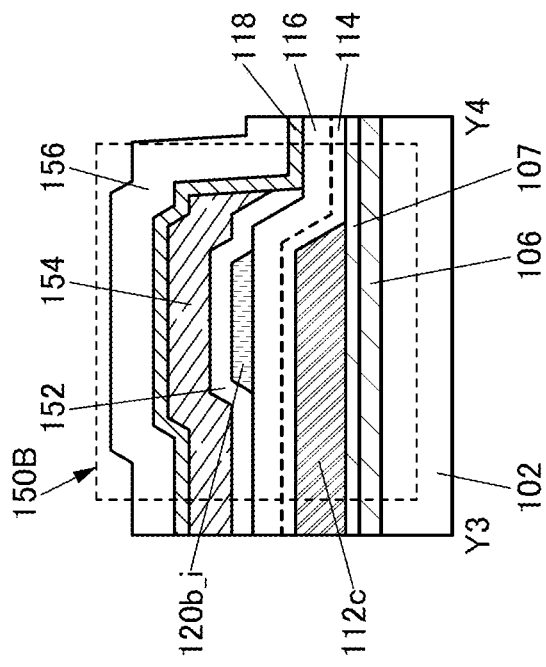
FIGS. 13A and 13B are cross-sectional views illustrating the semiconductor devices.
Figure 13B:
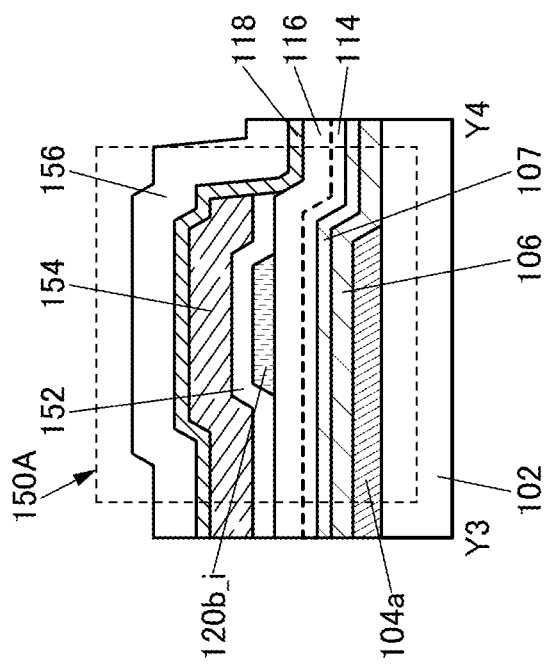

FIG. 11A is a top view of the transistor 100 and a transistor 150A that are semiconductor devices of one embodiment of the present invention. FIG. 11B is a cross-sectional view taken along the dashed-dotted line X1-X2 in FIG. 11A. FIG. 13A is a cross-sectional view taken along the dashed-dotted line Y3-Y4 in FIG. 11A. FIG. 12A is a top view of the transistor 100 and a transistor 150B that are semiconductor devices of one embodiment of the present invention. FIG. 12B is a cross-sectional view taken along the dashed-dotted line X1-X2 in FIG. 12A. FIG. 13B is a cross-sectional view taken along the dashed-dotted line Y3-Y4 in FIG. 12A.

A semiconductor device shown in FIGS. 11A and 11B and FIG. 13A includes the transistor 150A instead of the transistor 150 included in the semiconductor device shown in FIGS. 1A and 1B and FIGS. 2A and 2B. A semiconductor device shown in FIGS. 12A and 12B and FIG. 13B includes the transistor 150B instead of the transistor 150 included in the semiconductor device shown in FIGS. 1A and 1B and FIGS. 2A and 2B.

Therefore, in the following description, the description of the transistor 100 is omitted and details of the transistor 150A and the transistor 150B are described.

[Structure Example of Second Transistor (Variation 1)]

The transistor 150A shown in FIGS. 11A and 11B and FIG. 13A includes a conductive film 104a over the substrate 102; the insulating films 106 and 107 over the substrate 102 and the conductive film 104a; the insulating films 114 and 116 over the insulating films 106 and 107; the oxide semiconductor film 120b including the channel region 120b_i, the source region 120b_s, and the drain region 120b_d over the insulating film 116; the insulating film 152 over the channel region 120b_i; the conductive film 154 functioning as a gate electrode, over the insulating film 152; and the insulating film 118 over the source region 120b_s and the drain region 120b_d. The insulating film 156 is formed over the insulating film 118. The opening 171a that reaches the source region 120b_s and the opening 171b that reaches the drain region 120b_d are formed in the insulating films 118 and 156. The conductive films 158a and 158b are formed over the insulating film 156 to cover the inner walls of the openings 171a and 171b.

The conductive film 104a functions as a back gate electrode of the transistor 150A. An opening may be provided in the insulating films 106, 107, 114, 116, and 152 to electrically connect the conductive film 104a to the conductive film 154 through the opening.

As described above, the transistor 150A has a structure in which the conductive film 104a functioning as the back gate electrode is provided in the aforementioned transistor 150. The conductive film 104a is formed by processing the same conductive film as that used for forming the conductive film 104. Therefore, the conductive film 104a can be formed without increasing in the number of manufacturing steps.

[Structure Example of Second Transistor (Variation 2)]

The transistor 150B shown in FIGS. 12A and 12B and FIG. 13B includes the insulating films 106 and 107 over the substrate 102, a conductive film 112c over the insulating film 107, the insulating films 114 and 116 over the insulating film 107 and the conductive film 112c, the oxide semiconductor film 120b including the channel region 120b_i, the source region 120b_s, and the drain region 120b_d over the insulating film 116, the insulating film 152 over the channel region 120b_i, the conductive film 154 functioning as a gate electrode, over the insulating film 152, and the insulating film 118 over the source region 120b_s and the drain region 120b_d. The insulating film 156 is formed over the insulating film 118. The opening 171a that reaches the source region 120b_s and the opening 171b that reaches the drain region 120b_d are formed in the insulating films 118 and 156. The conductive films 158a and 158b are formed over the insulating film 156 to cover the inner walls of the openings 171a and 171b.

The conductive film 112c functions as a back gate electrode of the transistor 150B. An opening may be provided in the insulating films 114, 116, and 152 to electrically connect the conductive film 112c to the conductive film 154 through the opening.

As described above, the transistor 150B has a structure in which the conductive film 112c functioning as the back gate electrode is provided in the aforementioned transistor 150. The conductive film 112c is formed by processing the same conductive film as that used for forming the conductive films 112a and 112b. Therefore, the conductive film 112c can be formed without increasing in the number of manufacturing steps.

Note that the structures of the transistors of this embodiment can be freely combined with each other.

<1-5. Manufacturing Method of Semiconductor Device>

Next, a method for manufacturing the transistor 100 and the transistor 150 that are semiconductor devices of one embodiment of the present invention is described with reference to FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, FIGS. 21A and 21B, and FIG. 22. Note that FIGS. 14A and 14B through FIG. 22 are cross-sectional views in the channel length direction that show the method for manufacturing the semiconductor devices.

First, a conductive film is formed over the substrate 102 and processed through a lithography process and an etching process, whereby the conductive film 104 functioning as the first gate electrode is formed. Then, the insulating films 106 and 107 functioning as the first gate insulating film are formed over the conductive film 104 (see FIG. 14A).

In this embodiment, a glass substrate is used as the substrate 102, and as the conductive film 104 functioning as the first gate electrode, a 100-nm-thick tungsten film is formed by a sputtering method. As the insulating film 106, a 400-nm-thick silicon nitride film is formed by a PECVD method. As the insulating film 107, a 50-nm-thick silicon oxynitride film is formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, for example, in the case where a conductive film including copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 (specifically, the oxide semiconductor film 108b) formed later.

Figure 14A:
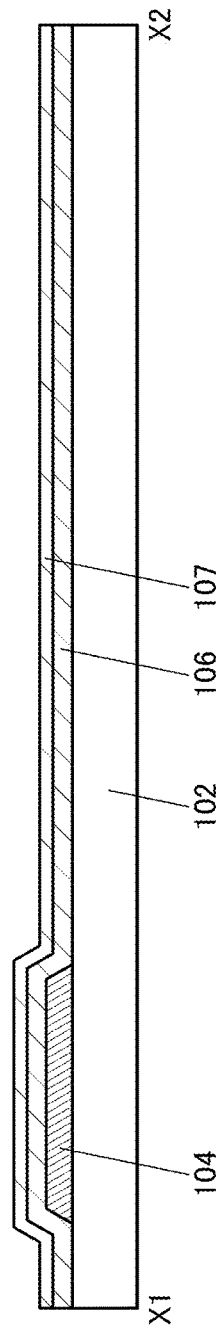
FIGS. 14A and 14B are cross-sectional views illustrating a method for manufacturing a semiconductor device.
Figure 14B:
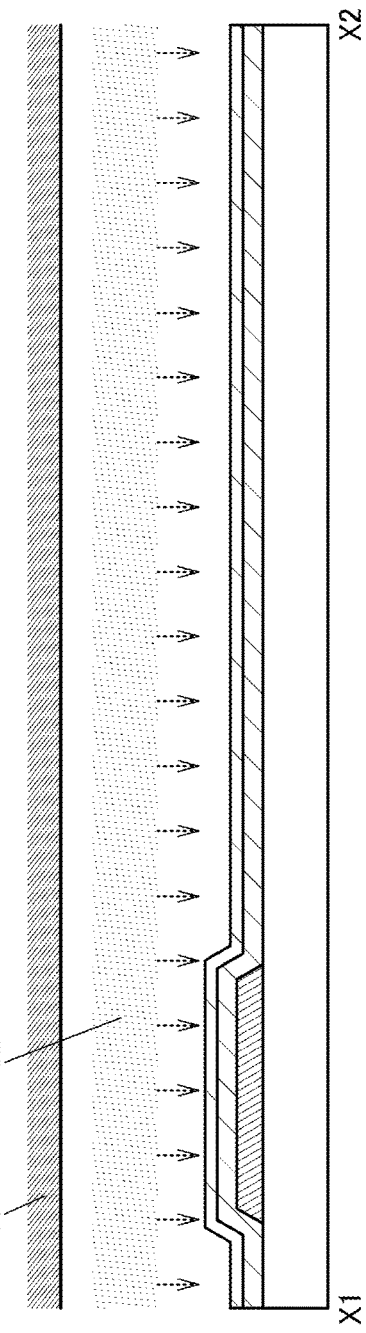

Next, an oxide semiconductor film 108a_0 and an oxide semiconductor film 108b_0 are formed over the insulating film 107 (see FIG. 14B and FIG. 15A).

FIG. 14B is a schematic cross-sectional view showing an inner portion of a deposition apparatus when the oxide semiconductor film 108a_0 is formed over the insulating film 107. In FIG. 14B, a sputtering apparatus is used as the deposition apparatus, and a target 191 placed inside the sputtering apparatus and plasma 192 formed under the target 191 are schematically shown.

When the oxide semiconductor film 108a_0 is formed, plasma discharge is performed in an atmosphere containing a first oxygen gas. At this time, oxygen is added to the insulating film 107 over which the oxide semiconductor film 108a_0 is to be formed. When the oxide semiconductor film 108a_0 is formed, an inert gas (e.g., a helium gas, an argon gas, or a xenon gas) and the first oxygen gas may be mixed.

The first oxygen gas is mixed at least when the oxide semiconductor film 108a_0 is formed. The proportion of the first oxygen gas in a deposition gas for forming the oxide semiconductor film 108a_0 is higher than 0% and lower than or equal to 100%, preferably higher than or equal to 10% and lower than or equal to 100%, more preferably higher than or equal to 30% and lower than or equal to 100%.

In FIG. 14B, oxygen or excess oxygen to be added to the insulating film 107 is schematically shown by arrows of broken lines.

The oxide semiconductor films 108a_0 and 108b_0 may be formed at the same substrate temperature or different substrate temperatures. Note that the oxide semiconductor films 108a_0 and 108b_0 are preferably formed at the same substrate temperature, in which case the manufacturing cost can reduced.

The oxide semiconductor films 108a_0 and 108b_0 are formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C., for example. The oxide semiconductor films 108a_0 and 108b_0 are formed while being heated, so that the crystallinity of the oxide semiconductor films 108a_0 and 108b_0 can be increased. On the other hand, in the case where a large-sized glass substrate (e.g., the 6th generation to the 10th generation) is used as the substrate 102 and the oxide semiconductor films 108a0 and 108b_0 are formed at a substrate temperature higher than or equal to 150° C. and lower than 340° C., the substrate 102 might be changed in shape (distorted or warped). In the case where a large-sized glass substrate is used, the oxide semiconductor films 108a_0 and 108b_0 can be formed at a substrate temperature higher than or equal to 100° C. and lower than 150° C., so that the change in the shape of the glass substrate can be suppressed.

In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

When the oxide semiconductor film is formed by a sputtering method, each chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide semiconductor film are removed as much as possible. Alternatively, a turbo molecular pump and a cold trap are preferably combined so as to prevent a backflow of a gas, especially a gas containing carbon or hydrogen from an exhaust system to the inside of the chamber.

After the oxide semiconductor film 108a_0 is formed, the oxide semiconductor film 108b_0 is successively formed over the oxide semiconductor film 108a_0. Note that when the oxide semiconductor film 108b_0 is formed, plasma discharge is performed in an atmosphere containing a second oxygen gas.

Note that the proportion of the first oxygen gas for forming the oxide semiconductor film 108a_0 may be the same as or different from the proportion of the second oxygen gas for forming the oxide semiconductor film 108b_0. For example, the proportion of the second oxygen gas in a deposition gas for forming the oxide semiconductor film 108b_0 is higher than 0% and lower than or equal to 100%, preferably higher than or equal to 10% and lower than or equal to 100%, more preferably higher than or equal to 30% and lower than or equal to 100%.

Note that in the case where the second oxygen gas and an argon gas are used when the oxide semiconductor film 108b_0 is formed, the flow rate of the argon gas is preferably higher than the flow rate of the second oxygen gas. When the flow rate of the argon gas is set higher, a dense film can be formed as the oxide semiconductor film 108b_0. Alternatively, the substrate temperature when the oxide semiconductor film 108b_0 is formed is set high, typically 250° C. or lower, preferably higher than or equal to 150° C. and lower than or equal to 190° C. to form a dense film as the oxide semiconductor film 108b_0. The dense film formed as the oxide semiconductor film 108b_0 can suppress entry of a metal element contained in the conductive films 112a and 112b into the oxide semiconductor film 108a_0.

In this embodiment, the oxide semiconductor film 108a_0 is formed by a sputtering method using an In—Ga—Zn metal oxide target (In:Ga:Zn=4:2:4.1 [atomic ratio]) and then the oxide semiconductor film 108b_0 is successively formed in a vacuum by a sputtering method using an In—Ga—Zn metal oxide target (In:Ga:Zn=1:1:1.2 [atomic ratio]). The substrate temperature when the oxide semiconductor film 108a_0 is formed is set to 170° C., and the substrate temperature when the oxide semiconductor film 108b_0 is formed is set to 170° C. As the deposition gas for forming the oxide semiconductor film 108a_0, an oxygen gas at a flow rate of 60 sccm and an argon gas at a flow rate of 140 sccm are used. As the deposition gas for forming the oxide semiconductor film 108b_0, an oxygen gas at a flow rate of 100 sccm and an argon gas at a flow rate of 100 sccm are used.

Next, the oxide semiconductor film 108a_0 and the oxide semiconductor film 108b_0 are processed into desired shapes, so that the island-shaped oxide semiconductor films 108a and 108b are formed (see FIG. 15B).

Figure 16A:
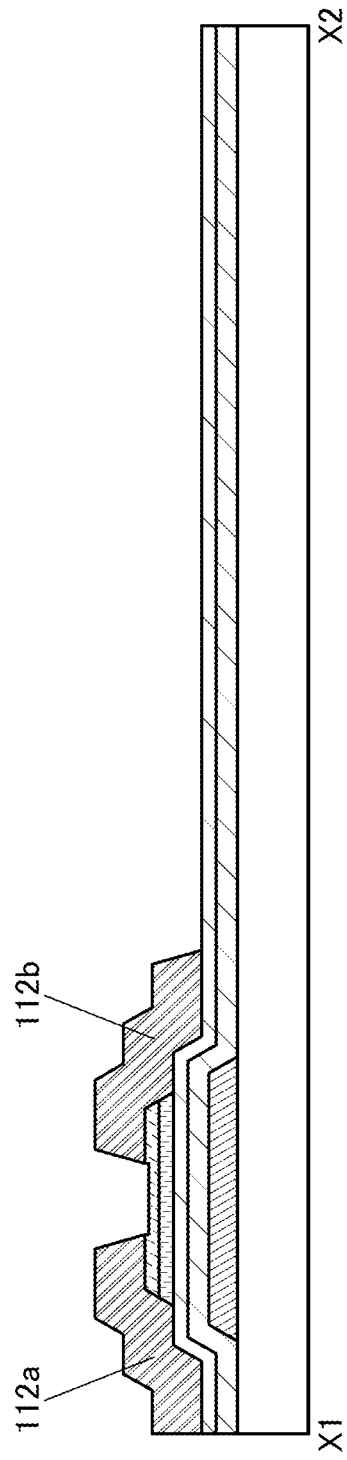
FIGS. 16A and 16B are cross-sectional views illustrating the method for manufacturing a semiconductor device.

Next, a conductive film is formed over the insulating film 107 and the oxide semiconductor film 108 and processed into desired shapes, so that the conductive films 112a and 112b are formed (see FIG. 16A).

In this embodiment, as each of the conductive films 112a and 112b, a stacked film in which a 50-nm-thick tungsten film and a 400-nm-thick aluminum film are sequentially stacked is formed by a sputtering method. Although the conductive films 112a and 112b each have a two-layer structure in this embodiment, one embodiment of the present invention is not limited thereto. For example, the conductive films 112a and 112b may each have a three-layer structure in which a 50-nm-thick tungsten film, a 400-nm-thick aluminum film, and a 100-nm-thick titanium film are sequentially stacked.

After the conductive films 112a and 112b are formed, a surface (on the back channel side) of the oxide semiconductor film 108 (specifically, the oxide semiconductor film 108b) may be cleaned. The cleaning may be performed, for example, using an etchant such as a phosphoric acid solution. The cleaning can remove impurities (e.g., an element included in the conductive films 112a and 112b) attached to the surface of the oxide semiconductor film 108b. Note that the cleaning is not necessarily performed, and thus the cleaning may be unnecessary.

In the step of forming the conductive films 112a and 112b and/or the cleaning step, the thickness of a region of the oxide semiconductor film 108 which is not covered by the conductive films 112a and 112b might be reduced.

Figure 16B:
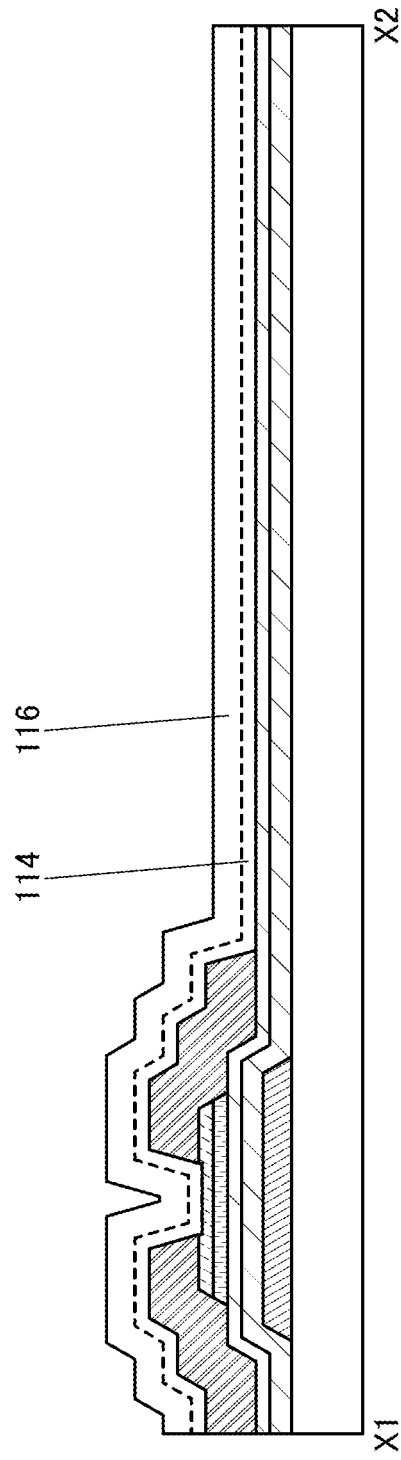

Next, the insulating films 114 and 116 are formed over the insulating film 107, the oxide semiconductor film 108, and the conductive films 112a and 112b (see FIG. 16B).

Note that after the insulating film 114 is formed, the insulating film 116 is preferably formed in succession without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancies in the oxide semiconductor film 108 can be reduced.

As the insulating film 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small amount of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ $W/cm^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 $W/cm^2$ and less than or equal to 0.5 $W/cm^2$, preferably greater than or equal to 0.25 $W/cm^2$ and less than or equal to 0.35 $W/cm^2$ is supplied to an electrode provided in the treatment chamber As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. As a typical example, it is possible to form an oxide insulating film in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor 100 can be improved.

Heat treatment (hereinafter referred to as first heat treatment) is preferably performed after the insulating films 114 and 116 are formed. The first heat treatment can reduce nitrogen oxide contained in the insulating films 114 and 116. By the first heat treatment, part of oxygen contained in the insulating films 114 and 116 can be moved to the oxide semiconductor film 108, so that the amount of oxygen vacancies included in the oxide semiconductor film 108 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, and the like). Note that an electric furnace, rapid thermal anneal (RTA), or the like can be used for the heat treatment, in which it is preferable that hydrogen, water, and the like not be contained in the nitrogen, oxygen, ultra-dry air, or a rare gas.

Figure 17A:
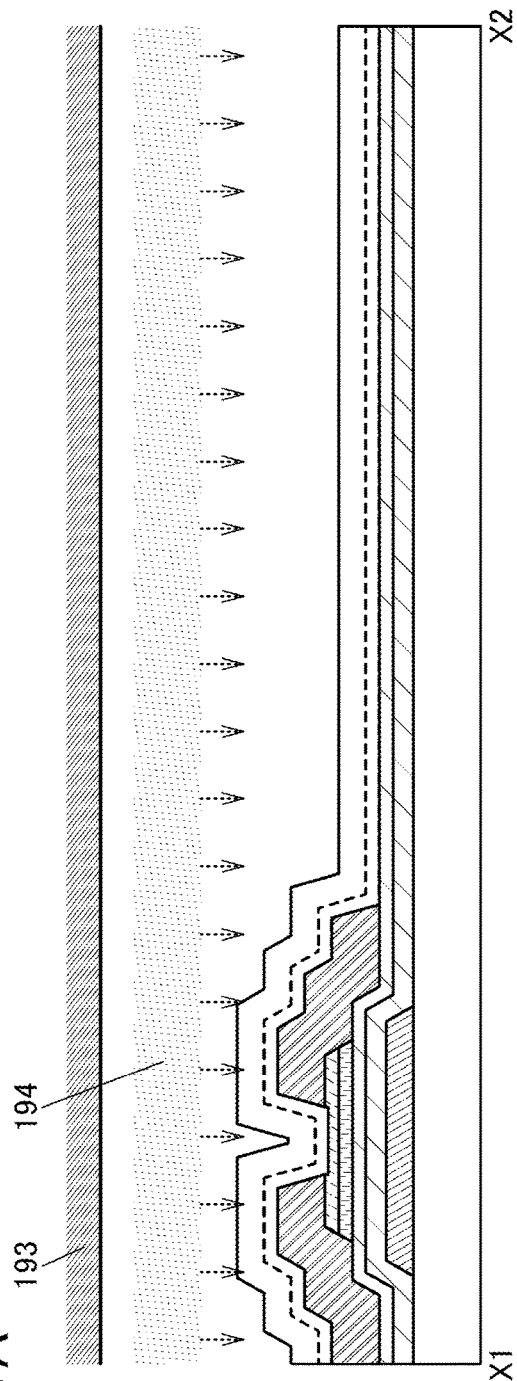
FIGS. 17A and 17B are cross-sectional views illustrating the method for manufacturing a semiconductor device.
Figure 17B:
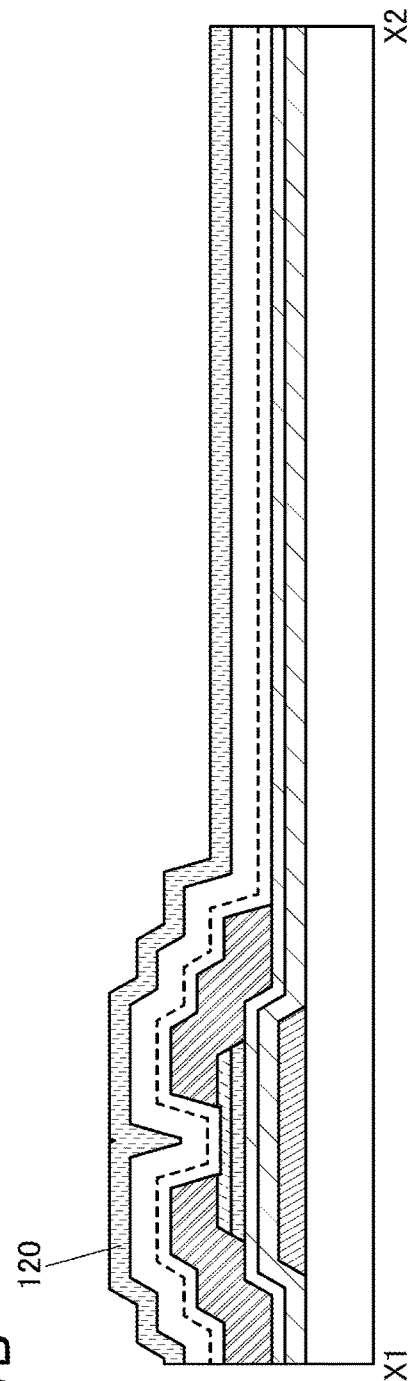

Next, the oxide semiconductor film 120 is formed over the insulating film 116 (see FIGS. 17A and 17B).

Note that FIG. 17A is a schematic cross-sectional view showing an inner portion of the deposition apparatus when the oxide semiconductor film 120 is formed over the insulating film 116. In FIG. 17A, a sputtering apparatus is used as the deposition apparatus, and a target 193 placed inside the sputtering apparatus and plasma 194 formed under the target 193 are schematically shown.

When the oxide semiconductor film 120 is formed, plasma discharge is performed in an atmosphere containing a third oxygen gas. At this time, oxygen is added to the insulating film 116 over which the oxide semiconductor film 120 is to be formed. When the oxide semiconductor film 120 is formed, an inert gas (e.g., a helium gas, an argon gas, or a xenon gas) and the third oxygen gas may be mixed. For example, it is preferable to use the argon gas and the third oxygen gas with the flow rate higher than the flow rate of the argon gas. When the flow rate of the third oxygen gas is set higher, oxygen can be favorably added to the insulating film 116. As an example of the formation conditions of the oxide semiconductor film 120, the proportion of the third oxygen gas in a whole deposition gas is higher than or equal to 50% and lower than or equal to 100%, preferably higher than or equal to 80% and lower than or equal to 100%.

In FIG. 17A, oxygen or excess oxygen to be added to the insulating film 116 is schematically shown by arrows of broken lines.

The oxide semiconductor film 120 is formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film 120 is formed while being heated, so that the crystallinity of the oxide semiconductor film 120 can be increased. On the other hand, in the case where a large-sized glass substrate (e.g., the 6th generation to the 10th generation) is used as the substrate 102 and the oxide semiconductor film 120 is formed at a substrate temperature higher than or equal to 150° C. and lower than 340° C., the substrate 102 might be changed in shape (distorted or warped). In the case where a large-sized glass substrate is used, the oxide semiconductor film 120 can be formed at a substrate temperature higher than or equal to 100° C. and lower than 150° C., so that the change in the shape of the glass substrate can be suppressed.

In this embodiment, the oxide semiconductor film 120 is formed by a sputtering method using an In—Ga—Zn metal oxide target (In:Ga:Zn=4:2:4.1 [atomic ratio]). The substrate temperature when the oxide semiconductor film 120 is formed is set to 170° C. As the deposition gas for forming the oxide semiconductor film 120, an oxygen gas at a flow rate of 100 sccm is used.

As the oxide semiconductor film 120, the above-described oxide semiconductor film (with an atomic ratio of In:Ga:Zn=1:1:1, In:Ga:Zn=1:3:2, In:Ga:Zn=1:3:4, In:Ga:Zn=1:3:6, In:Ga:Zn=3:1:2, or In:Ga:Zn=4:2:3, for example) may be used.

Figure 18A:
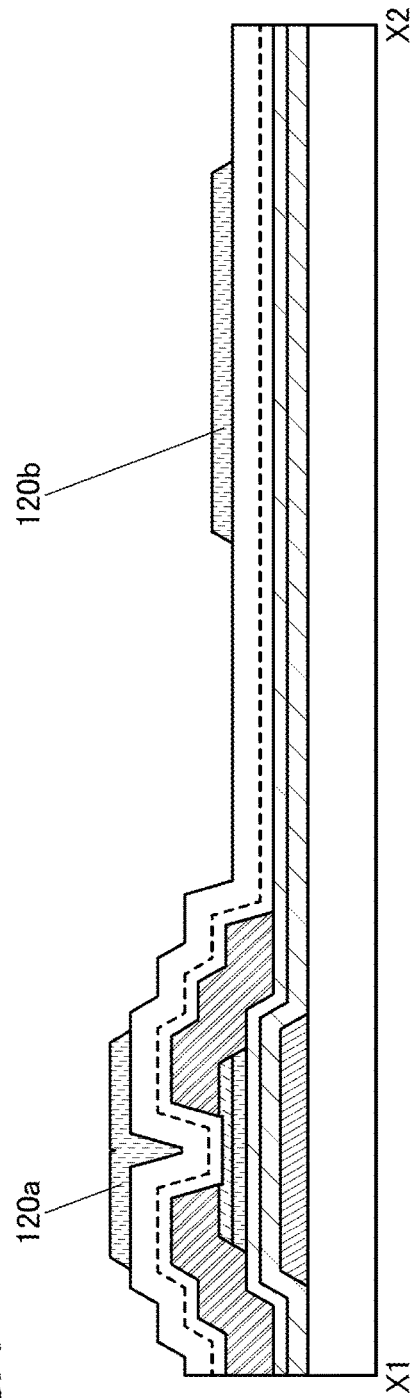
FIGS. 18A and 18B are cross-sectional views illustrating the method for manufacturing a semiconductor device.

Next, the oxide semiconductor film 120 is processed into desired shapes, so that the island-shaped oxide semiconductor films 120a and 120b are formed (see FIG. 18A).

Figure 18B:
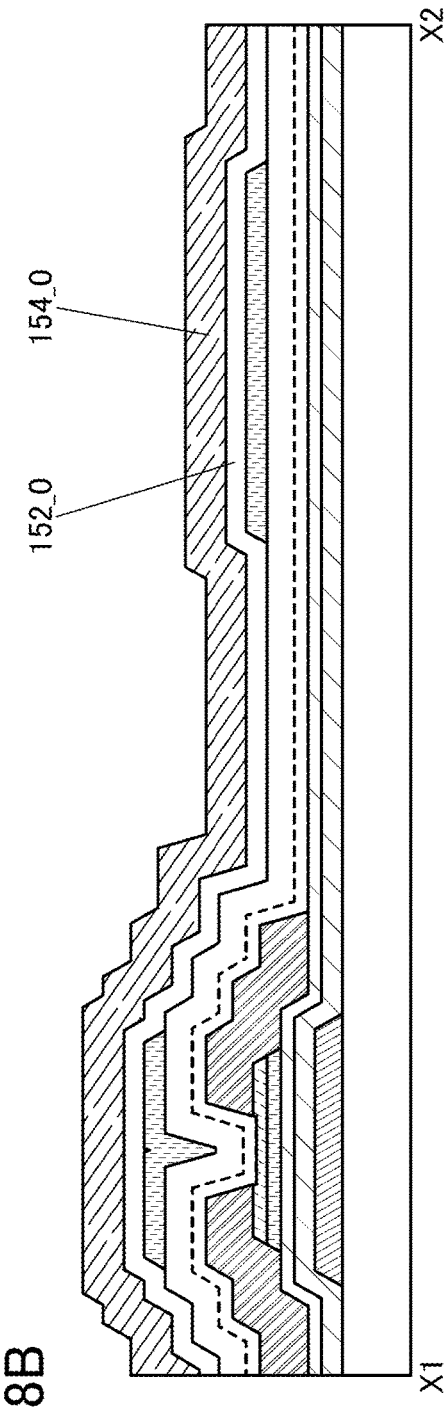

Next, an insulating film 152_0 and a conductive film 154_0 are formed over the insulating film 116 and the oxide semiconductor films 120a and 120b (see FIG. 18B).

As the insulating film 152_0, an insulating film similar to the insulating film 106, the insulating film 107, the insulating film 114, or the insulating film 116 can be formed. In this embodiment, a 100-nm-thick silicon oxynitride film is formed using a PECVD apparatus as the insulating film 152_0.

As the conductive film 154_0, a conductive film similar to the conductive film 104, the conductive film 112a, or the conductive film 112b can be formed. In this embodiment, a 30-nm-thick tantalum nitride film and a 150-nm-thick tungsten film are formed using a sputtering apparatus as the conductive film 154_0.

Figure 19A:
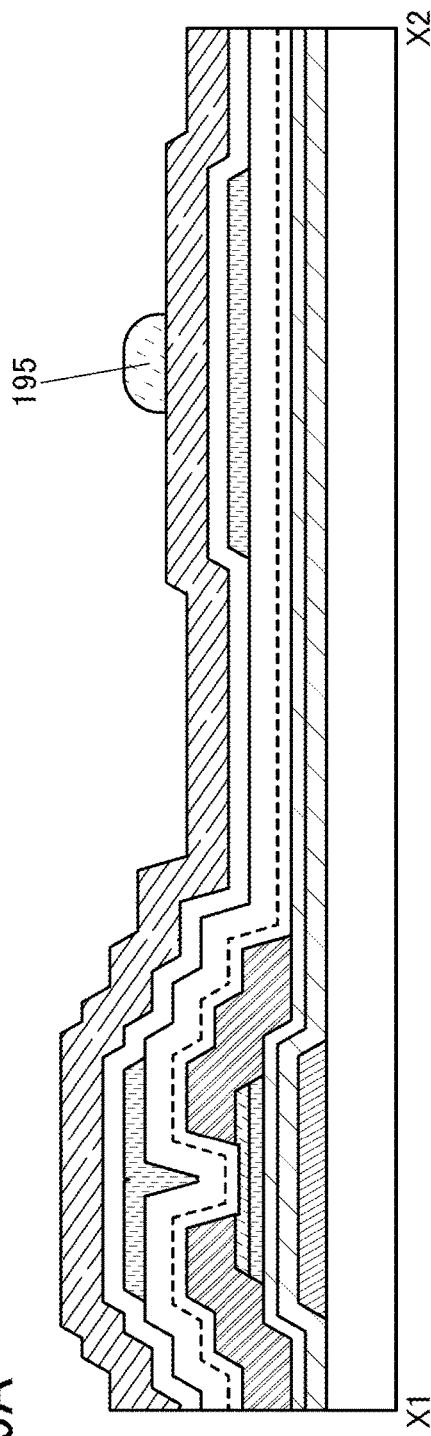
FIGS. 19A and 19B are cross-sectional views illustrating the method for manufacturing a semiconductor device.

Then, a mask 195 is formed in a desired region over the conductive film 154_0 (see FIG. 19A).

As the mask 195, a film of an organic resin such as a resist can be formed using a spin coater apparatus or the like.

Figure 19B:
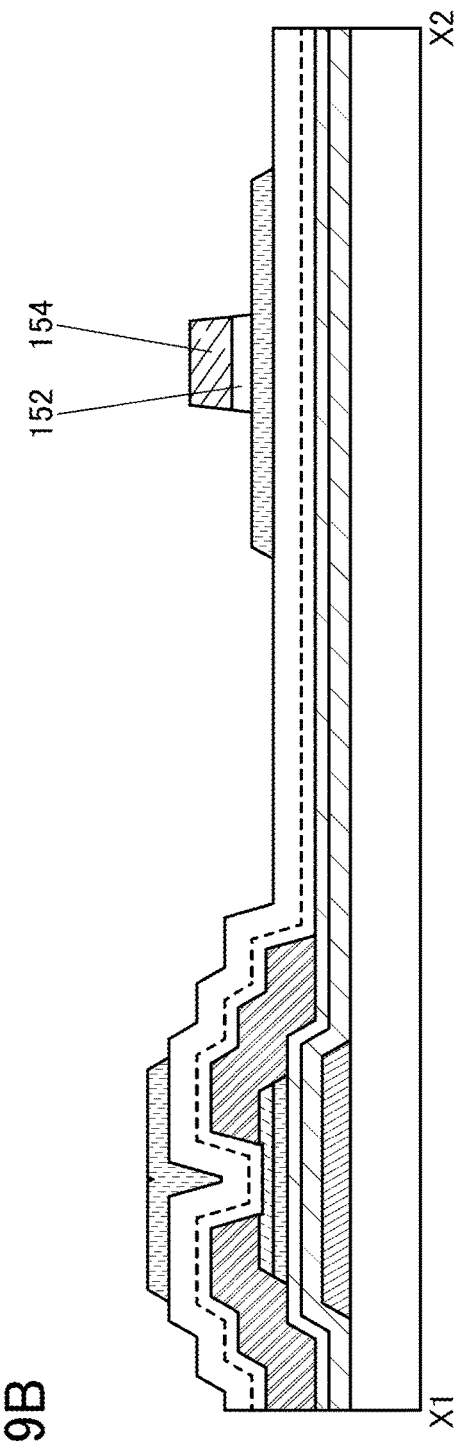

Then, the conductive film 154_0 and the insulating film 152_0 are processed using the mask 195, so that the insulating film 152 overlapping the oxide semiconductor film 120b and the conductive film 154 over the insulating film 152 are formed (see FIG. 19B).

Note that a method for processing the conductive film 154_0 and the insulating film 152_0 is not limited to a particular method, and a wet etching method, a dry etching method, or the like can be used.

Then, the insulating film 118 is formed over the insulating film 116, the oxide semiconductor film 120a, the oxide semiconductor film 120b, and the conductive film 154. Note that by the formation of the insulating film 118, the carrier density of the oxide semiconductor film 120a in contact with the insulating film 118 is increased. Thus, the transistor 100 is formed. Moreover, by the formation of the insulating film 118, regions of the oxide semiconductor film 120b in contact with the insulating film 118 become the source region 120b_s and the drain region 120b_d. Thus, the transistor 150 is formed (see FIG. 20A).

The insulating film 118 includes one or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

In this embodiment, as the insulating film 118, a 100-nm-thick silicon nitride oxide film is formed using a PECVD apparatus.

In the case where a silicon nitride film is formed by a PECVD method as the insulating film 118, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, the flow rate ratio of nitrogen to ammonia in the source gas is set to be greater than or equal to 5:1 and less than or equal to 50:1, preferably greater than or equal to 10:1 and less than or equal to 50:1.

Note that after the insulating film 118 is formed, heat treatment (hereinafter referred to as second heat treatment) similar to the first heat treatment may be performed. Through such heat treatment at lower than 400° C., preferably lower than 375° C., further preferably higher than or equal to 180° C. and lower than or equal to 350° C. after the addition of oxygen to the insulating film 116 when the oxide semiconductor film 120 is formed, oxygen or excess oxygen in the insulating film 116 can be moved to the oxide semiconductor film 108 (particularly, the oxide semiconductor film 108b) and fill oxygen vacancies in the oxide semiconductor film 108.

Then, the insulating film 156 is formed over the insulating film 118 (see FIG. 20B).

The insulating film 156 can be formed using a material that can be used for forming the insulating film 114 or the insulating film 116. In this embodiment, as the insulating film 156, a 400-nm-thick silicon oxynitride film is formed using a PECVD apparatus.

Figure 21A:
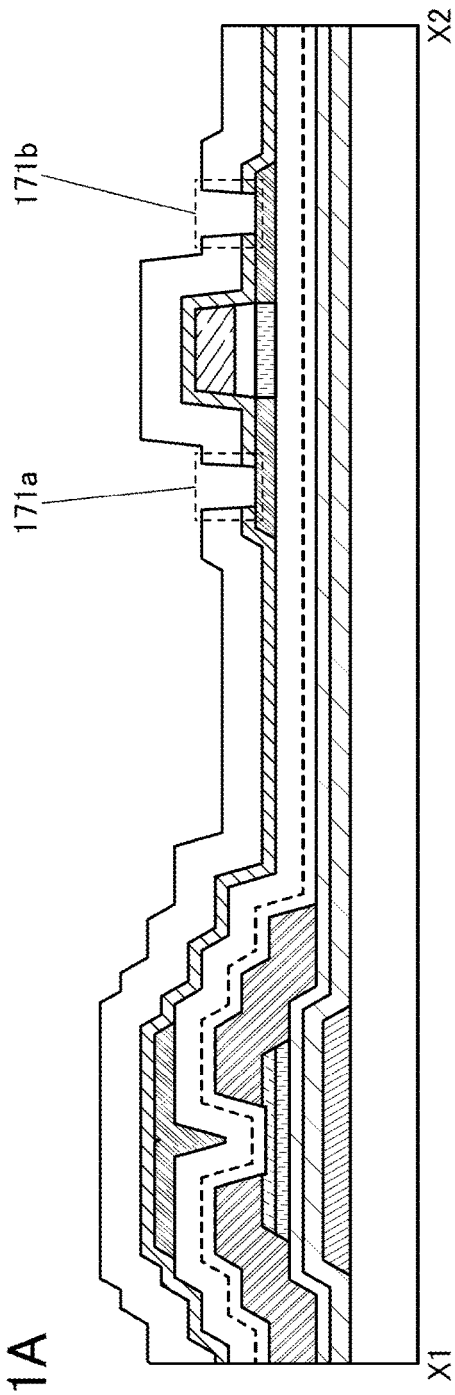
FIGS. 21A and 21B are cross-sectional views illustrating the method for manufacturing a semiconductor device.

Then, the opening 171a that reaches the source region 120b_s of the oxide semiconductor film 120b and the opening 171b that reaches the drain region 120b_d of the oxide semiconductor film 120b are formed in the insulating films 118 and 156 (see FIG. 21A).

A method for forming the openings 171a and 171b is not limited to a particular method, and a wet etching method, a dry etching method, or the like can be used.

Figure 21B:
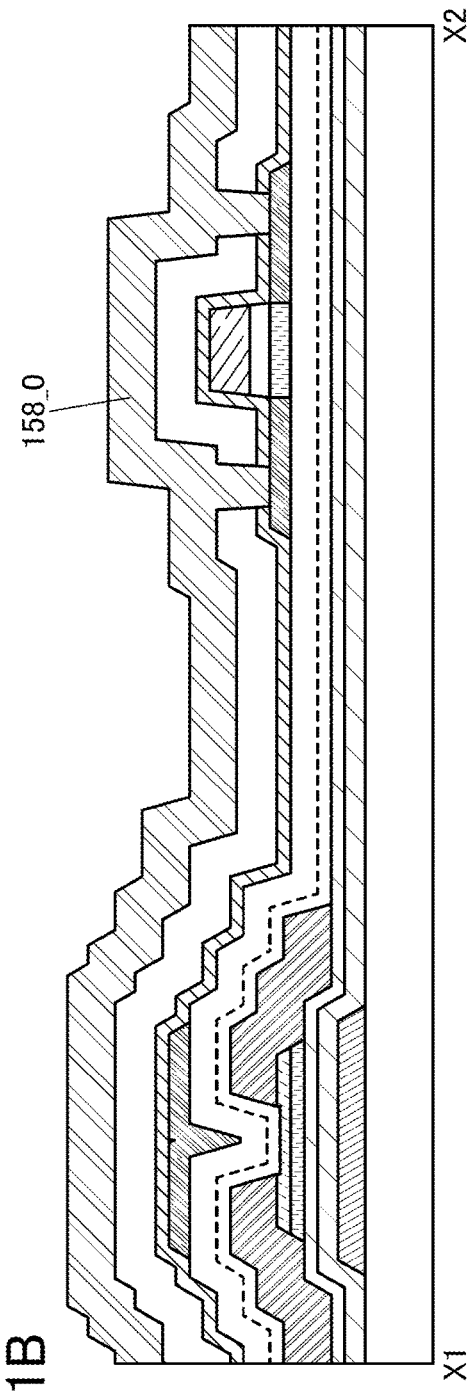

Then, a conductive film 158_0 is formed over the insulating film 156 to cover the inner walls of the openings 171a and 171b (see FIG. 21B).

The conductive film 158_0 can be formed using a material that can be used for forming the conductive film 104, the conductive film 112a, or the conductive film 112b. In this embodiment, as the conductive film 158_0, a 50-nm-thick titanium film, a 400-nm-thick aluminum film, and a 100-nm-thick titanium film are formed using a sputtering apparatus.

Figure 22:
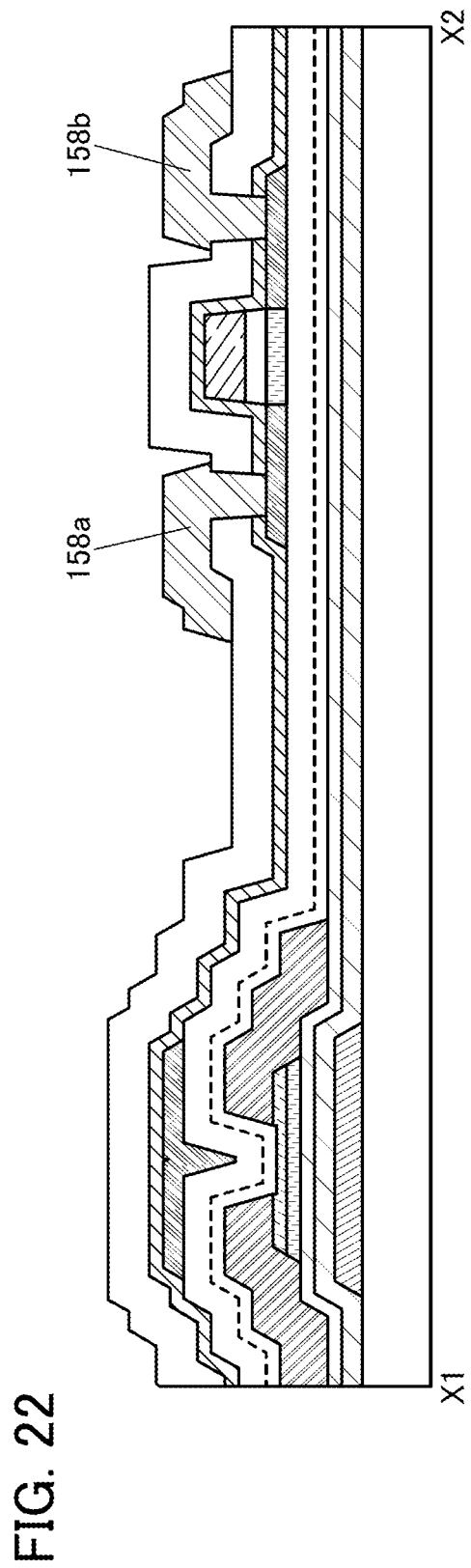
FIG. 22 is a cross-sectional view illustrating the method for manufacturing a semiconductor device.

The conductive film 158_0 is processed into a desired shape, so that the conductive films 158a and 158b are formed (see FIG. 22).

Through the above-described process, the transistor 100 and the transistor 150 shown in FIGS. 1A and 1B can be formed over the same substrate.

Note that in the manufacturing process of the transistor 100 and the transistor 150, the substrate temperature is preferably lower than 400° C., further preferably lower than 375° C., still further preferably higher than or equal to 180° C. and lower than or equal to 350° C. because the change in shape of the substrate (distortion or warp) can be significantly reduced even when a large-sized substrate is used.

<1-6. Structure Example 4 of Semiconductor Device>

Figure 23A:
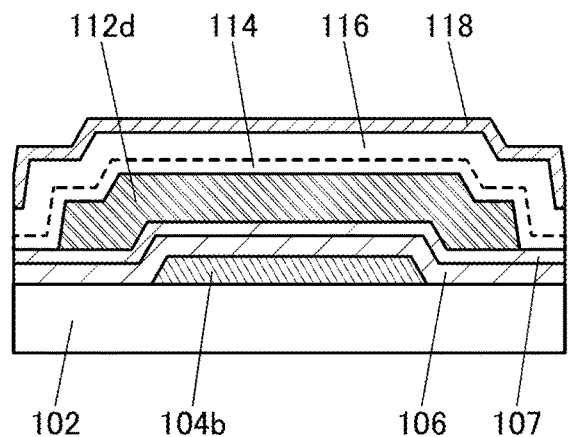
FIGS. 23A to 23C are cross-sectional views illustrating semiconductor devices.
Figure 23B:
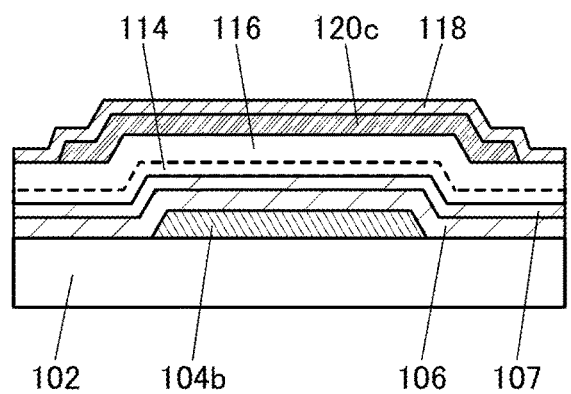
Figure 23C:
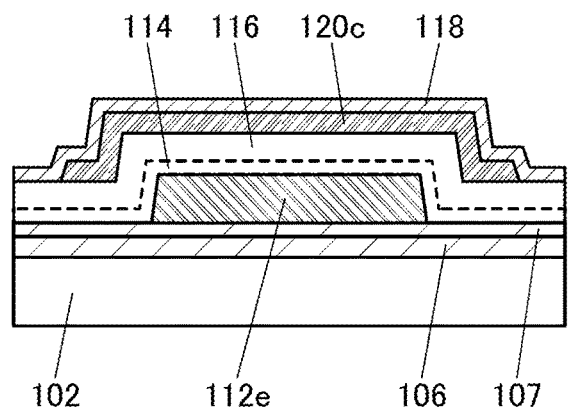
Figure 24A:
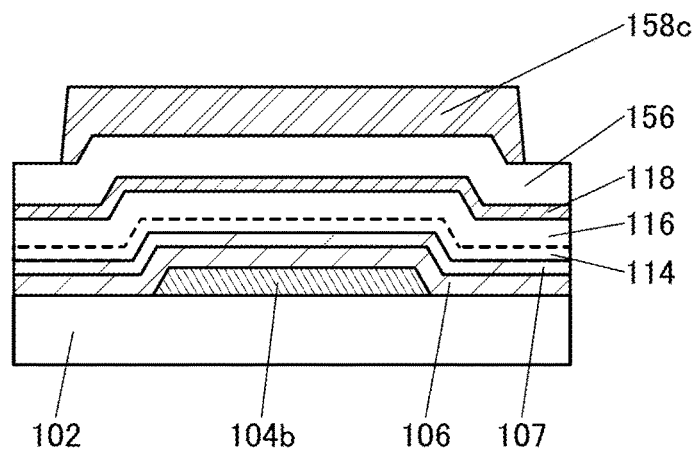
FIGS. 24A to 24C are cross-sectional views illustrating semiconductor devices.
Figure 24B:
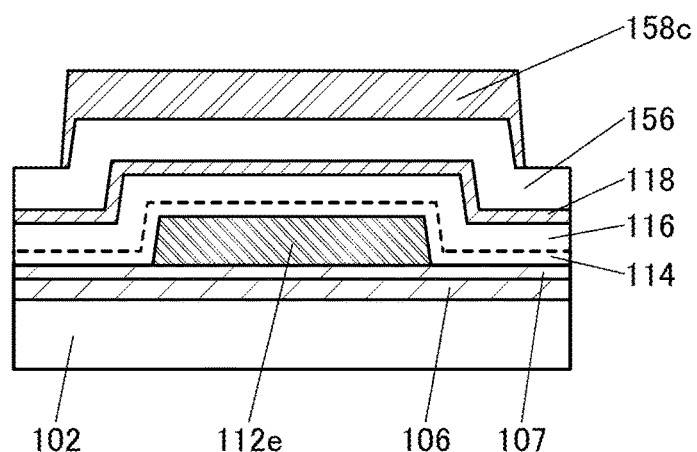
Figure 24C:
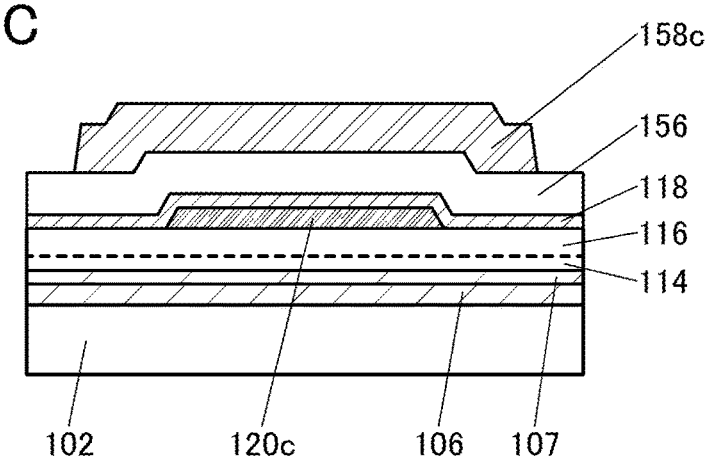

Next, semiconductor devices of one embodiment of the present invention that has a structure different from the above-described structures are described. Note that here, capacitors that can be manufactured by the process in which the transistor 100 and the transistor 150 are manufactured are described with reference to FIGS. 23A to 23C and FIGS. 24A to 24C. FIGS. 23A to 23C are cross-sectional views showing semiconductor devices, and FIGS. 24A to 24C are cross-sectional views showing semiconductor devices. Each of the semiconductor devices shown in FIGS. 23A to 23C and FIGS. 24A to 24C is a capacitor with a stacked-layer structure in which a dielectric film is positioned between a pair of electrodes.

The capacitor shown in FIG. 23A includes a conductive film 104b over the substrate 102, the insulating films 106 and 107 over the substrate 102 and the conductive film 104b, a conductive film 112d over the insulating film 107, and the insulating films 114, 116, and 118 over the insulating film 107 and the conductive film 112d. The conductive film 104b is formed by processing the same conductive film as that used for forming the conductive film 104. The conductive film 112d is formed by processing the same conductive film as that used for forming the conductive films 112a and 112b. In the capacitor shown in FIG. 23A, one of the pair of electrodes is the conductive film 104b, and the other electrode is the conductive film 112d. The insulating films 106 and 107 function as the dielectric film of the capacitor.

The capacitor shown in FIG. 23B includes the conductive film 104b over the substrate 102, the insulating films 106, 107, 114, and 116 over the substrate 102 and the conductive film 104b, an oxide semiconductor film 120c over the insulating film 116, and the insulating film 118 over the insulating film 116 and the oxide semiconductor film 120c. The oxide semiconductor film 120c is formed by processing the same oxide semiconductor film as that used for forming the oxide semiconductor films 120a and 120b. In the capacitor shown in FIG. 23B, one of the pair of electrodes is the conductive film 104b, and the other electrode is the oxide semiconductor film 120c. The insulating films 106, 107, 114, and 116 function as the dielectric film of the capacitor.

The capacitor shown in FIG. 23C includes the insulating films 106 and 107 over the substrate 102, a conductive film 112e over the insulating film 107, the insulating films 114 and 116 over the insulating film 107 and the conductive film 112e, the oxide semiconductor film 120c over the insulating film 116, and the insulating film 118 over the insulating film 116 and the oxide semiconductor film 120c. The conductive film 112e is formed by processing the same conductive film as that used for forming the conductive films 112a and 112b. In the capacitor shown in FIG. 23C, one of the pair of electrodes is the conductive film 112e, and the other electrode is the oxide semiconductor film 120c. The insulating films 114 and 116 function as a dielectric film of the capacitor.

The capacitor shown in FIG. 24A includes the conductive film 104b over the substrate 102, the insulating films 106, 107, 114, 116, 118, and 156 over the substrate 102 and the conductive film 104b, and a conductive film 158c over the insulating film 156. The conductive film 158c is formed by processing the same conductive film as that used for forming the conductive films 158a and 158b. In the capacitor shown in FIG. 24A, one of the pair of electrodes is the conductive film 104b, and the other electrode is the conductive film 158c. The insulating films 106, 107, 114, 116, 118, and 156 function as a dielectric film of the capacitor.

The capacitor shown in FIG. 24B includes the insulating films 106 and 107 over the substrate 102, the conductive film 112e over the insulating film 107, the insulating films 114, 116, 118, and 156 over the insulating film 107 and the conductive film 112e, and the conductive film 158c over the insulating film 156. In the capacitor shown in FIG. 24B, one of the pair of electrodes is the conductive film 112e, and the other electrode is the conductive film 158c. The insulating films 114, 116, 118, and 156 function as a dielectric film of the capacitor.

The capacitor shown in FIG. 24C includes the insulating films 106, 107, 114, and 116 over the substrate 102, the oxide semiconductor film 120c over the insulating film 116, the insulating films 118 and 156 over the insulating film 116 and the oxide semiconductor film 120c, and the conductive film 158c over the insulating film 156. In the capacitor shown in FIG. 24C, one of the pair of electrodes is the oxide semiconductor film 120c, and the other electrode is the conductive film 158c. The insulating films 118 and 156 function as a dielectric film of the capacitor.

Figure 25:
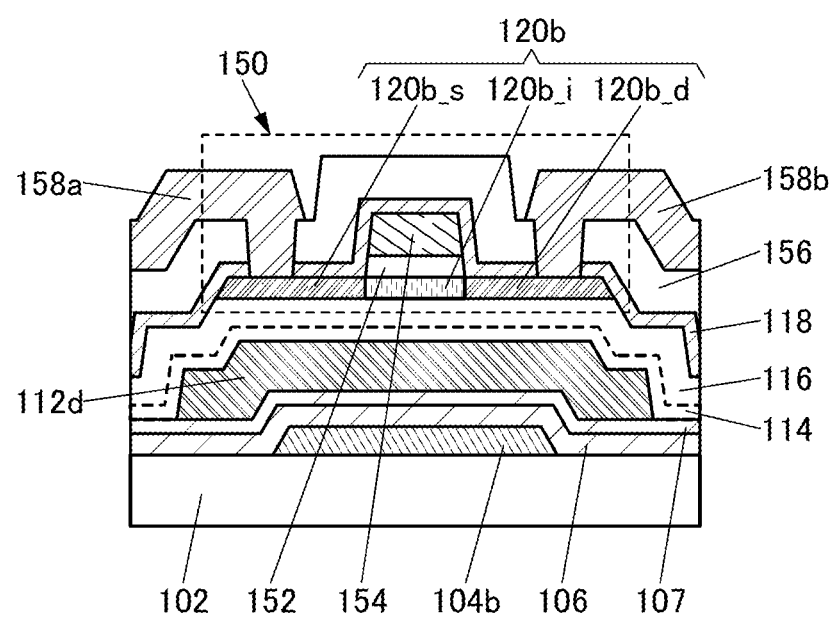
FIG. 25 is a cross-sectional view illustrating a semiconductor device.

In the case where any of the capacitors shown in FIGS. 23A to 23C and FIGS. 24A to 24C and the transistor are stacked, for example, the occupation area of the capacitor can be reduced. FIG. 25 shows an example in the case where a capacitor and a transistor are stacked. Note that a cross section of a semiconductor device is shown in FIG. 25.

In the semiconductor device shown in FIG. 25, the capacitor shown in FIG. 23A and the above-described transistor 150 are stacked. In this manner, any of the transistors of one embodiment of the present invention and any of a variety of elements such as a capacitor may be stacked. In each of the capacitors shown in FIGS. 23A to 23C and FIGS. 24A to 24C, the lower electrode of the pair of electrodes is smaller than the upper electrode of the pair of electrodes, but the structures of the capacitors are not limited thereto. The lower electrode of the pair of electrodes may be larger than the upper electrode of the pair of electrodes.

In Embodiment 1, one embodiment of the present invention has been described. Other embodiments of the present invention are described in Embodiments 2 to 8. Note that one embodiment of the present invention is not limited to these. That is, since various embodiments of the present invention are disclosed in Embodiment 1 and Embodiments 2 to 8, one embodiment of the present invention is not limited to a specific embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

Note that the structure described in this embodiment can be used in appropriate combination with any of the other embodiments.

Embodiment 2

In this embodiment, a structure of an oxide semiconductor and the like are described with reference to FIGS. 26A to 26E, FIGS. 27A to 27E, FIGS. 28A to 28D, FIGS. 29A and 29B, and FIG. 30.

<2-1. Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<2-2. CAAC-OS>

First, a CAAC-OS is described.

A CAAC-OS is one of oxide semiconductors having a plurality of c-axis aligned crystal parts (also referred to as pellets).

Figure 26A:
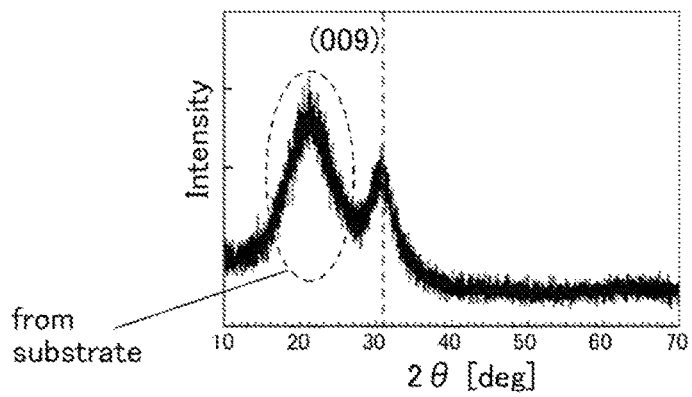
FIGS. 26A to 26E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 26A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

Figure 26B:
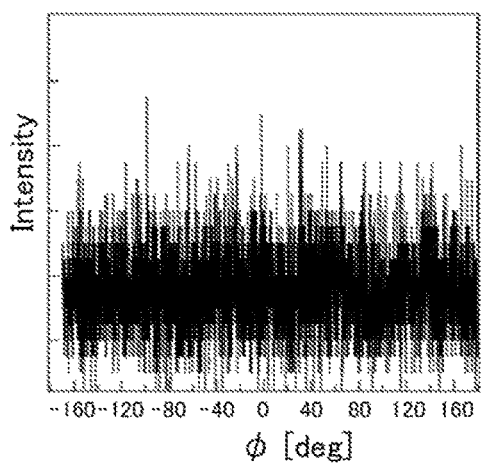
Figure 26C:
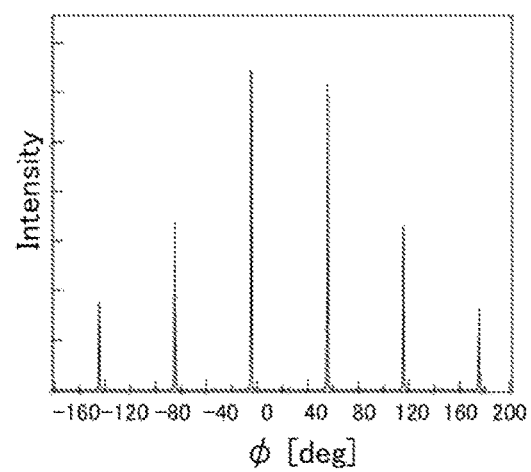
Figure 26D:
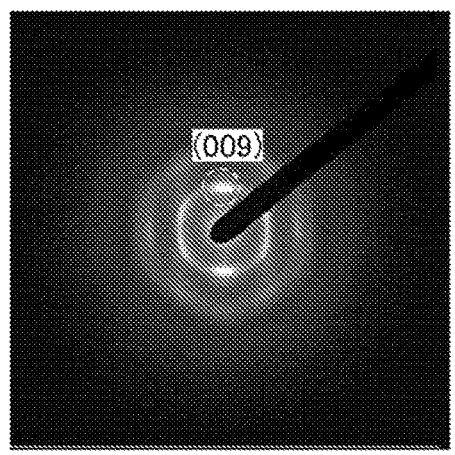

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\varphi$ scan) is performed with $2\theta$ fixed at around 56° and with the sample rotated using a normal vector to the sample surface as an axis ($\varphi$ axis), as shown in FIG. 26B, a peak is not clearly observed. In contrast, in the case where single crystal $InGaZnO_4$ is subjected to $\varphi$ scan with $2\theta$ fixed at around 56°, as shown in FIG. 26C, six peaks which are derived from crystal planes equivalent to the (110) plane are observed. Accordingly, the structural analysis using XRD shows that the directions of a-axes and b-axes are irregularly oriented in the CAAC-OS.

Figure 26E:
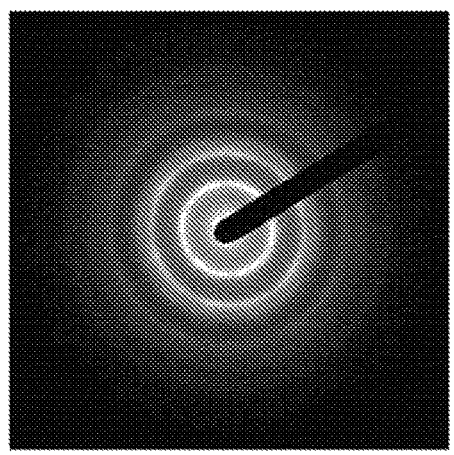

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 26D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 26E shows a diffraction pattern obtained in such a manner that an electron beam with a probe diameter of 300 nm is incident on the same sample in a direction perpendicular to the sample surface. As shown in FIG. 26E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 26E is considered to be derived from the (010) plane, the (100) plane, and the like of the $InGaZnO_4$ crystal. The second ring in FIG. 26E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 27A:
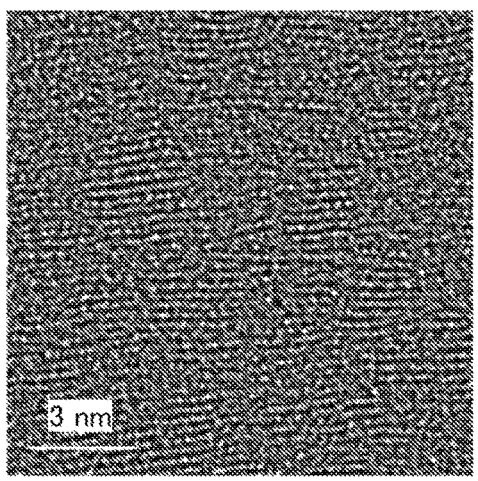
FIGS. 27A to 27E show a cross-sectional TEM image and plan-view TEM images of a CAAC-OS and images obtained through analysis thereof.

FIG. 27A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 27A shows pellets in which metal atoms are arranged in a layered manner. FIG. 27A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 27B:
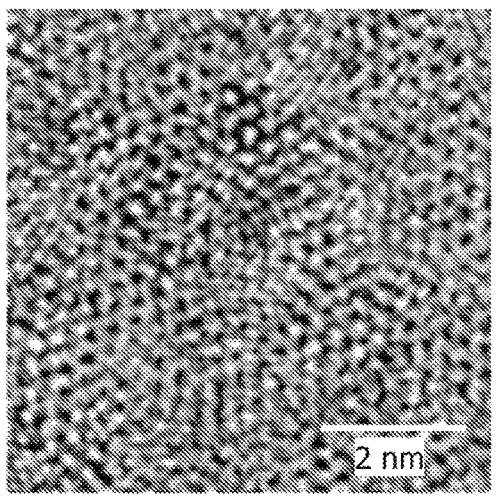
Figure 27C:
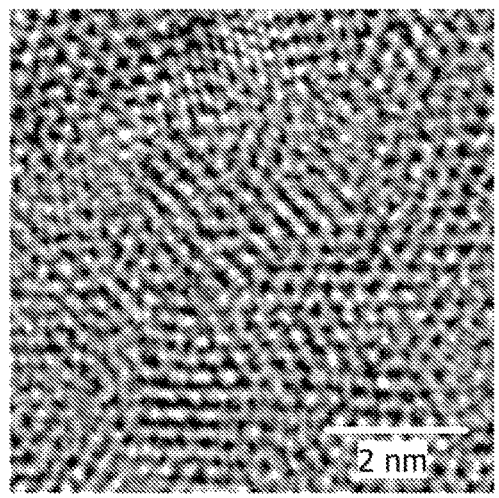
Figure 27D:
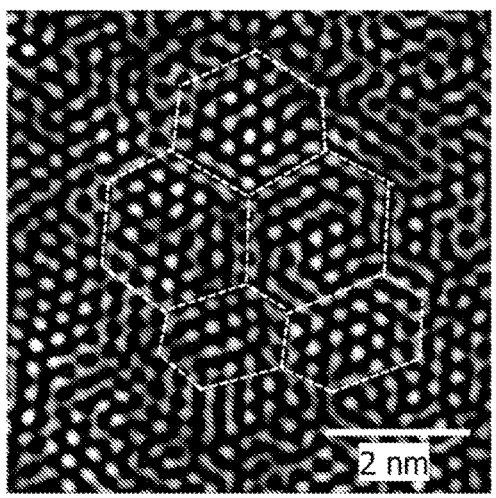
Figure 27E:
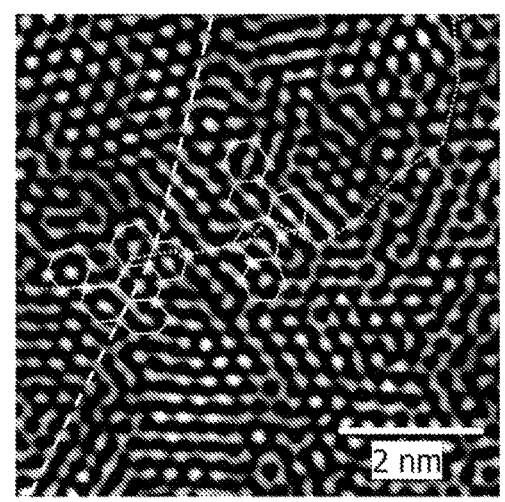

FIGS. 27B and 27C show Cs-corrected high-resolution TEM images of a plane of the CAAC-OS observed from a direction substantially perpendicular to the sample surface. FIGS. 27D and 27E are images obtained through image processing of FIGS. 27B and 27C. The method of image processing is as follows. The image in FIG. 27B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 27D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 27E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<2-3. nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 28A:
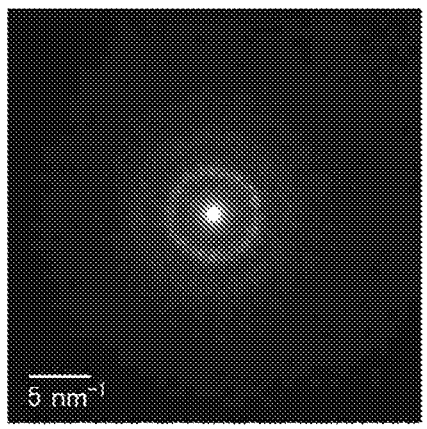
FIGS. 28A to 28D show electron diffraction patterns and a cross-sectional TEM image of an nc-OS.
Figure 28B:
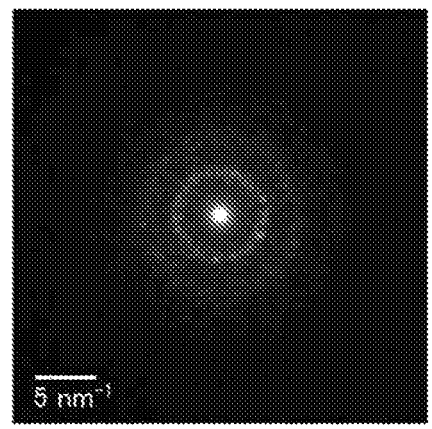

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 28A is observed. FIG. 28B shows a diffraction pattern obtained when an electron beam with a probe diameter of 1 nm is incident on the same sample. As shown in FIG. 28B, a plurality of spots are observed in a ring-like region. In other words, ordering in an nc-OS is not observed with an electron beam with a probe diameter of 50 nm but is observed with an electron beam with a probe diameter of 1 nm.

Figure 28C:
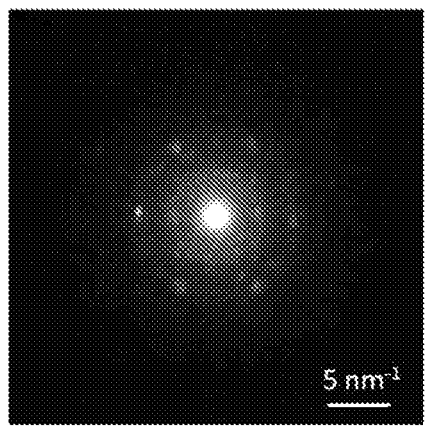

Furthermore, an electron diffraction pattern in which spots are arranged in an approximately hexagonal shape is observed in some cases as shown in FIG. 28C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 28D:
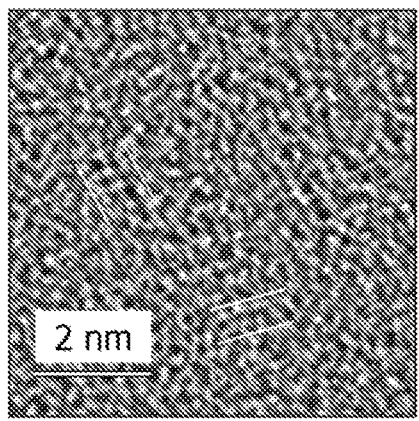

FIG. 28D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 28D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<2-4. a-Like OS>

An a-like OS has a structure intermediate between those of the nc-OS and the amorphous oxide semiconductor.

Figure 29A:
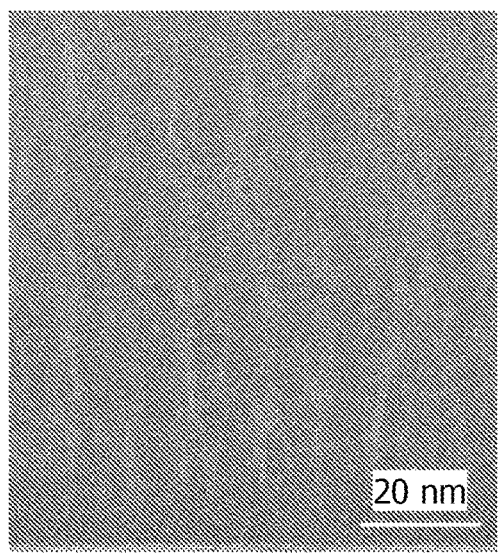
FIGS. 29A and 29B show cross-sectional TEM images of an a-like OS.
Figure 29B:
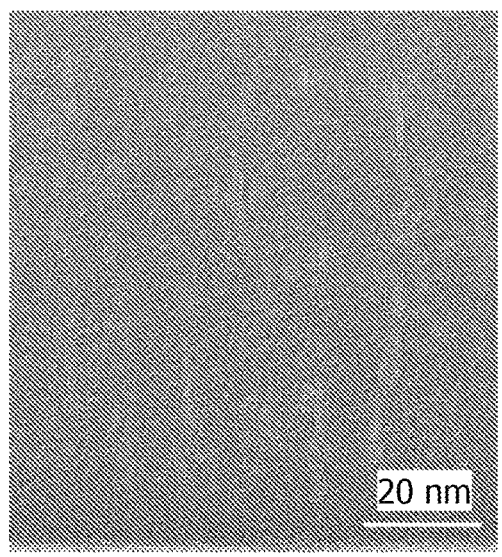

FIGS. 29A and 29B are high-resolution cross-sectional TEM images of an a-like OS. FIG. 29A is the high-resolution cross-sectional TEM image of the a-like OS at the start of the electron irradiation. FIG. 29B is the high-resolution cross-sectional TEM image of a-like OS after the electron (e) irradiation at $4.3\times10^8$ $e^-/nm^2$. FIGS. 29A and 29B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 30:
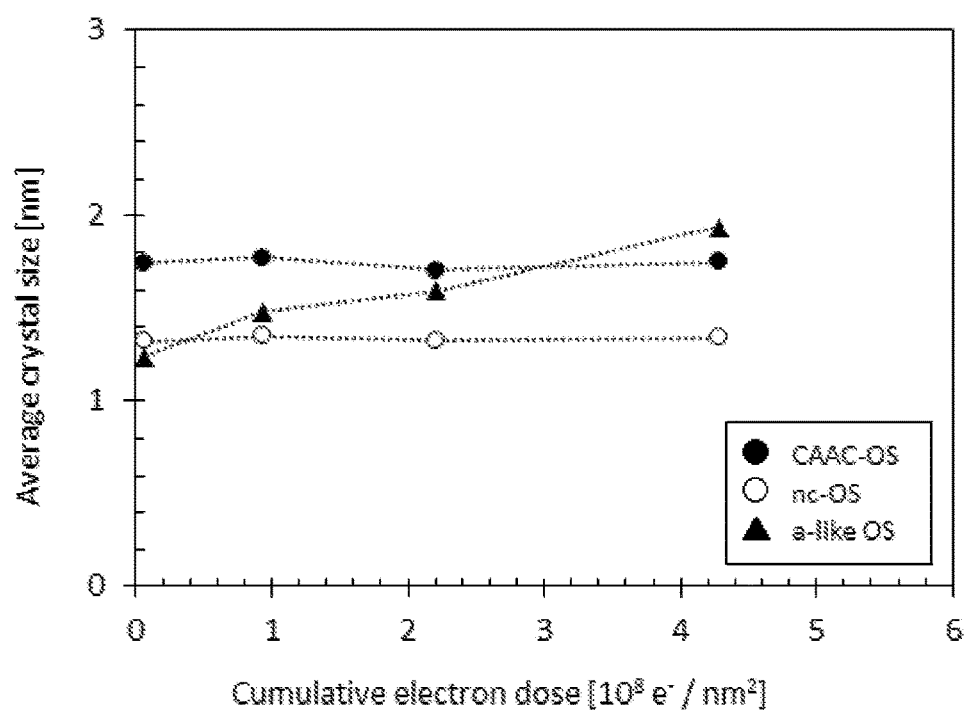
FIG. 30 shows changes in crystal part of an In—Ga—Zn oxide induced by electron irradiation.

FIG. 30 shows change in the average size of crystal parts (at 22 points to 30 points) in each sample. Note that the crystal part size corresponds to the length of a lattice fringe. FIG. 30 indicates that the crystal part size in the a-like OS increases with an increase in the cumulative electron dose in obtaining TEM images, for example. As shown in FIG. 30, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. As shown in FIG. 30, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was 6.7×10$^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga: Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

Note that the structure described in this embodiment can be used in appropriate combination with any of the structures described in the other embodiments or examples.

Embodiment 3

In this embodiment, a display device including a semiconductor device of one embodiment of the present invention is described with reference to FIGS. 31A and 31B, FIGS. 32A and 32B, FIG. 33, FIG. 34, and FIG. 35. Note that in this embodiment, a structure in which a liquid crystal element is used as a display element of a display device (a liquid crystal display device) is specifically described.

<3-1. Liquid Crystal Display Device>

Figure 31A:
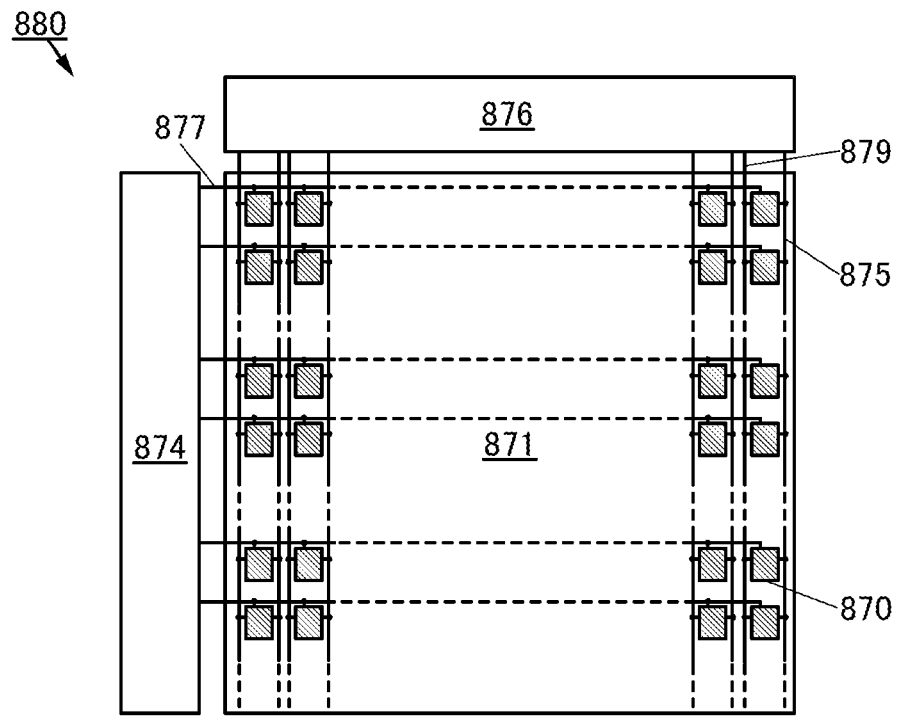
FIGS. 31A and 31B illustrate a block diagram illustrating one embodiment of a display device and a circuit diagram illustrating one embodiment of a pixel.

A liquid crystal display device 880 in FIG. 31A includes a pixel portion 871, a gate driver 874, a source driver 876, m scan lines 877 which are arranged parallel or substantially parallel to each other and whose potentials are controlled by the gate driver 874, and n signal lines 879 which are arranged parallel or substantially parallel to each other and whose potentials are controlled by the source driver 876. Further, the pixel portion 871 includes a plurality of pixels 870 arranged in a matrix. Furthermore, common lines 875 arranged parallel or substantially parallel to each other are provided along the signal lines 879. The gate driver 874 and the source driver 876 are collectively referred to as a driver circuit portion in some cases.

Each of the scan lines 877 is electrically connected to the n pixels 870 arranged in the corresponding row among the plurality of pixels 870 arranged in m rows and n columns in the pixel portion 871. Each of the signal lines 879 is electrically connected to the m pixels 870 arranged in the corresponding column among the plurality of pixels 870 arranged in m rows and n columns. Note that m and n are each an integer of 1 or more. Each of the common lines 875 is electrically connected to the m pixels 870 arranged in the corresponding row among the plurality of pixels 870 arranged in m rows and n columns.

Figure 31B:
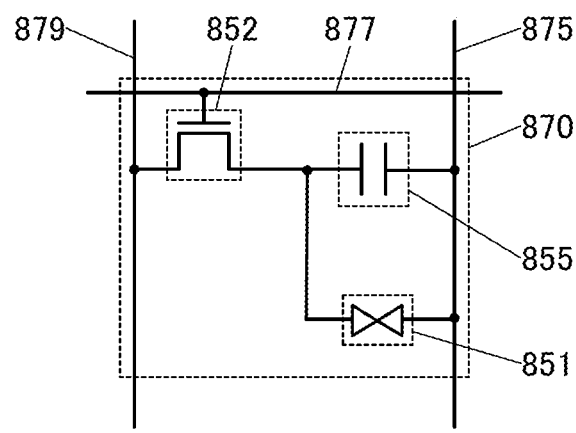

FIG. 31B illustrates an example of a circuit configuration that can be used for the pixel 870 in the liquid crystal display device 880 illustrated in FIG. 31A.

The pixel 870 illustrated in FIG. 31B includes a liquid crystal element 851, a transistor 852, and a capacitor 855.

The transistor 100 or the transistor 150 described in Embodiment 1 can be used as the transistor 852. In particular, the transistor 150 is preferably used in the pixel 870, in which case a parasitic capacitance can be reduced because the gate electrode does not overlap with the source electrode or the drain electrode.

One of a pair of electrodes of the liquid crystal element 851 is connected to the transistor 852 and the potential thereof is set according to the specifications of the pixel 870 as appropriate. The other of the pair of electrodes of the liquid crystal element 851 is connected to the common line 875 and a common potential is applied thereto. The alignment state of liquid crystals in the liquid crystal element 851 is controlled in accordance with data written to the transistor 852.

The liquid crystal element 851 is an element which controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). As the liquid crystal used for the liquid crystal element 851, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As a driving method of the liquid crystal display device 880 including the liquid crystal element 851, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

The liquid crystal display device 880 may be a normally black liquid crystal display device such as a transmissive liquid crystal display device utilizing a vertical alignment (VA) mode. As a vertical alignment mode, a multi-domain vertical alignment (MVA) mode, a patterned vertical alignment (PVA) mode, or an ASV mode can be employed, for example.

<3-2. Horizontal Electric Field Mode Liquid Crystal Display Device>

First, liquid crystal display devices using a horizontal electric field mode, typically, liquid crystal display devices using an FFS mode and an IPS mode are described.

In the structure of the pixel 870 illustrated in FIG. 31B, one of a source electrode and a drain electrode of the transistor 852 is electrically connected to the signal line 879, and the other is electrically connected to the one of the pair of electrodes of the liquid crystal element 851. A gate electrode of the transistor 852 is electrically connected to the scan line 877. The transistor 852 has a function of controlling whether to write a data signal.

In the structure of the pixel 870 shown in FIG. 31B, one of a pair of electrodes of the capacitor 855 is connected to the other of the source electrode and the drain electrode of the transistor 852. The other of the pair of electrodes of the capacitor 855 is electrically connected to the common line 875. The potential of the common line 875 is set in accordance with the specifications of the pixel 870 as appropriate. The capacitor 855 functions as a storage capacitor for retaining written data. Note that in the liquid crystal display device 880 driven by the FFS mode, the one of the pair of electrodes of the capacitor 855 is partly or entirely the one of the pair of electrodes of the liquid crystal element 851, and the other of the pair of electrodes of the capacitor 855 is partly or entirely the other of the pair of electrodes of the liquid crystal element 851.

<3-3. Structure Example 1 of Horizontal Electric Field Element Substrate>

Figure 32A:
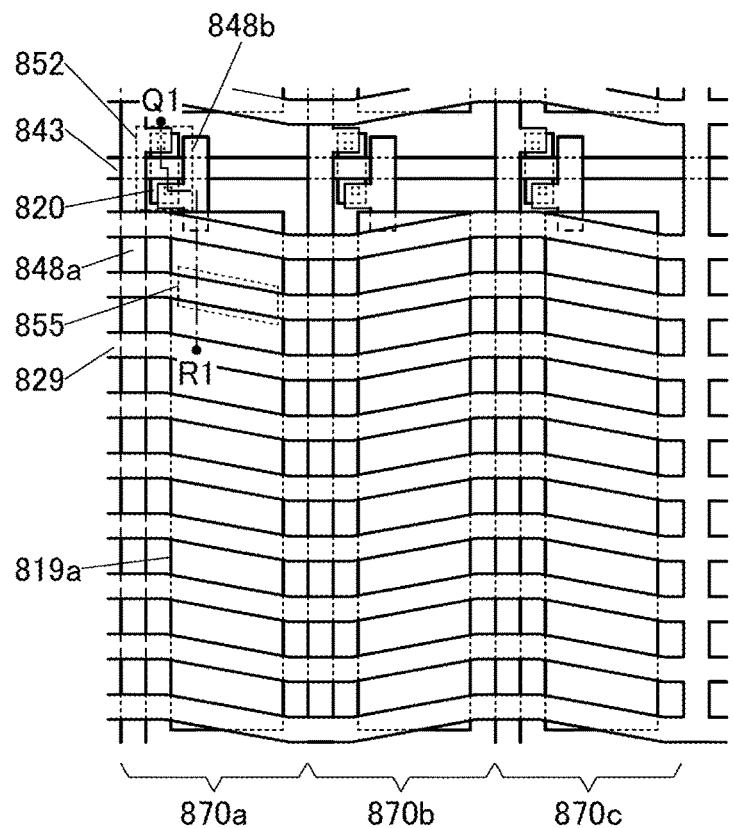
FIGS. 32A and 32B are a top view and a circuit diagram illustrating one embodiment of a display device.

A specific structure of an element substrate included in the liquid crystal display device 880 is described. FIG. 32A is a top view of a plurality of pixels 870a, 870b, and 870c included in the liquid crystal display device 880 driven by the FFS mode.

In FIG. 32A, a conductive film 843 functioning as a scan line extends substantially perpendicularly to the signal line (in the horizontal direction in the drawing). A conductive film 848a functioning as a signal line extends substantially perpendicularly to the scan line (in the vertical direction in the drawing). As the conductive film 843 functioning as the scan line is electrically connected to the gate driver 874, and the conductive film 848a functioning as the signal line is electrically connected to the source driver 876 (see FIG. 31A).

The transistor 852 is provided in the vicinity of the intersection portion of the scan line and the signal line. The transistor 852 includes: the conductive film 843 functioning as a gate electrode; a gate insulating film (not illustrated in FIG. 32A); an oxide semiconductor film 820 where a channel region is formed, over the gate insulating film; and the conductive film 848a and a conductive film 848b that function as the source electrode and the drain electrode. The conductive film 843 also functions as the scan line, and a region of the conductive film 843 that overlaps with the oxide semiconductor film 820 functions as the gate electrode of the transistor 852. The conductive film 848a functions as the signal line, and a region of the conductive film 848a that overlaps with the oxide semiconductor film 820 functions as the source electrode or the drain electrode of the transistor 852.

The conductive film 848b is electrically connected to an oxide semiconductor film 819a functioning as a pixel electrode. A conductive film 829 is provided over the oxide semiconductor film 819a with an insulating film (not shown in FIG. 32A) positioned therebetween. Note that the conductive film 829 functions as a common electrode.

The conductive film 829 has stripe regions extending in a direction intersecting with the signal line. The stripe region is connected to a region extending in a direction parallel or substantially parallel to the signal line. Accordingly, the stripe regions of the conductive film 829 are at the same potential in a plurality of pixels included in the liquid crystal display device 880.

The capacitor 855 is formed in a region where the oxide semiconductor film 819a and the conductive film 829 overlap with each other. The oxide semiconductor film 819a and the conductive film 829 each have a light-transmitting property. That is, the capacitor 855 has a light-transmitting property.

Owing to the light-transmitting property of the capacitor 855, the capacitor 855 can be formed large (in a large area) in the pixel 870. Thus, a display device with a large amount of charge capacity as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charge stored in the capacitor is small in the high-resolution display device. However, since the capacitor 855 of this embodiment transmits light, when it is provided in a pixel, a sufficient amount of charge can be obtained in the pixel and the aperture ratio can be improved. Typically, the capacitor 855 can be favorably used for a high-resolution display device with a pixel density of 200 ppi or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Further, according to the structure of this embodiment, the aperture ratio can be improved even in a high-resolution display device, which makes it possible to use light from a light source such as a backlight efficiently, so that power consumption of the display device can be reduced.

Figure 32B:
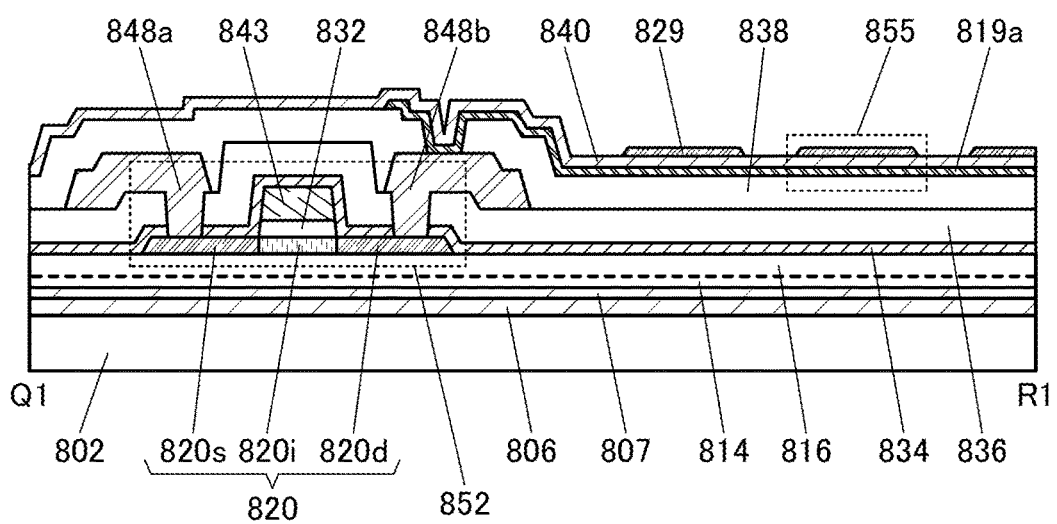

FIG. 32B is a cross-sectional view taken along the dashed-dotted line Q1-R1 in FIG. 32A. The transistor 852 shown in FIG. 32B is a top-gate transistor. Note that the transistor 852 in the channel length direction is shown in the cross-sectional view taken along the dashed-dotted line Q1-R1.

The transistor 852 shown in FIGS. 32A and 32B is formed over insulating films 806, 807, 814, and 816 over a substrate 802. The transistor 852 includes the oxide semiconductor film 820, an insulating film 832 over the oxide semiconductor film 820, the conductive film 843 over the insulating film 832, and an insulating film 834 over the insulating film 816, the oxide semiconductor film 820, and the conductive film 843. Note that the oxide semiconductor film 820 includes a source region 820s, a channel region 820i, and a drain region 820d. An insulating film 836 is provided over the insulating film 834, and the conductive films 848a and 848b are provided over the insulating film 836. Note that the conductive film 848a is electrically connected to the source region 820s through an opening provided in the insulating films 836 and 834. The conductive film 848b is electrically connected to the drain region 820d through an opening provided in the insulating films 836 and 834.

The insulating film 832 functions as the gate insulating film of the transistor 852. The conductive film 843 functions as the gate electrode of the transistor 852. The conductive film 848a functions as the source electrode of the transistor 852. The conductive film 848b functions as the drain electrode of the transistor 852.

Note that the substrate 802, the insulating films 806, 807, 814, 816, 832, 834, and 836, the oxide semiconductor film 820, and the conductive films 848a and 848b can be formed using a material and a method similar to those used for forming the substrate 102, the insulating films 106, 107, 114, 116, 152, 118, and 156, the oxide semiconductor film 120a, and the conductive films 112a and 112b, respectively.

An insulating film 838 is provided over the insulating film 836 and the conductive films 848a and 848b. The oxide semiconductor film 819a is provided over the insulating film 838. The oxide semiconductor film 819a is electrically connected to the conductive film 848b through an opening provided in the insulating film 838. An insulating film 840 is provided over the insulating film 836 and the oxide semiconductor film 819a, and the conductive film 829 is provided over the insulating film 840.

The insulating film 838 can be formed using a material and a method similar to those used for forming the insulating film 836. The oxide semiconductor film 819a can be formed using a material and a method similar to those used for forming the oxide semiconductor film 820. The insulating film 840 can be formed using a material and a method similar to those used for forming the insulating film 834. The conductive film 829 can be formed using a material and a method similar to those used for forming the oxide semiconductor film 820.

The oxide semiconductor film 819a functions as the pixel electrode of the display device. The conductive film 829 functions as the common electrode of the display device. The oxide semiconductor film 819a, the insulating film 840, and the conductive film 829 form the capacitor 855.

In this embodiment, the oxide semiconductor film 819a has a rectangular shape in the top view, but the shape of the oxide semiconductor film 819a is not limited thereto. For example, the oxide semiconductor film 819a may have a comb-like shape or a shape having a slit.

<3-4. Vertical Alignment Mode Liquid Crystal Display Device>

Figure 33:
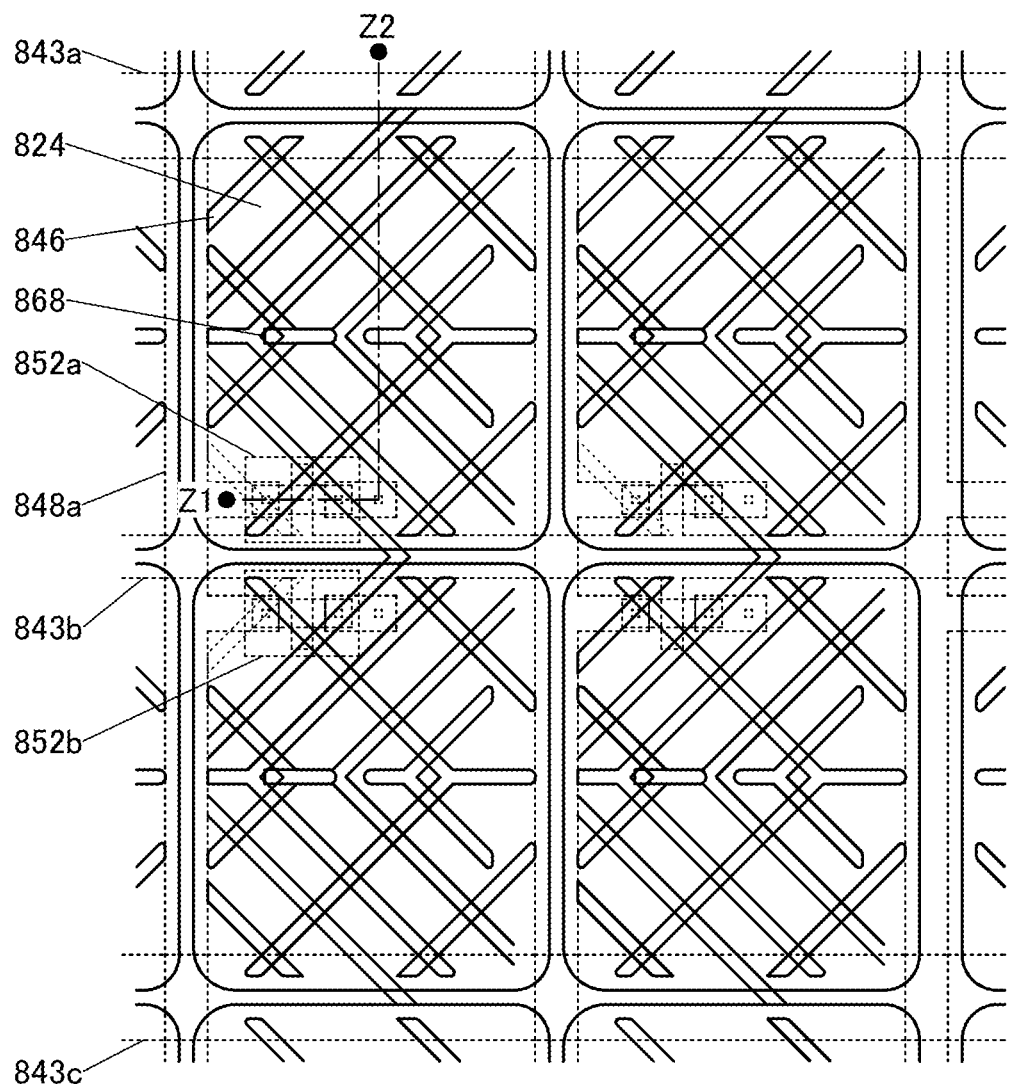
FIG. 33 is a top view illustrating one embodiment of a display device.
Figure 34:
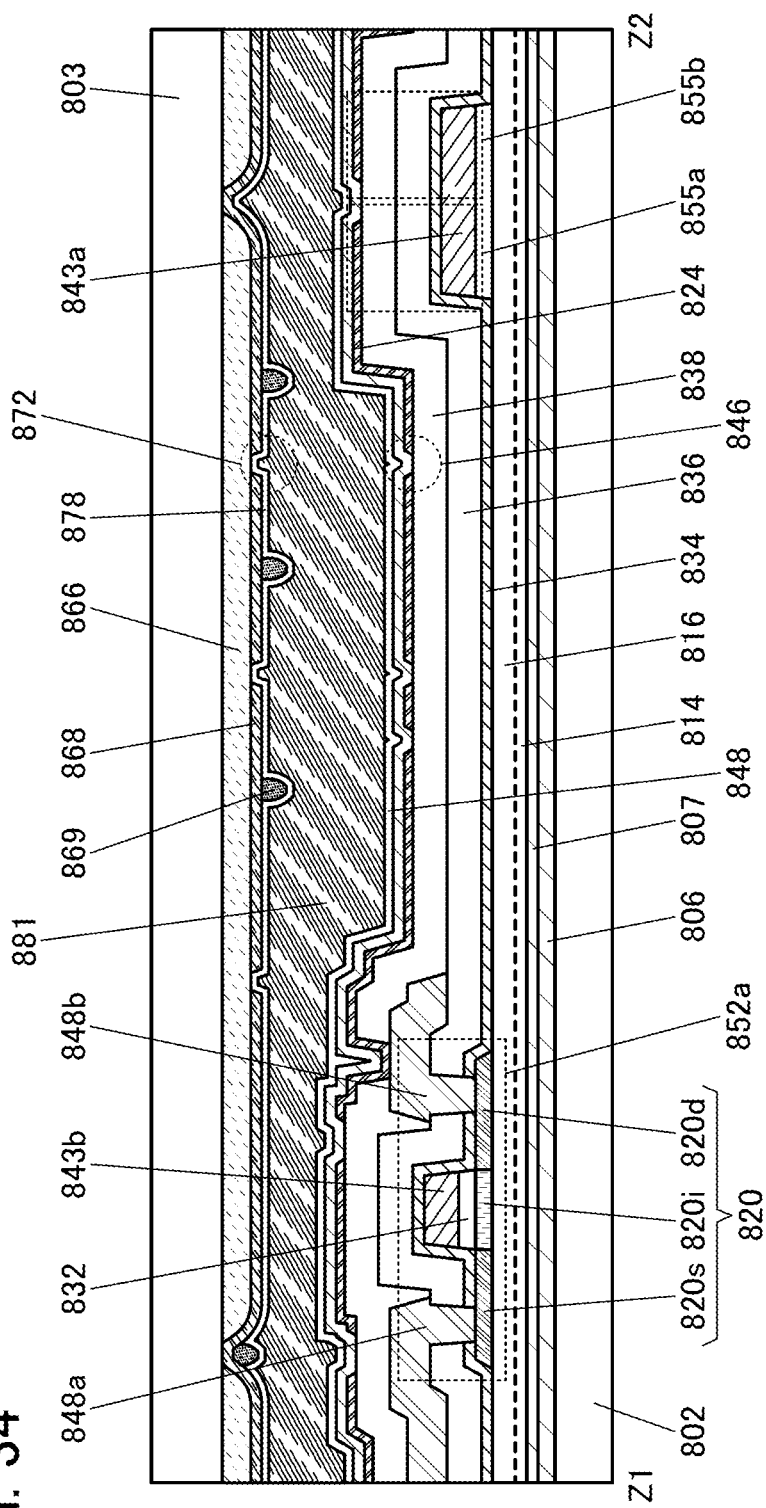
FIG. 34 is a cross-sectional view illustrating one embodiment of a display device.
Figure 35:
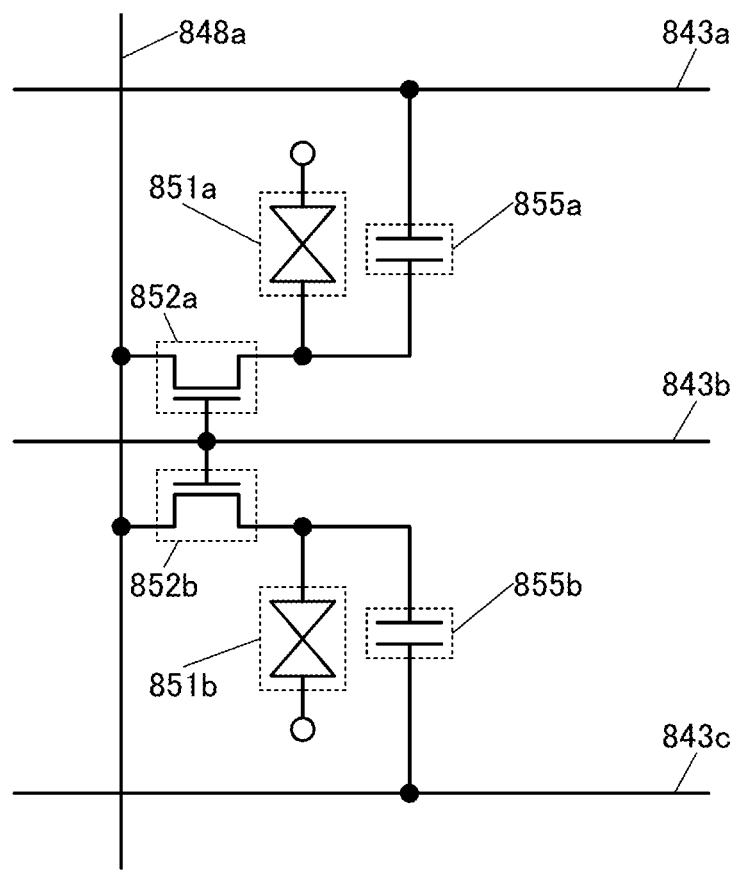
FIG. 35 is a circuit diagram showing one embodiment of a display device.

A structure of a pixel including a liquid crystal element which operates in a vertical alignment (VA) mode is described with reference to FIG. 33 to FIG. 35. FIG. 33 is a top view of pixels included in a liquid crystal display device. FIG. 34 is a cross-sectional view taken along the dashed-dotted line Z1-Z2 in FIG. 33. FIG. 35 is an equivalent circuit diagram of the pixels included in the liquid crystal display device.

A vertical alignment (VA) is a mode for controlling alignment of liquid crystal molecules of a liquid crystal display panel. In the VA liquid crystal display device, liquid crystal molecules are aligned in a vertical direction with respect to a panel surface when no voltage is applied.

In the following description, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

The liquid crystal display device shown in FIG. 33 and FIG. 34 includes a transistor 852a over the substrate 802, the insulating film 838 over the transistor 852a, a conductive film 824 that is over the insulating film 838 and electrically connected to the transistor 852a, and a capacitor 855a. Note that the conductive film 824 functions as a pixel electrode. The conductive film 824 is provided with slits 846. The slits 846 are capable of controlling the alignment of liquid crystals.

A substrate 803 is provided in a position overlapping with the substrate 802, and a liquid crystal layer 881 is provided between the substrates 802 and 803. The substrate 803 is provided with a coloring film 866, a conductive film 868, and structure bodies 869. Note that the conductive film 868 functions as a common electrode. The conductive film 868 is provided with slits 872. The slits 872 and the structure bodies 869 are capable of controlling the alignment of the liquid crystals. Alignment films 848 and 878 are provided on surfaces in contact with the liquid crystal layer 881.

Note that in the top view shown in FIG. 33, the conductive film 824 functioning as the pixel electrode and the conductive film 868 functioning as the common electrode are shown by solid lines, and the transistor 852a and the like are shown by dashed lines.

A transistor 852b is provided adjacent to the transistor 852a. The transistor 852a and the transistor 852b are connected to the conductive film 848a. Note that the conductive film 848a functions as a source electrode in each of the transistors 852a and 852b and functions as the signal line in the liquid crystal display device.

The transistor 100 or the transistor 150 described in Embodiment 1 can be used as each of the transistors 852a and 852b. In particular, the transistor 150 is preferably used, in which case a parasitic capacitance can be reduced because the gate electrode does not overlap with the source electrode or the drain electrode.

When voltage is applied to the conductive film 824 provided with the slits 846, electric field distortion (an oblique electric field) is generated near the slits 846. The slit 846 alternates with or faces the structure body 869 and the slit 872 on the substrate 803 side so that oblique electric fields are effectively generated, whereby the alignment of the liquid crystals can be controlled. The alignment direction of the liquid crystals in the pixel where the transistor 852a is formed is preferably different from the alignment direction of the liquid crystals in the pixel where the transistor 852b is formed. That is, a viewing angle of the liquid crystal display device can be widened by domain multiplication.

Either one of or both the structure bodies 869 on the substrate 803 side and the slits 872 on the substrate 803 side may be omitted.

The transistor 852a is provided over the insulating films 806, 807, 814, and 816 over the substrate 802. The transistor 852a includes the oxide semiconductor film 820, the insulating film 832 over the oxide semiconductor film 820, a conductive film 843b over the insulating film 832, the conductive film 848a electrically connected to the source region 820s of the oxide semiconductor film 820, and the conductive film 848b electrically connected to the drain region 820d of the oxide semiconductor film 820. Note that the insulating film 832 functions as a gate insulating film, and the conductive film 843b functions as a gate electrode. The conductive film 848a and the conductive film 848b function as a source electrode and a drain electrode, respectively. The channel region 820i is formed in the oxide semiconductor film 820 that is in contact with the insulating film 832.

The insulating films 834 and 836 are provided over the source region 820s, the drain region 820d, and the conductive film 843b, and the conductive films 848a and 848b are electrically connected to the oxide semiconductor film 820 through openings provided in the insulating films 834 and 836.

The capacitor 855a includes a conductive film 843a, the insulating films 834, 836, and 838 over the conductive film 843a, and the conductive film 824 over the insulating film 838. The conductive film 843a is formed through a step of processing the same conductive film as that used for forming the conductive film 843b of the transistor 852a.

FIG. 35 shows an example of an equivalent circuit of the liquid crystal display device shown in FIG. 33 and FIG. 34.

As shown in FIG. 35, the transistor 852a and the transistor 852b are electrically connected to the conductive film 843b functioning as a gate wiring and the conductive film 848a functioning as a source wiring. In this case, when potentials of the conductive film 843a and a conductive film 843c are made different from each other, the operation of a liquid crystal element 851a and that of a liquid crystal element 851b can be varied. That is, a viewing angle can be widened by individual control of the potentials of the conductive film 843a and the conductive film 843c. Note that the conductive film 843a and the conductive film 843b function as common wirings.

This embodiment can be combined with any of the other embodiments in this specification as appropriate.

Embodiment 4

In this embodiment, a semiconductor device of one embodiment of the present invention and a display device that includes the semiconductor device of one embodiment of the present invention are described with reference to FIGS. 36A and 36B, FIGS. 37A to 37C, FIGS. 38A and 38B, and FIGS. 39A and 39B. Note that in this embodiment, a structure in which a light-emitting element (in particular, an electroluminescence (EL) element) is used as a display element of a display device is specifically described.

<4-1. Display Device>

The display device illustrated in FIG. 36A includes a region including pixels of display elements (hereinafter the region is referred to as pixel portion 502), a circuit portion being provided outside the pixel portion 502 and including a circuit for driving the pixels (hereinafter the portion is referred to as driver circuit portion 504), circuit portions for correcting the temperature of transistors or light-emitting elements (hereinafter the circuit portions are referred to as sensor circuit portions 508), circuits each having a function of protecting an element (hereinafter the circuits are referred to as protection circuit portions 506), and a terminal portion 507. Note that the sensor circuit portions 508 and the protection circuit portions 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

Figure 36A:
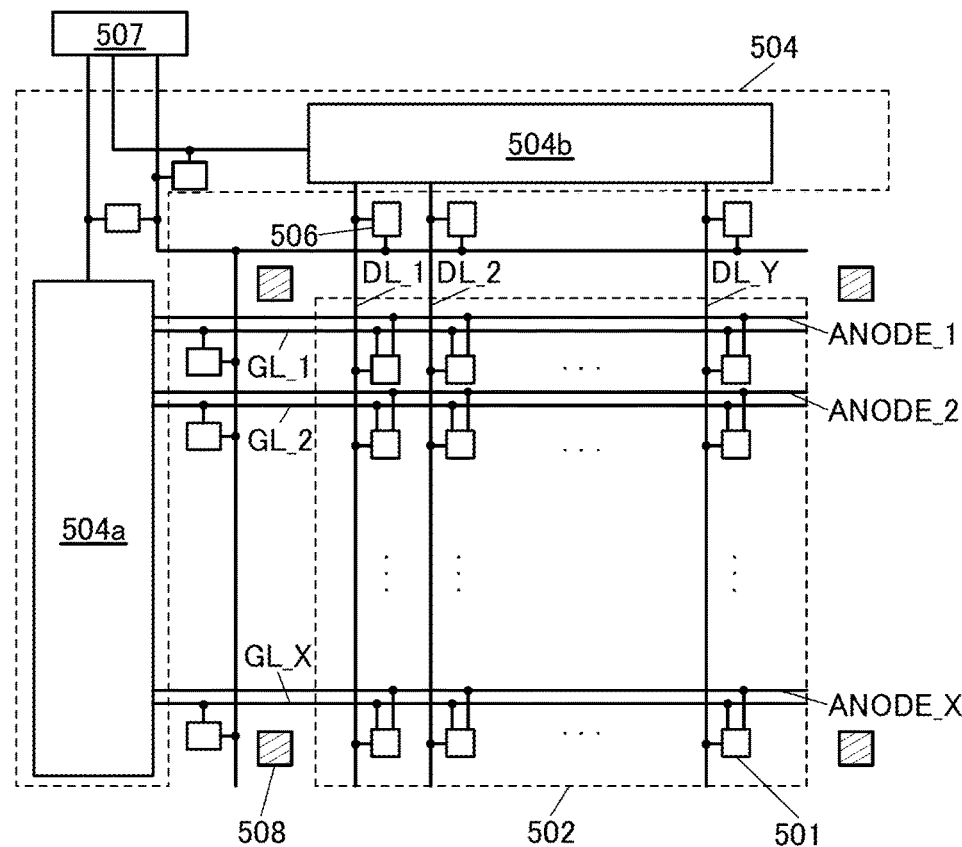
FIGS. 36A and 36B are a block diagram and a circuit diagram illustrating a display device.

In FIG. 36A, an example in which the driver circuit portion 504 includes a gate driver 504a and a source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as gate driver 504a) and a circuit for supplying a signal (data signal) to drive a display element in a pixel (hereinafter, the circuit is referred to as source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal. For example, as shown in FIG. 36A, the gate driver 504a is electrically connected to wirings for controlling the potential of the light-emitting element (hereinafter such wirings are referred to as ANODE_1 to ANODE_X).

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the image signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to I), a pulse signal is input from the gate driver 504a through the scan line GL_m, and a data signal is input from the source driver 504b through the data line DL_n in accordance with the potential of the scan line GL_m.

The protection circuit portion 506 shown in FIG. 36A is connected to, for example, the scan line GL between the gate driver 504a and the pixel circuit 501. Alternatively, the protection circuit portion 506 is connected to the data line DL between the source driver 504b and the pixel circuit 501. Alternatively, the protection circuit portion 506 can be connected to a wiring between the gate driver 504a and the terminal portion 507. Alternatively, the protection circuit portion 506 can be connected to a wiring between the source driver 504b and the terminal portion 507. Note that the protection circuit portion 506 is a circuit that electrically connects a wiring connected to the protection circuit to another wiring when a potential out of a certain range is applied to the wiring connected to the protection circuit.

As shown in FIG. 36A, the protection circuit portions 506 are provided for the pixel portion 502 and the driver circuit portion 504, so that the resistance of the display device to overcurrent generated by electrostatic discharge (ESD) or the like can be improved. Note that the configuration of the protection circuit portions 506 is not limited to that, and for example, the protection circuit portion 506 may be configured to be connected to the gate driver 504a or the protection circuit portion 506 may be configured to be connected to the source driver 504b. Alternatively, the protection circuit portion 506 may be configured to be connected to the terminal portion 507.

<4-2. Structure Example of Protection Circuit Portion>

Figure 37A:
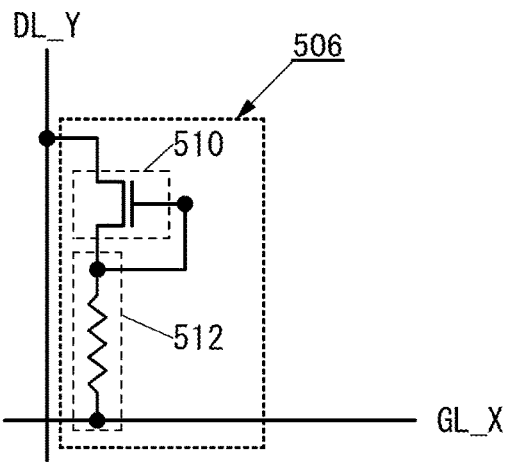
FIGS. 37A to 37C illustrate a circuit configuration of a resistor and a top surface and a cross section of the resistor.

The protection circuit portion 506 can have a structure shown in FIG. 37A, for example.

FIG. 37A illustrates an example of a circuit configuration that can be used for the protection circuit portion 506. The protection circuit portion 506 includes a transistor 510 and a resistor 512. One of a source electrode and a drain electrode of the transistor 510 is electrically connected to the data line DL, and the other of the source electrode and the drain electrode of the transistor 510 is electrically connected to one electrode of the resistor 512. A gate electrode of the transistor 510 is electrically connected to the other of the source electrode and the drain electrode of the transistor 510. The other electrode of the resistor 512 is electrically connected to the scan line GL. Note that a second gate electrode may be provided for the transistor 510.

As the transistor 510, the transistor 100 or the transistor 150 described in Embodiment 1 can be used, for example. As the resistor 512, a structure shown in FIGS. 37B and 37C can be used, for example.

Figure 37B:
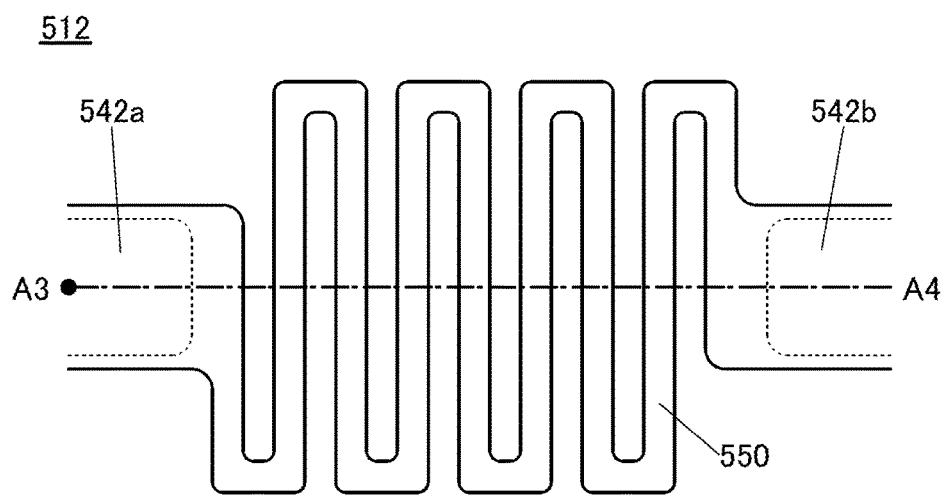
Figure 37C:
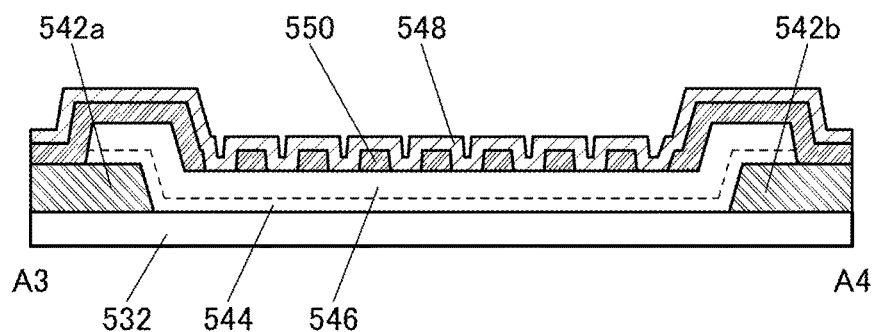

FIG. 37B illustrates an example of a top view of the resistor 512. FIG. 37C corresponds to a cross-sectional view taken along the dashed-dotted line A3-A4 in FIG. 37B.

The resistor 512 includes the following components: electrodes 542a and 542b over a substrate 532; insulating films 544 and 546 over the substrate 532 and the electrodes 542a and 542b; an oxide semiconductor film 550 over the electrodes 542a and 542b and the insulating film 546; and an insulating film 548 over the insulating film 546 and the oxide semiconductor film 550.

The substrate 532, the insulating films 544 and 546, the electrodes 542a and 542b, the oxide semiconductor film 550, and the insulating film 548 can be formed using materials similar to those of the substrate 102, the insulating films 114 and 116, the conductive films 112a and 112b, the oxide semiconductor film 120, and the insulating film 118 described in the above, respectively.

The electrodes 542a and 542b are electrically connected to each other through the oxide semiconductor film 550. The oxide semiconductor film 550 serves as a resistor.

As shown in FIGS. 37B and 37C, the shape (the length or the width) of the oxide semiconductor film 550 or the thickness of the oxide semiconductor film 550 is adjusted as appropriate to obtain a desired resistance value.

Note that the terminal portion 507 shown in FIG. 36A is a portion having terminals for inputting power, control signals, and image signals to the display device from external circuits. The sensor circuit portion 508 shown in FIG. 36A has a function of correcting the temperature of a transistor or a light-emitting element.

<4-3. Structure Example of Sensor Circuit Portion>

Figure 38A:
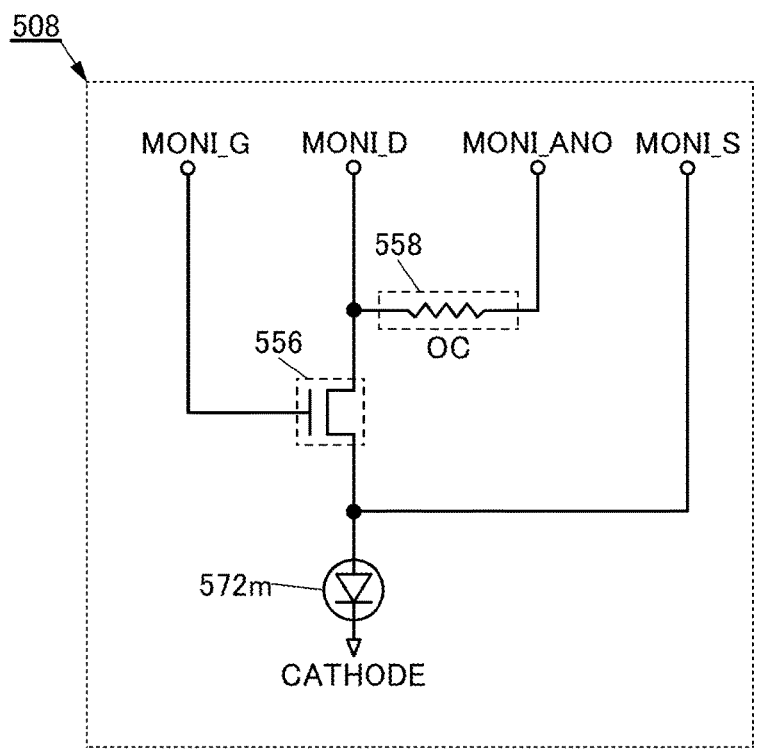
FIGS. 38A and 38B are a circuit diagram and a schematic cross-sectional view illustrating a sensor circuit portion.
Figure 38B:
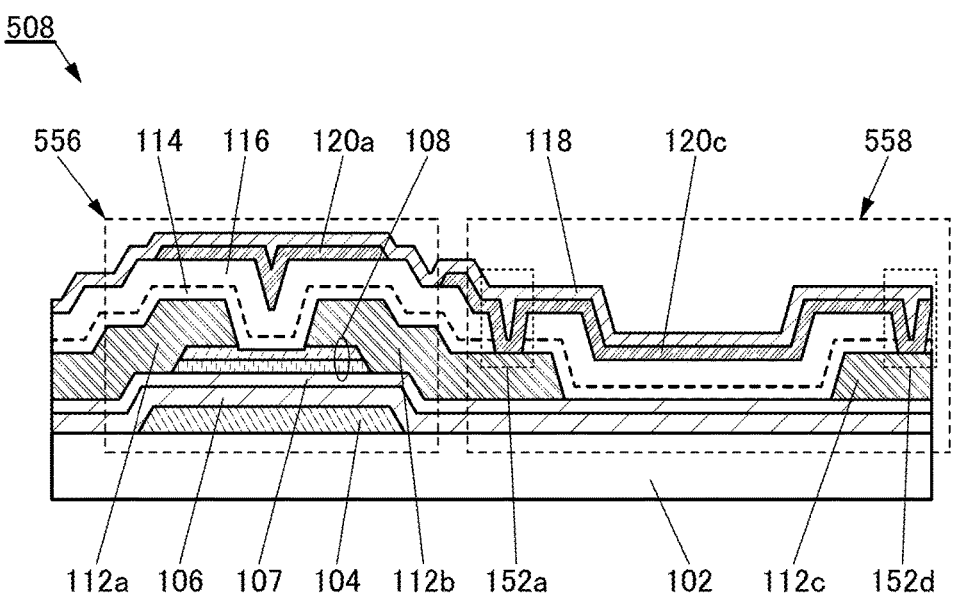

The sensor circuit portions 508 can have structures shown in FIGS. 38A and 38B, for example.

FIG. 38A illustrates an example of a circuit configuration that can be used as the sensor circuit portion 508. The sensor circuit portion 508 includes a transistor 556, a resistor 558, and a light-emitting element 572m for monitor use. A gate electrode of the transistor 556 is electrically connected to a gate line MONI_G for monitor use, one of a source electrode and a drain electrode of the transistor 556 is electrically connected to one electrode of the light-emitting element 572m, and the other of the source electrode and the drain electrode of the transistor 556 is electrically connected to a drain line MONI_D for monitor use. One electrode of the resistor 558 is electrically connected to the other of the source electrode and the drain electrode of the transistor 556, and the other electrode of the resistor 558 is electrically connected to an anode line MONI_ANO for monitor use. The one electrode of the light-emitting element 572m is electrically connected to a source line MONI_S for monitor use, and the other electrode of the light-emitting element 572m is electrically connected to a cathode line.

Note that the transistor 556 has a function similar to that of a driving transistor in the pixel portion 502, such as the transistor 554. For example, the sensor circuit portion 508 has a function of monitoring the voltages and the currents of the gate electrode, the source electrode, and the drain electrode of the transistor 556 and the anode line when a current flows in the light-emitting element 572m. Furthermore, the gate line MONI_G for monitor use, the drain line MONI_D for monitor use, the anode line MONI_ANO for monitor use, and the source line MONI_S for monitor use are provided independently as shown in FIG. 38A; thus, each signal can be measured independently.

For example, characteristics of the light-emitting element 572m for monitor use can be determined by measuring the potential of the source line for monitor use. Characteristics of the transistor 556 can be determined by measuring the potentials of the gate line MONI_G for monitor use, the drain line MONI_D for monitor use, and the source line MONI_S for monitor use. Characteristics of the resistor 558 can be determined by measuring the potentials of the anode line MONI_ANO for monitor use and the drain line MONI_D for monitor use.

Voltages may be applied to the anode line MONI_ANO for monitor use and the gate line MONI_G for monitor use, and the potentials of the drain line MONI_D for monitor use and the source line for monitor use are measured, so that the temperature can be determined from the potential of the drain line MONI_D for monitor use. Voltages may be applied to the anode line MONI_ANO for monitor use and the gate line MONI_G for monitor use, and the potentials of the drain line MONI_D for monitor use and the source line for monitor use are measured, so that Vgs of the transistor 556 and the voltage applied to the light-emitting element 572m can be determined from the potential of the source line MONI_S for monitor use.

The potential of the cathode line electrically connected to the other electrode of the light-emitting element 572m or the potential of video data are changed using the above-determined values, whereby correction can be performed. In the structure where the sensor circuit portions 508 are provided near four corners of the pixel portion 502 as shown in FIG. 36A, a correction method can be changed depending on the positions of the pixels.

The sensor circuit portion 508 can have a structure shown in FIG. 38B, for example. FIG. 38B is a schematic cross-sectional view illustrating the sensor circuit portion 508.

The sensor circuit portion 508 shown in FIG. 38B includes the transistor 556 and the resistor 558. The transistor 556 includes the following components: the conductive film 104 over the substrate 102; the insulating films 106 and 107 over the substrate 102 and the conductive film 104; the oxide semiconductor film 108 over the insulating film 107; the conductive film 112a electrically connected to the oxide semiconductor film 108; the conductive film 112b electrically connected to the oxide semiconductor film 108; the insulating films 114 and 116 over the oxide semiconductor film 108 and the conductive films 112a and 112b; and the oxide semiconductor film 120a over the insulating film 116.

The resistor 558 includes the following components: the insulating films 106 and 107 over the substrate 102; the conductive film 112b and the conductive film 112c over the insulating film 107; the insulating films 114 and 116 over the insulating film 107 and the conductive films 112b and 112c; the oxide semiconductor film 120c over the insulating film 116; and the insulating film 118 over the oxide semiconductor film 120c. The oxide semiconductor film 120c is electrically connected to the conductive film 112b through an opening 152a provided in the insulating films 114 and 116. The oxide semiconductor film 120c is electrically connected to the conductive film 112c through an opening 152d provided in the insulating films 114 and 116. The conductive film 112b serves as the other of the source electrode and the drain electrode of the transistor 556 and one of the pair of electrodes of the resistor 558. The conductive film 112c serves as the other of the pair of electrodes of the resistor 558. The conductive film 112c serves as the anode line MONI_ANO for monitor use.

Note that the transistor 556 has a function similar to that of the transistor 100 in Embodiment 1. Therefore, the components of the transistor 556 are denoted by the same reference numerals and the same hatching patterns as those of the transistor 100. Thus, the components of the transistor 556 can be formed using materials and the like that can be used for the transistor 100 in Embodiment 1. Note that the transistor 556 may have a structure similar to that of the transistor 150 in Embodiment 1.

The other of the pair of electrodes of the resistor 558 is formed by processing the same conductive film as that used for forming the conductive films functioning as the source electrode and the drain electrode of the transistor 556. The oxide semiconductor film 120c is formed by processing the same oxide semiconductor film as that used for forming the oxide semiconductor film 120a. Note that as described in Embodiment 1, the oxide semiconductor film 120a can be used as an oxide conductor (OC). Thus, the oxide semiconductor film 120c formed by processing the same oxide semiconductor film as that used for forming the oxide semiconductor film 120a can also be used as an oxide conductor (OC). Therefore, in the circuit diagram shown in FIG. 38A, a symbol "OC" is written beside the resistor 558.

The oxide semiconductor film 120c included in the resistor 558 is formed using a material and a method similar to those used for forming the oxide semiconductor film 120b. For example, indium gallium zinc oxide (IGZO), indium tin oxide (ITO), indium zinc oxide, or indium tin oxide to which silicon oxide is added (ITSO) can be used for the oxide semiconductor film 120c.

<4-4. Structure Example of Pixel Circuit>

Figure 36B:
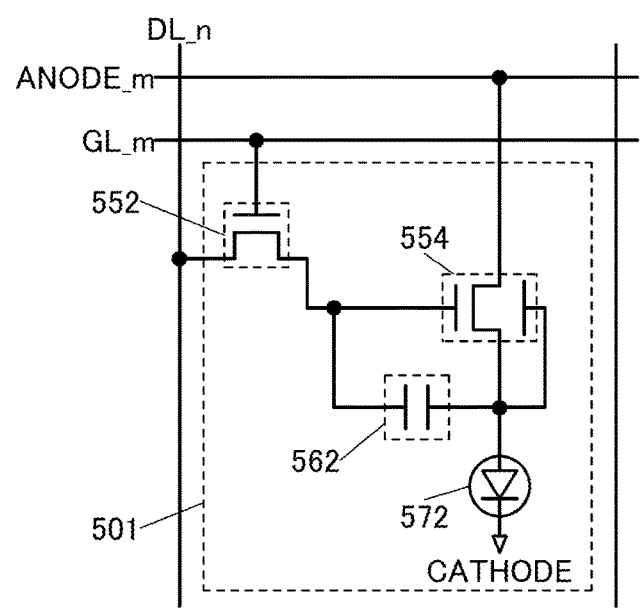

Each of the plurality of pixel circuits 501 in FIG. 36A can have a structure illustrated in FIG. 36B, for example.

The pixel circuit 501 illustrated in FIG. 36B includes transistors 552 and 554, a capacitor 562, and a light-emitting element 572. The transistor 100 or the transistor 150 described in Embodiment 1 can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to the other of the source electrode and the drain electrode of the transistor 552. The other of the pair of electrodes of the capacitor 562 is electrically connected to a second gate electrode (also referred to as a back gate electrode) of the transistor 554. The capacitor 562 functions as a storage capacitor for storing written data.

One of a source electrode and a drain electrode of the transistor 554 is electrically connected to an anode line (ANODE m).

One of an anode and a cathode of the light-emitting element 572 is electrically connected to the other of the source electrode and the drain electrode of the transistor 554, and the other of the anode and the cathode of the light-emitting element 572 is electrically connected to a cathode line (CATHODE). Note that the other of the pair of electrodes of the capacitor 562 is electrically connected to the one of the anode and the cathode of the light-emitting element 572.

As the light-emitting element 572, for example, an organic EL element can be used. Note that the light-emitting element 572 is not limited to an organic EL element; an inorganic EL element including an inorganic material may be used.

For example, in the display device including the pixel circuit 501 in FIG. 36B, the pixel circuits 501 are sequentially selected row by row by the gate driver 504a illustrated in FIG. 36A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structure including the light-emitting element 572 as a display element of the display device is described in this embodiment, one embodiment of the present invention is not limited to the structure and a variety of elements may be included in the display device.

Examples of the elements are an electroluminescent (EL) element (e.g., an EL element including organic and inorganic materials, an organic EL element, an inorganic EL element, an LED), a light-emitting transistor (a transistor which emits light by current), an electron emitter, a liquid crystal element, an electronic ink element, an electrophoretic element, an electrowetting element, a plasma display (PDP) element, a micro electro mechanical systems (MEMS) display element (e.g., a grating light valve (GLV), a digital micromirror device (DMD), a digital micro shutter (DMS) element, an interferometric modulator display (IMOD) element, and the like), or a piezoelectric ceramic display, which has a display media whose contrast, luminance, reflectivity, transmittance, or the like is changed by an electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

A progressive type display, an interlace type display, or the like can be employed as the display type of the display device. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

<4-5. Structure Example of Pixel of Display Device>

Figure 39A:
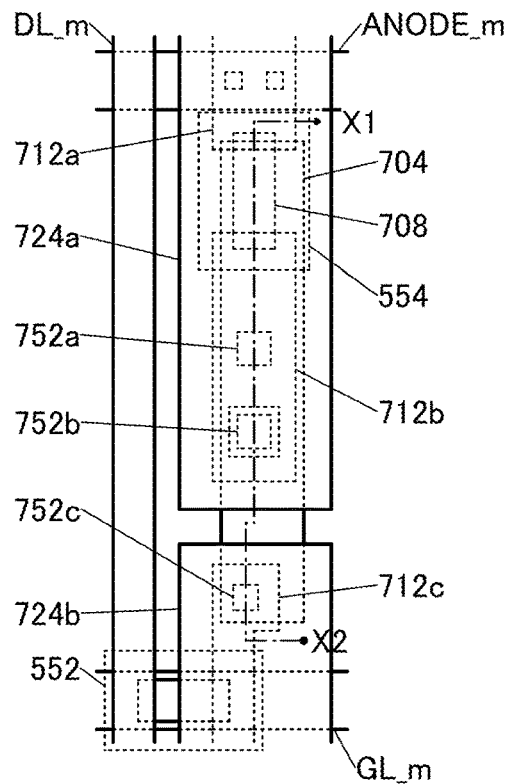
FIGS. 39A and 39B are a top view and a cross-sectional view illustrating a display device.
Figure 39B:
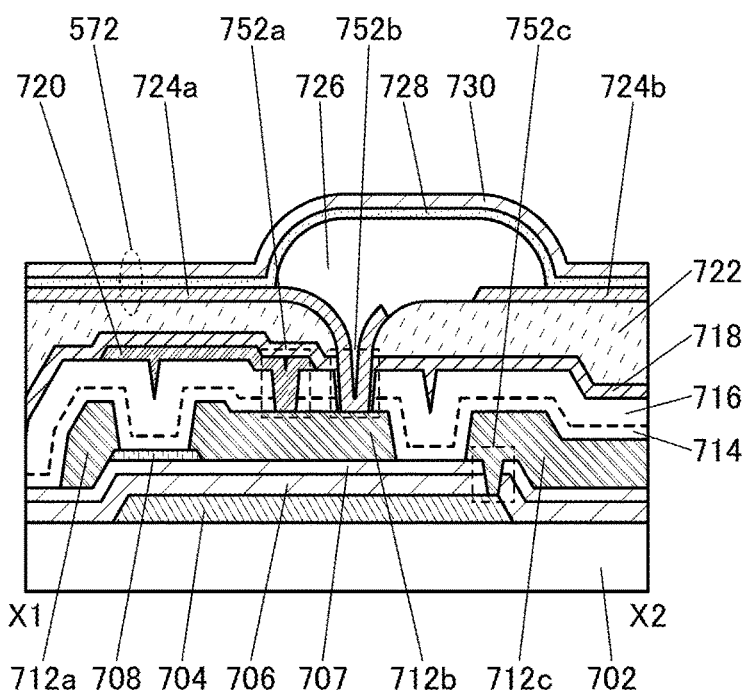

An example of a display device including the pixel circuit shown in FIG. 36B is described with reference to FIGS. 39A and 39B. FIG. 39A is a top view of a pixel portion of the display device, and FIG. 39B is a cross-sectional view taken along the dashed-dotted line X1-X2 in FIG. 39A. Note that in FIG. 39A, some components are not illustrated in order to avoid complexity of the drawing.

The display device shown in FIGS. 39A and 39B includes a conductive film 704 functioning as a first gate electrode over a substrate 702, insulating films 706 and 707 over the conductive film 704, an oxide semiconductor film 708 over the insulating film 707, conductive films 712a and 712b functioning as a source electrode and a drain electrode over the insulating film 707 and the oxide semiconductor film 708, a conductive film 712c over the insulating film 707, insulating films 714 and 716 covering the oxide semiconductor film 708 and the conductive films 712a, 712b, and 712c, an oxide semiconductor film 720 functioning as a second gate electrode over the insulating film 716, an insulating film 718 over the insulating film 716 and the oxide semiconductor film 720, an insulating film 722 functioning as a planarization insulating film over the insulating film 718, conductive films 724a and 724b functioning as pixel electrodes over the insulating film 722, a structure body 726 having a function of suppressing electrical connection between the conductive film 724a and the conductive film 724b, an EL layer 728 over the conductive films 724a and 724b and the structure body 726, and a conductive film 730 over the EL layer 728.

The conductive film 712c is electrically connected to the conductive film 704 through an opening 752c provided in the insulating films 706 and 707. The oxide semiconductor film 720 functioning as a second gate electrode is electrically connected to the conductive film 712b through an opening 752a provided in the insulating films 714 and 716. The conductive film 724a is electrically connected to the conductive film 712b through an opening 752b provided in the insulating films 714, 716, 718, and 722.

The conductive film 724a functioning as the pixel electrode, the EL layer 728, and the conductive film 730 form the light-emitting element 572. Note that the EL layer 728 can be formed by any of the following methods: a sputtering method, an evaporation method (including a vacuum evaporation method), a printing method (such as relief printing, intaglio printing, gravure printing, planography printing, and stencil printing), an ink jet method, a coating method, and the like.

When a structure including two transistors and one capacitor as shown in FIG. 36B and FIGS. 39A and 39B is used as a structure of a pixel of the display device, the number of wirings can be reduced. For example, the pixel shown in FIG. 36B and FIG. 39A includes three wirings, i.e., a gate line, a data line, and an anode line. A pixel with such a structure in the display device can have a high aperture ratio. Moreover, by reducing the number of wirings, a short circuit between adjacent wirings is unlikely to occur, for example. Thus, display devices can be provided with high yield.

Note that the structure described in this embodiment can be used in appropriate combination with any of the structures described in the other embodiments.

Embodiment 5

In this embodiment, a display device including the semiconductor device of one embodiment of the present invention and an electronic device in which the display device is provided with an input device will be described with reference to FIGS. 40A and 40B, FIGS. 41A to 41C, FIGS. 42A to 42C, FIGS. 43A and 43B, FIG. 44, FIG. 45, FIGS. 46A and 46B, and FIG. 47.

<5-1. Touch Panel>

In this embodiment, a touch panel 2000 including a display device and an input device will be described as an example of an electronic device. In addition, an example in which a touch sensor is used as an input device will be described.

Figure 40A:
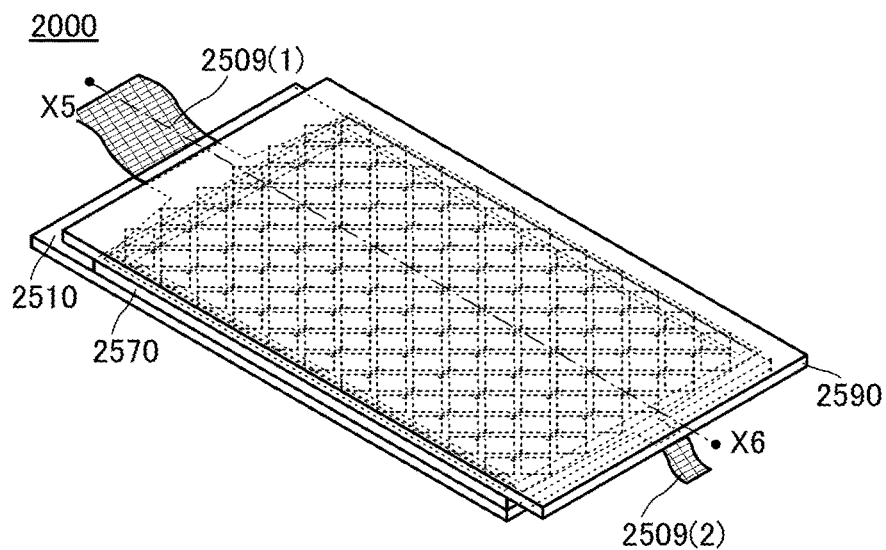
FIGS. 40A and 40B are perspective views illustrating an example of a touch panel.
Figure 40B:
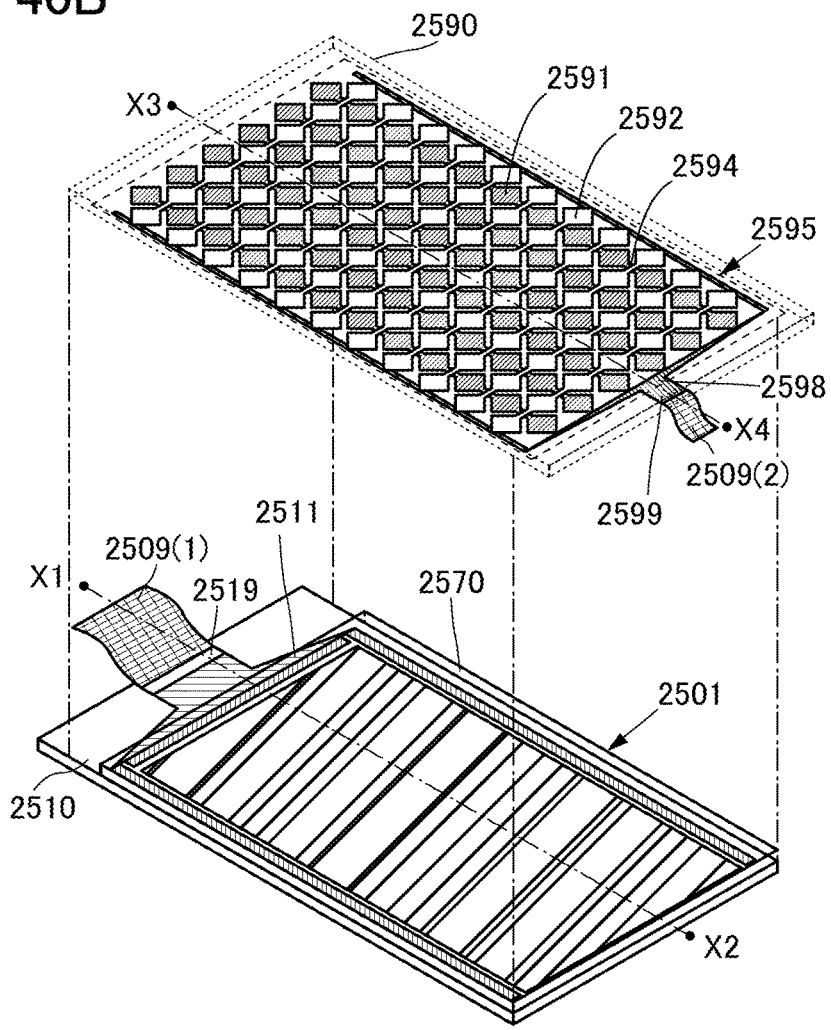

FIGS. 40A and 40B are perspective views of the touch panel 2000. Note that FIGS. 40A and 40B illustrate only main components of the touch panel 2000 for simplicity.

The touch panel 2000 includes a display device 2501 and a touch sensor 2595 (see FIG. 40B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to an outer edge of the substrate 2510, and a wiring 2519 is formed over the wiring 2511. The wiring 2519 is electrically connected to an FPC 2509(1).

Figure 41A:
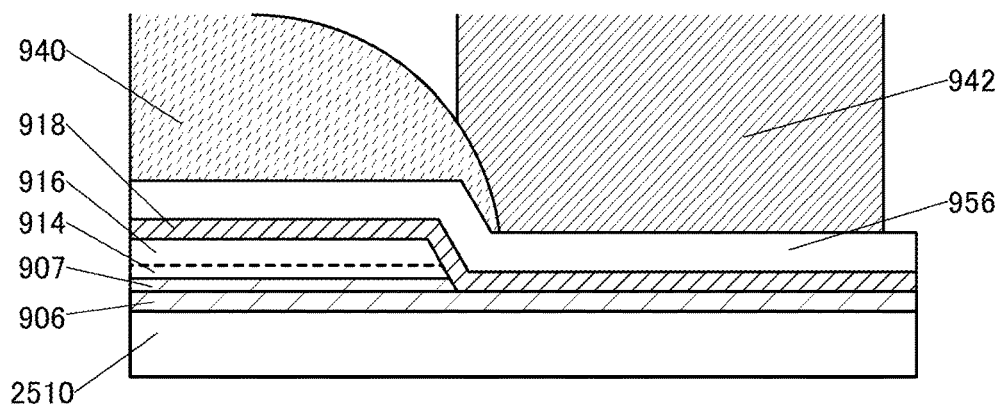
FIGS. 41A to 41C are schematic cross-sectional views illustrating examples of an outer edge and a terminal portion of a display device.
Figure 41B:
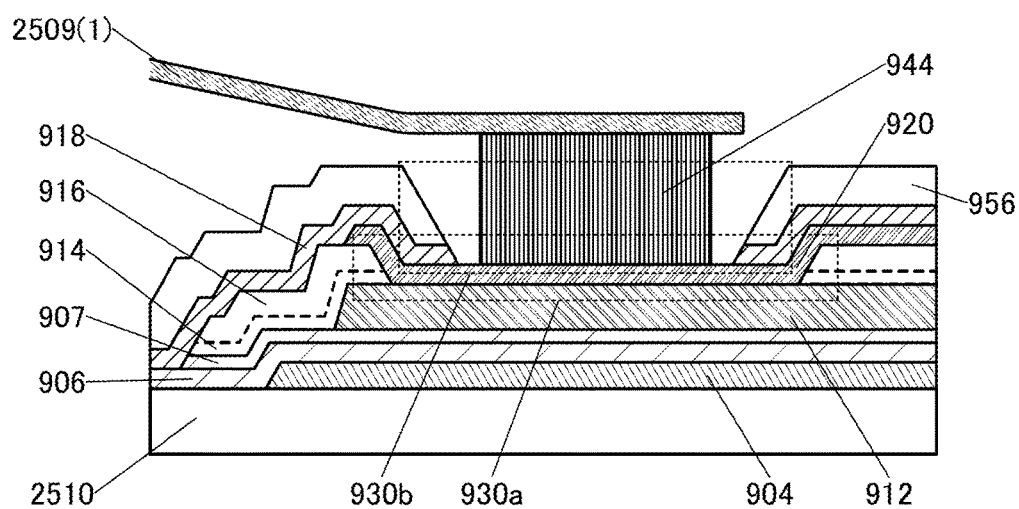
Figure 41C:
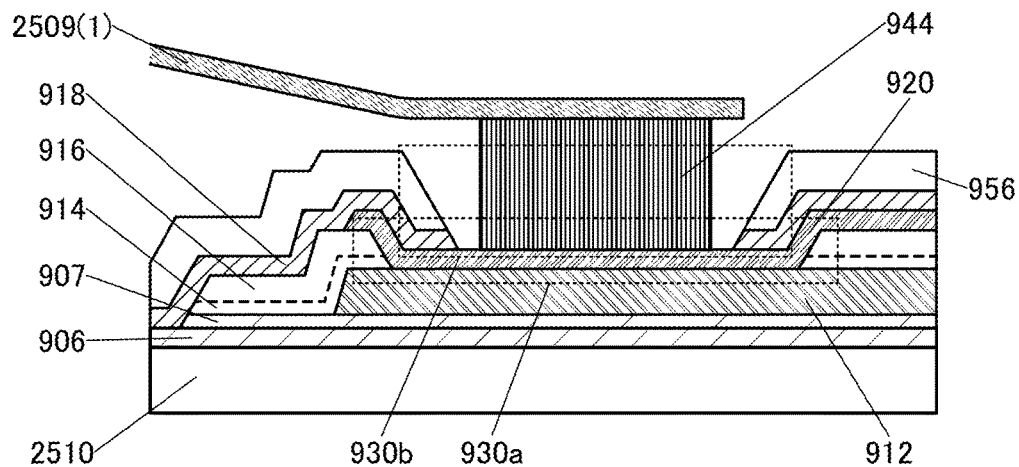
Figure 42A:
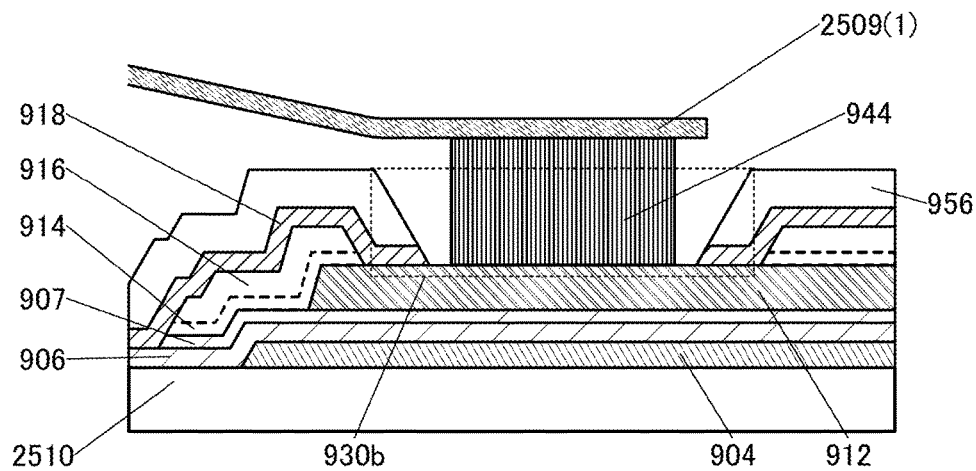
FIGS. 42A to 42C are schematic cross-sectional views illustrating examples of a terminal portion of a display device.
Figure 42B:
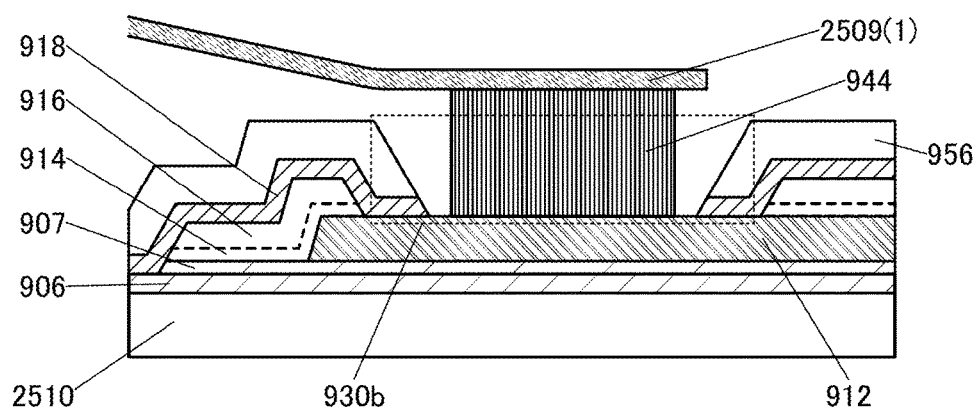
Figure 42C:
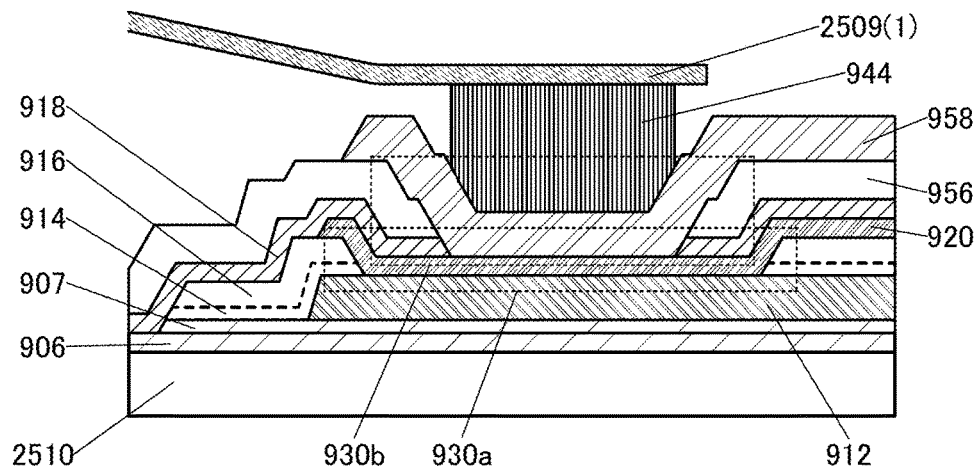

Structure examples of an outer edge of the substrate 2510 and a terminal portion of the display device 2501 are described with reference to FIGS. 41A to 41C and FIGS. 42A to 42C. FIG. 41A is a cross-sectional view illustrating an example of the outer edge of the substrate. FIGS. 41B and 41C are cross-sectional views illustrating examples of the terminal portion. FIGS. 42A to 42C are cross-sectional views illustrating examples of the terminal portion.

The structure shown in FIG. 41A includes the following components: an insulating film 906 over the substrate 2510; an insulating film 907 over the insulating film 906; insulating films 914 and 916 over the insulating film 907; an insulating film 918 over the insulating film 906 and the insulating film 916; an insulating film 956 over the insulating film 918; an insulating film 940 over the insulating film 956; and a sealing material 942 over the insulating film 956 and the insulating film 940.

The insulating films 906, 907, 914, 916, 918, and 956 can be formed using materials and methods similar to those for forming the insulating films 106, 107, 114, 116, 118, and 156 in Embodiment 1, respectively.

For the insulating film 940, an organic insulating material such as an acrylic-based resin can be used. Moreover, the insulating film 940 can planarize unevenness and the like due to the transistor and the like. For example, an epoxy-based resin or a glass frit is preferably used as the sealing material 942. As a material used for the sealing material, a material which is impermeable to moisture or oxygen is preferably used.

The structure of the outer edge of the substrate shown in FIG. 41A can suppress entry of impurities such as moisture from outside because the insulating film 906 and the insulating film 918 are in contact with each other.

The structure shown in FIG. 41B includes the following components: a conductive film 904 over the substrate 2510; the insulating film 906 over the substrate 2510 and the conductive film 904; the insulating film 907 over the insulating film 906; a conductive film 912 over the insulating film 907; the insulating films 914 and 916 over the conductive film 912; the oxide semiconductor film 920 over the insulating film 916 and the conductive film 912; the insulating film 918 over the insulating films 906 and 916 and the oxide semiconductor film 920; and the insulating film 956 over the insulating film 918. An opening 930a that reaches the oxide semiconductor film 920 is formed in the insulating films 914 and 916. An opening 930b that reaches the oxide semiconductor film 920 is formed in the insulating films 918 and 956. The oxide semiconductor film 920 is electrically connected to the FPC 2509(1) through an anisotropic conductive film 944.

The conductive films 904 and 912 and the oxide semiconductor film 920 can be formed using materials and methods similar to those used for forming the conductive films 104 and 112 and the oxide semiconductor film 120 in Embodiment 1, respectively.

In the structure shown in FIG. 41B, the conductive film 904 is provided over the substrate 2510, but one embodiment of the present invention is not limited thereto. For example, a structure in which the conductive film 904 is not provided over the substrate 2510 as shown in FIG. 41C may be used.

In the structures shown in FIGS. 41B and 41C, the oxide semiconductor film 920 is provided over the conductive film 912, but one embodiment of the present invention is not limited thereto. For example, a structure in which the oxide semiconductor film 920 is not provided over the conductive film 912 as shown in FIG. 42A may be used. Alternatively, a structure in which the conductive film 904 and the oxide semiconductor film 920 are not provided as shown in FIG. 42B may be used. Further alternatively, a structure in which a conductive film 958 covering the opening 930b is provided as shown in FIG. 42C may be used. In the case of using the structure shown in FIG. 42C, the anisotropic conductive film 944 is electrically connected to the conductive film 912 through the conductive film 958 and the oxide semiconductor film 920.

Note that the oxide semiconductor film 920 is preferably provided in a region connected to the anisotropic conductive film 944 as shown in FIGS. 41B and 41C. The structure including the oxide semiconductor film 920 can achieve close contact between the terminal portion and the anisotropic conductive film 944.

The substrate 2590 includes the touch sensor 2595 and a plurality of wirings 2598 electrically connected to the touch sensor 2595. The plurality of wirings 2598 are led to an outer edge of the substrate 2590, and parts of the plurality of wirings 2598 form a terminal. The terminal is electrically connected to an FPC 2509(2). Note that in FIG. 40B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 40B is an example of using a projected capacitive touch sensor.

Note that a variety of sensors that can sense approach or contact of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 40A and 40B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<5-2. Display Device>

Figure 43A:
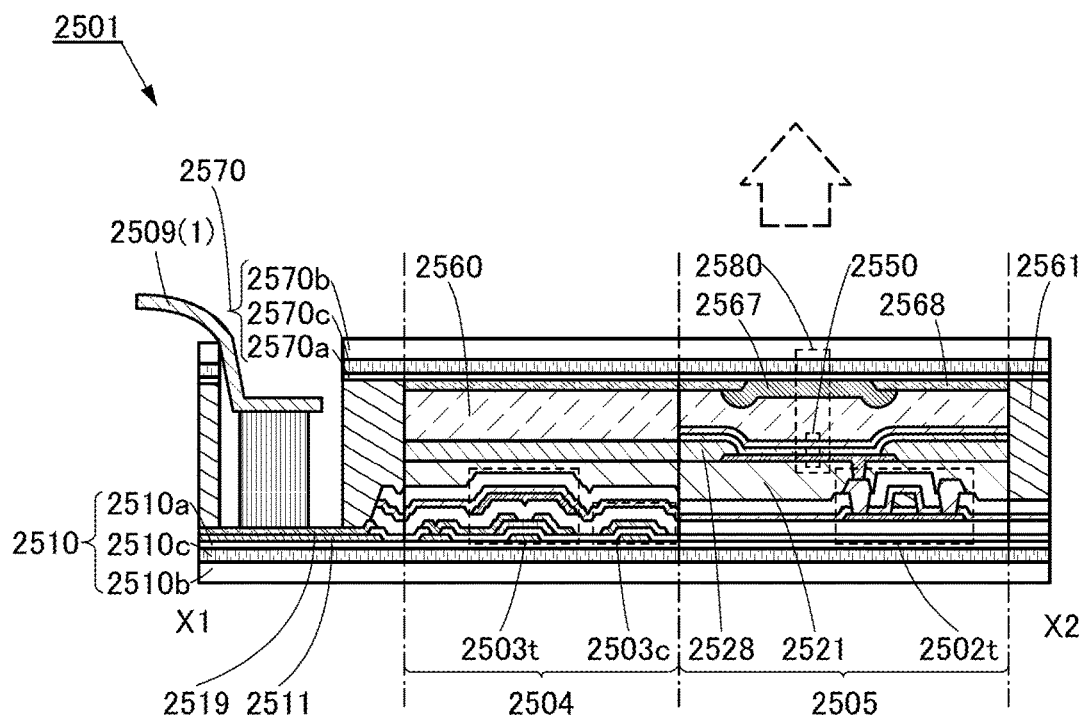
FIGS. 43A and 43B are cross-sectional views showing examples of the display device.
Figure 43B:
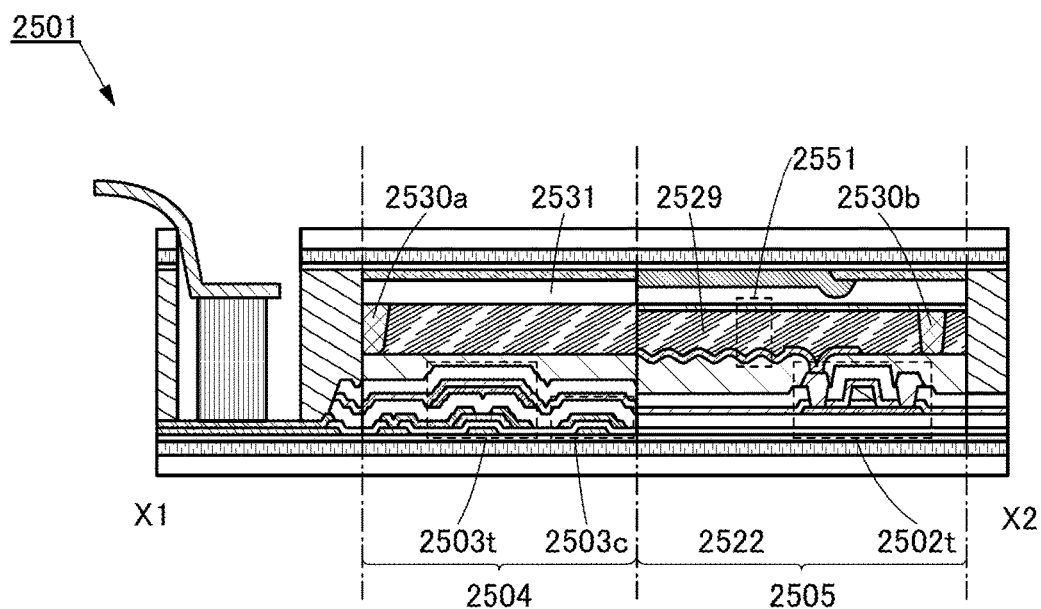

Next, the display device 2501 will be described in detail with reference to FIGS. 43A and 43B. FIGS. 43A and 43B correspond to cross-sectional views taken along the dashed-dotted line X1-X2 in FIG. 40B.

The display device 2501 includes a plurality of pixels arranged in a matrix. Each of the pixels includes a display element and a pixel circuit for driving the display element.

[Structure with EL Element as Display Element]

First, a structure that uses an EL element as a display element will be described below with reference to FIG. 43A.

In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, an acrylic resin, polyurethane, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 43A, the sealing layer 2560 can also serve as an optical element.

A sealant 2561 may be formed in the peripheral portion of the sealing layer 2560. With the use of the sealant 2561, an EL element 2550 can be provided in a region surrounded by the substrate 2510, the substrate 2570, the sealing layer 2560, and the sealant 2561. Note that an inert gas (such as nitrogen or argon) may be used instead of the sealing layer 2560. A drying agent may be provided in the inert gas so as to adsorb moisture or the like.

The display device 2501 illustrated in FIG. 43A includes a pixel 2505. The pixel 2505 includes a light-emitting module 2580, the EL element 2550 and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 43A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The wiring 2519 is provided over the wirings 2511. The FPC 2509(1) is electrically connected to the wiring 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and has high crystallinity. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. Note that the detail of the refresh operation will be described later.

In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

[Structure with Liquid Crystal Element as Display Element]

Next, a structure including a liquid crystal element as a display element is described below with reference to FIG. 43B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 43B has the same structure as the display device 2501 illustrated in FIG. 43A except for the following points.

The pixel 2505 in the display device 2501 illustrated in FIG. 43B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 43B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and does not require the alignment process. In addition, the liquid crystal element including the liquid crystal composition which includes liquid crystal exhibiting a blue phase has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 43B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 has a function of a reflective electrode. The display device 2501 illustrated in FIG. 43B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 43B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<5-3. Touch Sensor>

Figure 44:
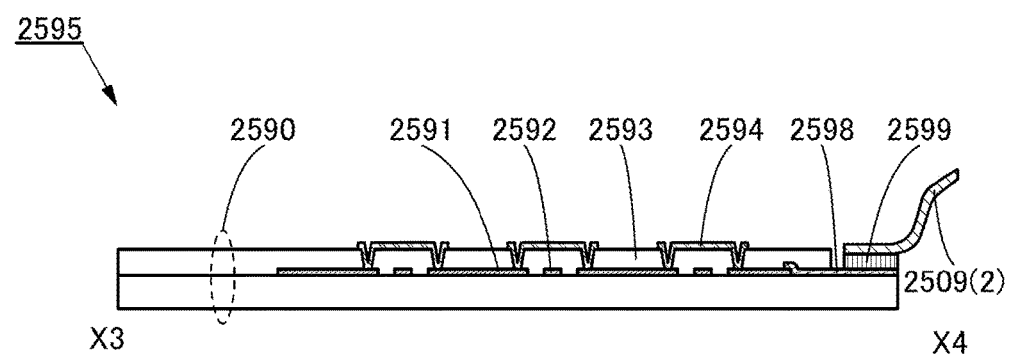
FIG. 44 is a cross-sectional view showing an example of a touch sensor.

Next, the touch sensor 2595 will be described in detail with reference to FIG. 44. FIG. 44 corresponds to a cross-sectional view taken along the dashed-dotted line X3-X4 in FIG. 40B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<5-4. Touch Panel>

Figure 45:
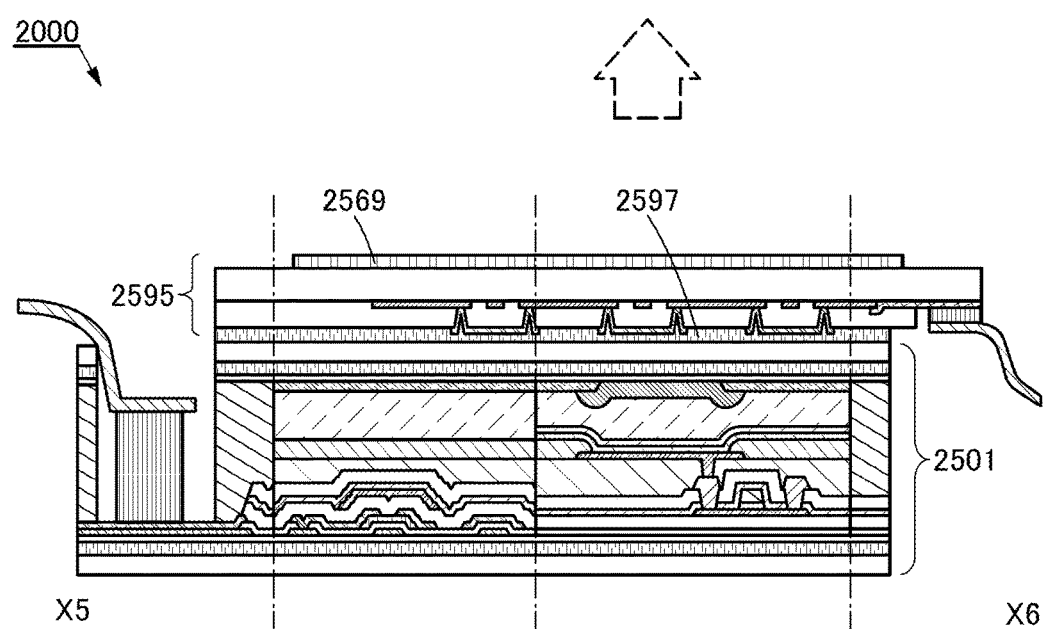
FIG. 45 is a cross-sectional view showing an example of a touch panel.

Next, the touch panel 2000 will be described in detail with reference to FIG. 45. FIG. 45 corresponds to a cross-sectional view taken along the dashed-dotted line X5-X6 in FIG. 40A.

In the touch panel 2000 illustrated in FIG. 45, the display device 2501 described with reference to FIG. 43A and the touch sensor 2595 described with reference to FIG. 44 are attached to each other.

The touch panel 2000 illustrated in FIG. 45 includes an adhesive layer 2597 and an anti-reflective layer 2569 in addition to the components described with reference to FIG. 43A and FIG. 44.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic-based resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

<5-5. Driving Method of Touch Panel>

Next, an example of a method for driving a touch panel will be described with reference to FIGS. 46A and 46B.

Figure 46A:
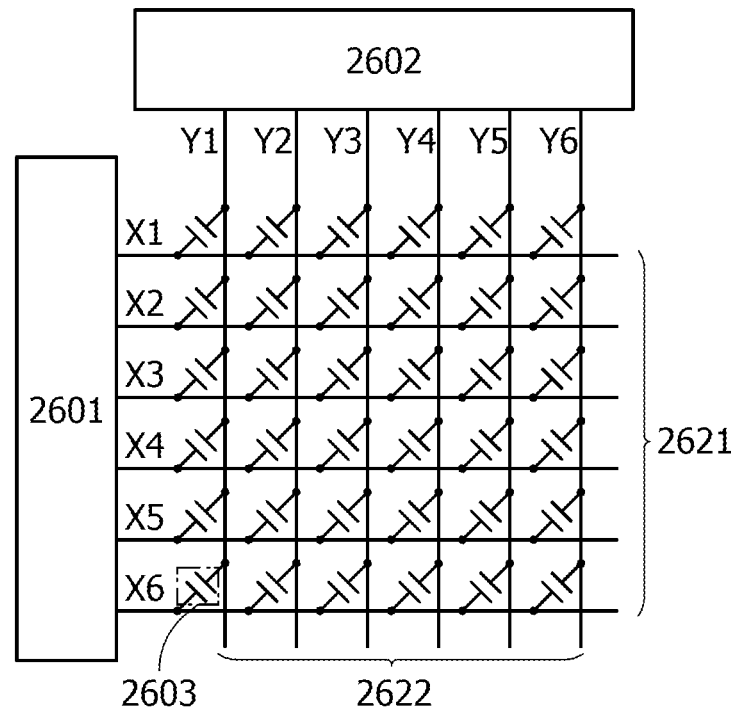
FIGS. 46A and 46B are a block diagram and a timing chart of a touch sensor.

FIG. 46A is a block diagram illustrating the structure of a mutual capacitive touch sensor. FIG. 46A illustrates a pulse voltage output circuit 2601 and a current sensing circuit 2602. Note that in FIG. 46A, six wirings X1 to X6 represent the electrodes 2621 to which a pulse voltage is applied, and six wirings Y1 to Y6 represent the electrodes 2622 that detect changes in current. FIG. 46A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 46B:
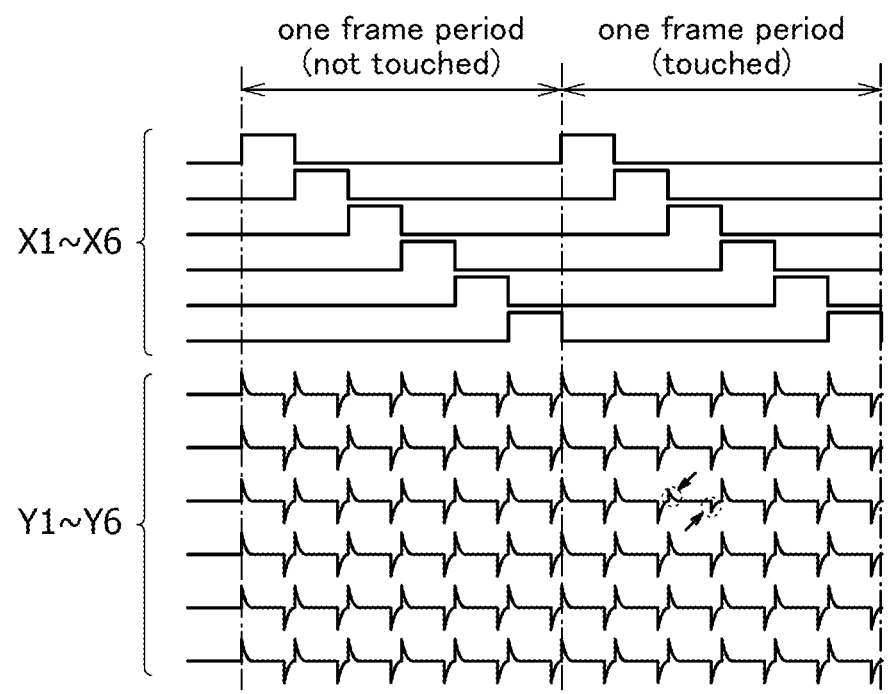

FIG. 46B is a timing chart showing input and output waveforms in the mutual capacitive touch sensor illustrated in FIG. 46A. In FIG. 46B, sensing of a sensing target is performed in all the rows and columns in one frame period. FIG. 46B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<5-6. Sensor Circuit>

Figure 47:
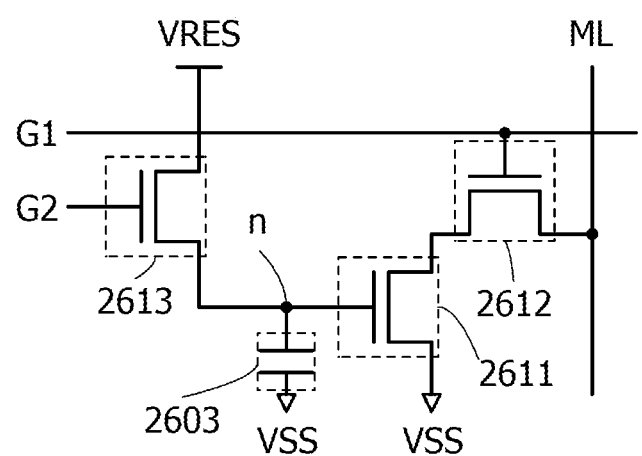
FIG. 47 is a circuit diagram of a touch sensor.

Although FIG. 46A illustrates a passive type touch sensor in which only the capacitor 2603 is provided at the intersection of wirings as a touch sensor, an active type touch sensor including a transistor and a capacitor may be used. FIG. 47 illustrates an example of a sensor circuit included in an active type touch sensor.

The sensor circuit in FIG. 47 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 47 will be described. First, a potential for turning on the transistor 2613 is supplied as the signal G2, and a potential with respect to the voltage VRES is thus applied to a node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

Note that the structure described in this embodiment can be used in appropriate combination with any of the structures described in the other embodiments.

Embodiment 6

In this embodiment, a display device using a horizontal electric field mode liquid crystal element as a display element is described with reference to FIG. 48.

FIG. 48 shows flow charts illustrating manufacturing processes of display devices using horizontal electric field mode liquid crystal elements. In FIG. 48, examples of manufacturing processes in the cases of using an oxide semiconductor (in particular, CAAC-OS), using low-temperature poly-silicon (LTPS), and using hydrogenated amorphous silicon (a-Si:H) as active layers of transistors are shown.

<6-1. CAAC-OS>

The case of using CAAC-OS in the transistor is described. First, a gate electrode (GE: gate electrode) is formed with a sputtering apparatus (SP). Note that one mask is used when the gate electrode is processed.

Then, a gate insulating film (GI: gate insulator) is formed over the gate electrode with a PECVD apparatus. After that, an oxide semiconductor (OS) film to be the active layer is formed over the gate insulating film with a sputtering apparatus. Note that one mask is used when the oxide semiconductor film is processed into an island shape.

Then, parts of the gate insulating film are processed to form openings that reach the gate electrode. Note that one mask is used when the openings are formed.

Then, a conductive film is formed over the gate insulating film and the oxide semiconductor film with a sputtering apparatus, and the conductive film is processed to form a source electrode and a drain electrode (S/D electrodes). Note that one mask is used when the source electrode and the drain electrode are formed.

After that, a passivation film is formed over the oxide semiconductor film, the source electrode, and the drain electrode with a PECVD apparatus.

Then, a part of the passivation film is processed to form an opening that reaches the source electrode or the drain electrode. Note that one mask is used when the opening is formed (contact opening formation).

Then, a conductive film is formed over the passivation film with a sputtering apparatus to cover an inner wall of the opening formed in the passivation film, and the conductive film is processed to form a common electrode. Note that one mask is used when the common electrode is formed.

Then, an insulating film is formed over the passivation film and the common electrode with a PECVD apparatus. After that, an opening that reaches the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using CAAC-OS, a total of eight masks are used for manufacturing the horizontal electric field mode liquid crystal display device.

<6-2. LTPS>

The case of using LTPS in the transistor is described. First, a light-blocking film is formed with a sputtering apparatus. Note that one mask is used when the light-blocking film is processed.

Then, a base insulating film is formed over the light-blocking film with a PECVD apparatus. After that, a Si film to be the active layer is formed over the base insulating film with a PECVD apparatus, followed by excimer laser annealing (ELA) for crystallization of the Si film. Owing to the ELA process, the Si film for the active layer becomes a poly-silicon (p-Si) film. Note that large equipment is required to perform ELA on a large area. Linear irregularities and the like peculiar to ELA occur in some cases.

Then, the p-Si film is processed into an island shape. Note that one mask is used when the p-Si film is processed into an island shape (p-Si island formation).

Then, a gate insulating film (GI) is formed over the p-Si film with a PECVD apparatus, followed by the formation of a gate electrode (GE) over the gate insulating film with a sputtering apparatus. Note that one mask is used when the gate electrode is formed. A part of the gate insulating film is removed when the gate electrode is formed.

After that, impurity implantation is performed with an ion doping (ID) apparatus to form $n^+$ regions in the p-Si film. Note that one mask is used when the $n^+$ regions are formed. Then, impurity implantation is performed with an ion doping apparatus to form $n^-$ regions in the p-Si film. Note that when the $n^-$ regions are formed, a mask is not used and doping is performed on an entire surface. Then, impurity implantation is performed with an ion doping apparatus to form $p^+$ regions in the p-Si film. Note that one mask is used to form the $p^+$ regions.

After that, thermal activation is performed. An annealing furnace, an RTA apparatus, or the like can be used for the thermal activation.

Then, an interlayer insulating film is formed over the p-Si film and the gate electrode with a PECVD apparatus. After that, parts of the interlayer insulating film and parts of the gate insulating film are processed to form openings that reach the $n^+$ regions and the $p^+$ regions. Note that one mask is used when the openings are formed (contact opening formation in GI & interlayer insulating film).

Then, a conductive film is formed with a sputtering apparatus over the interlayer insulating film in which the openings are formed, and the conductive film is processed to form a source electrode and a drain electrode (S/D electrodes). Note that one mask is used when the source electrode and the drain electrode are formed.

After that, a planarization insulating film is formed over the source electrode and the drain electrode with a coater apparatus. As the planarization insulating film, an organic resin film may be used, for example. Note that an opening that reaches the source electrode or the drain electrode is formed in the planarization insulating film, and one mask is used when the opening is formed.

Then, a conductive film is formed over the planarization insulating film with a sputtering apparatus, followed by the formation of a common electrode over the conductive film. Note that one mask is used when the common electrode is formed.

Then, an insulating film is formed over the common electrode with a PECVD apparatus. After that, an opening that reaches the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using LTPS, a total of eleven masks are used for manufacturing the horizontal electric field mode liquid crystal display device.

<6-3. a-Si:H>

The case of using a-Si:H in the transistor is described. First, a gate electrode (GE) is formed with a sputtering apparatus. Note that one mask is used when the gate electrode is processed.

Then, a gate insulating film (GI) is formed over the gate electrode with a PECVD apparatus. After that, a silicon film to be the active layer is formed over the gate insulating film with a PECVD apparatus. Note that one mask is used when the silicon film is processed into an island shape.

Then, a part of the gate insulating film is processed to form an opening that reaches the gate electrode. Note that one mask is used when the opening is formed (contact opening formation).

Then, a conductive film is formed over the gate insulating film and the silicon film with a sputtering apparatus, and the conductive film is processed to form a source electrode and a drain electrode (S/D electrodes). Note that one mask is used when the source electrode and the drain electrode are formed.

Then, a conductive film is formed over the source electrode and the drain electrode with a sputtering apparatus, and the conductive film is processed to form a common electrode. Note that one mask is used when the common electrode is formed.

Then, an insulating film is formed over the common electrode with a PECVD apparatus. After that, an opening that reaches the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using a-Si:H, a total of seven masks are used for manufacturing the horizontal electric field mode liquid crystal display device.

Note that in each of the flow charts of the CAAC-OS, the LTPS, and the a-Si:H, steps of forming the common electrode, forming the insulating film over the common electrode, and forming the pixel electrode are peculiar to the manufacturing process of the horizontal electric field mode liquid crystal display device. Therefore, a process different from that of the horizontal electric field mode liquid crystal display device is used in the case of manufacturing a liquid crystal display device using a vertical electric field mode (e.g., VA mode) liquid crystal element or in the case of using an organic EL element as a display element.

As shown in FIG. 48, in the case of using a CAAC-OS in the transistor for the horizontal electric field mode liquid crystal element, the transistor can be manufactured by a simpler process than that in the case of using LTPS. Moreover, the transistor using a CAAC-OS can be manufactured with masks the number of which is almost equivalent to the number of masks for manufacturing the transistor using a-Si:H.

Characteristics of each of the processes are summarized in Table 1.

TABLE 1

|  | CAAC-OS | | LTPS | | a-Si: H | |
| --- | --- | --- | --- | --- | --- | --- |
|  | TN, VA | Horizontal electric field | TN, VA | Horizontal electric field | TN, VA | Horizontal electric field |
| The total number of masks | 6-7 | 6-8 | 9 | 11 | 4-5 | 7 or less |
| The number of masks for forming FET | (5) | | (6) | | (4) | |
| Maximum process temperature | 350° C. or less | | 400° C. or more | | 350° C. or less | |
| Gate driver | Possible | | Possible | | Possible | |
| Mobility [cm$^2$/Vs] | 40 or less | | 100 or less | | 1 or less | |
| on/off ratio | 20 or less | | 9 or less | | 7 or less | |
| Device cost | Low | | High | | Low | |
| Plant cost | Low | | High | | Low | |

Note that in Table 1, "The total number of masks" is the sum of the number of masks due to the process for forming the electrodes of the liquid crystal element and the number of masks due to the FET process. "The number of masks for forming FET" is the number of masks due to the FET process. As shown in Table 1, in the case of using CAAC-OS, the number of masks is almost equivalent to that in the case of using a-Si:H, and the electrical characteristics such as the field-effect mobility (or simply referred to as mobility) and the on/off ratio are superior to those in the case of using a-Si:H. Thus, using CAAC-OS achieves a display device having high display quality. Moreover, as shown in Table 1, the maximum process temperature, the device cost, and the plant cost for CAAC-OS are lower than those of LTPS. Accordingly, the manufacturing cost for the display device can be reduced.

As compared to a transistor using silicon, a transistor using an oxide semiconductor typified by CAAC-OS achieves advantageous effects such as a low off-state current, no or very few short-channel effects, a high withstand voltage, and a small change in temperature characteristics. In addition, a transistor using an oxide semiconductor can operate at a high speed because of having a switching speed or frequency characteristics comparable to those of a transistor using silicon. Thus, a display device including a transistor using an oxide semiconductor can have high display quality and high reliability.

Note that the structure described in this embodiment can be used in appropriate combination with any of the other embodiments.

Embodiment 7

In this embodiment, a display device including a semiconductor device of one embodiment of the present invention and a method for driving the display device are described with reference to FIGS. 49A and 49B, FIGS. 50A and 50B, FIGS. 51A to 51E, and FIGS. 52A to 52E.

Note that the display device of one embodiment of the present invention may include an information processing unit, an arithmetic unit, a memory unit, a display unit, an input unit, and the like.

In the case where the display device of one embodiment of the present invention continuously displays the same image (still image), power consumption can be reduced by reducing the number of times of writing signals (also referred to as "refresh") for the same image. Note that the rate at which the refresh is performed is referred to as refresh rate (also referred to as scan frequency or vertical synchronization frequency). The display device that reduces eye strain by reducing the refresh rate is described below.

The eye strain is divided into two categories: nerve strain and muscle strain. The nerve strain is caused by prolonged looking at light emitted from a display device or blinking images. This is because the brightness stimulates and fatigues a retina, optic nerves, and a brain. The muscle strain is caused by overuse of a ciliary muscle which works for adjusting the focus.

Figure 49A:
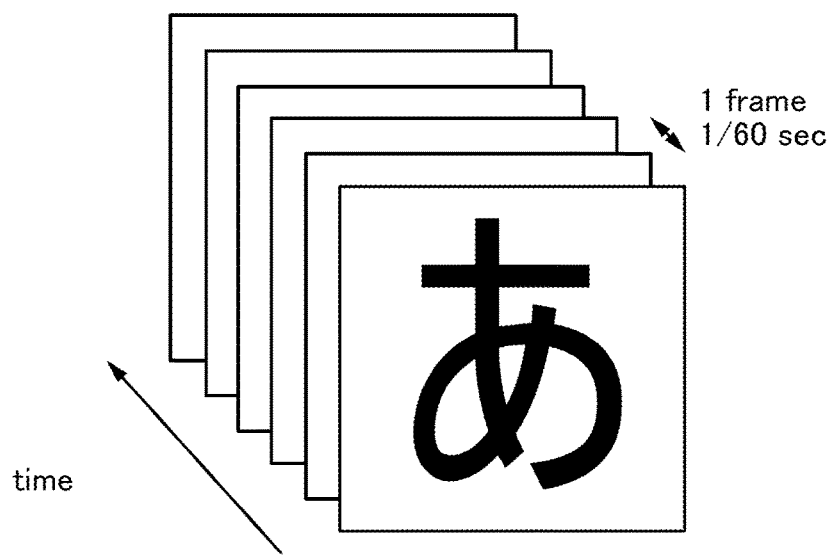
FIGS. 49A and 49B illustrate display of an image on a display device of one embodiment of the present invention.

FIG. 49A is a schematic diagram showing display on a conventional display device. As illustrated in FIG. 49A, for the display of the conventional display device, image rewriting is performed 60 times every second. A prolonged looking at such a screen might stimulate a retina, optic nerves, and a brain of a user and lead to eye strain.

In a display device of one embodiment of the present invention, a transistor using an oxide semiconductor, for example, a transistor using CAAC-OS is used in a pixel portion of the display device. The off-state current of the transistor is extremely low. Therefore, the luminance of the display device can be kept even when the refresh rate of the display device is lowered.

Figure 49B:
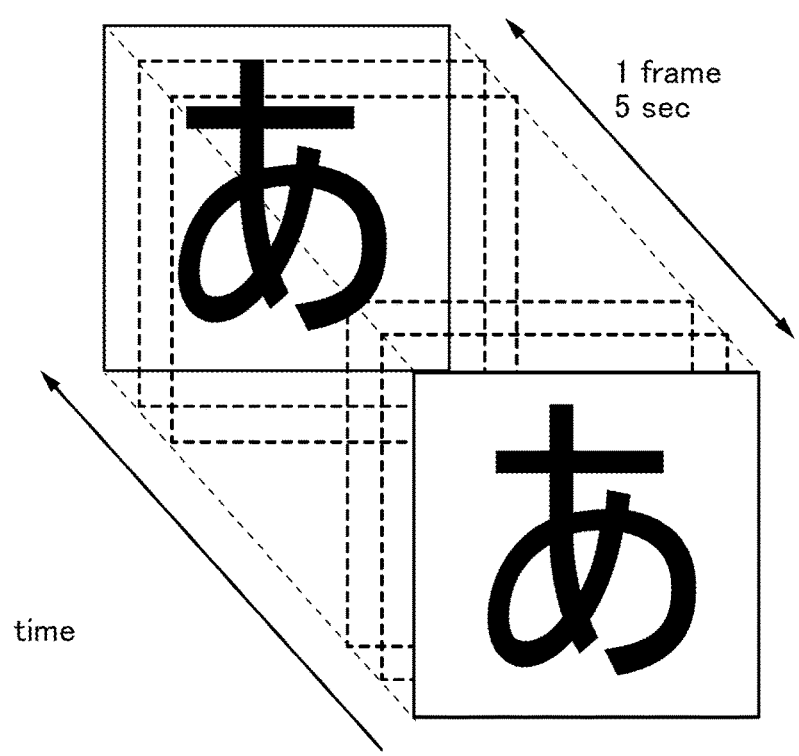

Thus, for example, the number of times of image writing can be reduced to once every five seconds as illustrated in FIG. 49B. The same image can be displayed for as long as possible and flickers on a screen perceived by a user can be reduced. Consequently, a stimulus to the retina or the nerve of an eye or the brain of the user is relieved, resulting in less nervous fatigue.

Figure 50A:
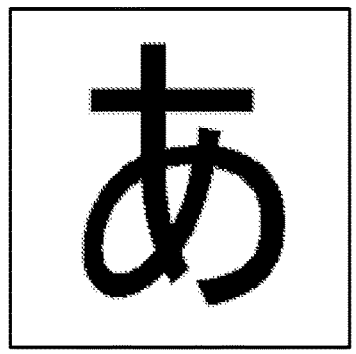
FIGS. 50A and 50B illustrate display of an image on a display device of one embodiment of the present invention.

In the case where the size of one pixel is large (e.g., the resolution is less than 150 ppi), a blurred character is displayed by a display device as shown in FIG. 50A. When users look at the blurred character displayed on the display device for a long time, their ciliary muscles keep working to adjust the focus in a state where adjusting the focus is difficult, which might lead to eye strain.

Figure 50B:
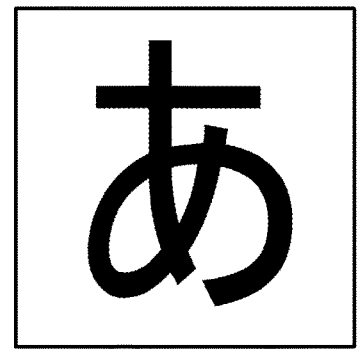

In contrast, the display device of one embodiment of the present invention has a small-size pixel and thus can display high-resolution images, so that a precise and smooth image can be displayed as shown in FIG. 50B. In this case, the ciliary muscle can easily focus the eye on the character, so that the user's muscular fatigue is reduced. When the resolution of the display device is 150 ppi or more, preferably 200 ppi or more, more preferably 300 ppi or more, the user's muscular fatigue can be effectively reduced.

Methods for quantifying eye fatigue have been studied. For example, critical flicker (fusion) frequency (CFF) is known as an indicator for evaluating nervous fatigue. Further, focus adjustment time, near point distance, and the like are known as indicators for evaluating muscular fatigue.

Other methods for evaluating eye fatigue include electroencephalography, thermography, counting the number of times of blinking, measuring the amount of tears, measuring the speed of contractile response of the pupil, and questionnaires for surveying subjective symptoms.

The method for driving the display device of one embodiment of the present invention can be evaluated by any of the variety of methods above, for example.

<7. Method for Driving Display Device>

Now, a method for driving the display device of one embodiment of the present invention is described with reference to FIGS. 51A to 51E.

[Display Example of Image Information]

An example of displaying two images including different image data by being transferred is described below.

Figure 51A:
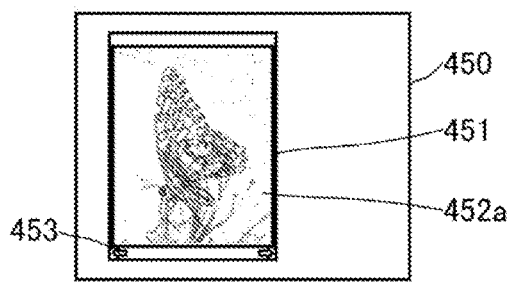
FIGS. 51A to 51E illustrate an example of a method for displaying images on a display device according to Embodiment.

FIG. 51A illustrates an example in which a window 451 and a first image 452*a* which is a still image displayed in the window 451 are displayed on a display portion 450.

At this time, display is preferably performed at a first refresh rate. Note that the first refresh rate can be higher than or equal to $1.16 \times 10^{-5}$ Hz (about once per day) and lower than or equal to 1 Hz, higher than or equal to $2.78 \times 10^{-4}$ Hz (about once per hour) and lower than or equal to 0.5 Hz, or higher than or equal to $1.67 \times 10^{-2}$ Hz (about once per hour) and lower than or equal to 0.1 Hz.

When frequency of rewriting an image is reduced by setting the first refresh rate to an extremely low value, display substantially without flicker can be achieved, and eye fatigue of a user can be effectively reduced.

The window 451 is displayed by, for example, executing application software for image display and includes a display region where an image is displayed.

Further, in a lower part of the window 451, a button 453 for switching a displayed image data to a different image data is provided. When a user performs operation in which the button 453 is selected, an instruction of transferring an image can be supplied to the information processing unit of the display device.

Note that the operation method performed by the user may be set in accordance with the input unit. For example, in the case where a touch panel provided to overlap with the display portion 450 is used as the input unit, input operation can be performed by touching the button 453 with a finger or a stylus or performing gesture operation where an image is made to slide. In the case where the input operation is performed with gesture or sound, the button 453 is not necessarily displayed.

Figure 51B:
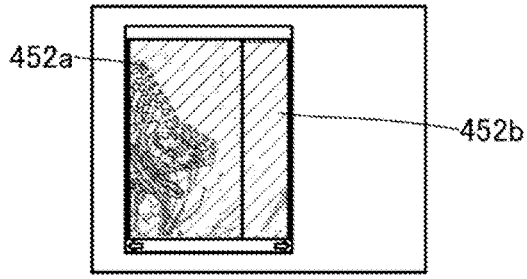

When the information processing unit of the display device receives the instruction of transferring an image, transfer of the image displayed in the window 451 starts (see FIG. 51B).

Note that in the case where display is performed at the first refresh rate in the state of FIG. 51A, the refresh rate is preferably changed to a second refresh rate before transfer of the image starts. The second refresh rate is a value necessary for displaying a moving image. For example, the second refresh rate can be higher than or equal to 30 Hz and lower than or equal to 960 Hz, preferably higher than or equal to 60 Hz and lower than or equal to 960 Hz, further preferably higher than or equal to 75 Hz and lower than or equal to 960 Hz, still further preferably higher than or equal to 120 Hz and lower than or equal to 960 Hz, still further preferably higher than or equal to 240 Hz and lower than or equal to 960 Hz.

When the second refresh rate is set to a higher value than the first refresh rate, a moving image can be displayed further smoothly and naturally. In addition, flicker which accompanies rewriting of data is less likely to be recognized by a user, whereby eye fatigue of a user can be reduced.

At this time, an image where the first image 452a and a second image 452b that is to be displayed next are combined is displayed in the window 451. The combined image is transferred unidirectionally (leftward in this case), and part of a region is displayed in the window 451.

Further, when the combined image transfers, luminance of the image displayed in the window 451 is gradually lowered from the initial luminance at the time of the state in FIG. 51A.

Figure 51C:
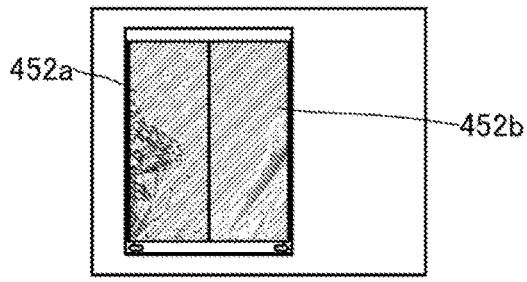

FIG. 51C illustrates a state where the image displayed in the window 451 reaches a position of the predetermined coordinates. Thus, the luminance of the image displayed in the window 451 at this time is lowest.

Note that the predetermined coordinates in FIG. 51C is set so that half of the first image 452a and half of the second image 452b are displayed; however, the coordinates are not limited to the above, and it is preferable that the coordinates be set freely by a user.

For example, the predetermined coordinates may be set so that the ratio of the distance between the initial coordinates and the predetermined coordinates to the distance between the initial coordinates and the final coordinates is higher than 0 and lower than 1.

In addition, it is also preferable that luminance when the image reaches the position of the predetermined coordinates be set freely by a user. For example, the ratio of the luminance when the image reaches the position of the predetermined coordinates to the initial luminance may be higher than 0 and lower than 1, preferably higher than or equal to 0 and lower than or equal to 0.8, further preferably higher than or equal to 0 and lower than or equal to 0.5.

Figure 51D:
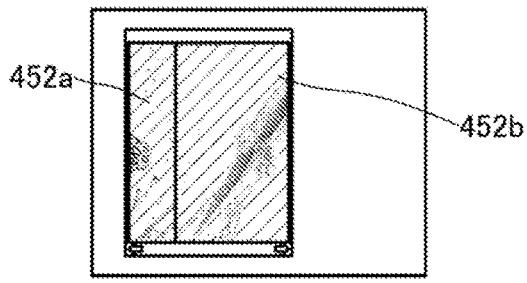

Next, in the window 451, the combined image transfers with the luminance increasing gradually (FIG. 51D).

Figure 51E:
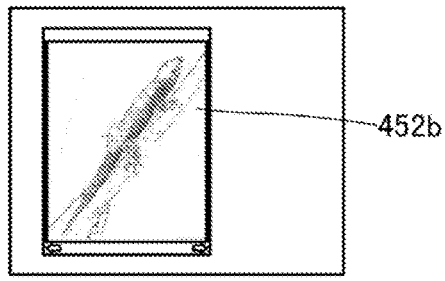

FIG. 51E illustrates a state when the combined image reaches the position of the final coordinates. In the window 451, only the second image 452b is displayed with luminance equal to the initial luminance.

Note that after the transfer of the image is completed, the refresh rate is preferably changed from the second refresh rate to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

[Display Example of Document Information]

Next, an example in which document information whose dimension is larger than a display window is displayed by scrolling is described below.

Figure 52A:
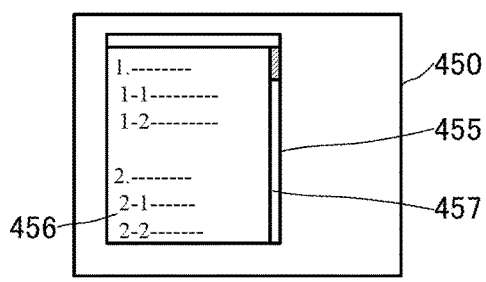
FIGS. 52A to 52E illustrate an example of a method for displaying images on a display device according to Embodiment.

FIG. 52A illustrates an example in which a window 455 and part of document information 456 which is a still image displayed in the window 455 are displayed on the display portion 450.

At this time, display is preferably performed at the first refresh rate.

The window 455 is displayed by, for example, executing application software for document display, application software for document preparation, or the like and includes a display region where document information is displayed.

The dimension of an image of the document information 456 is larger than the display region of the window 455 in the longitudinal direction. That is, part of the document information 456 is displayed in the window 455. Further, as illustrated in FIG. 52A, the window 455 may be provided with a scroll bar 457 which indicates which part in the whole of the document information 456 is displayed.

Figure 52B:
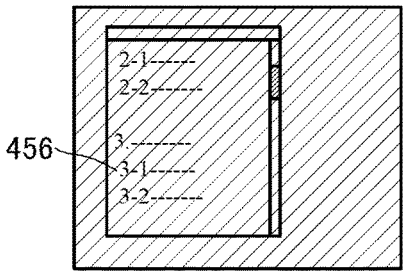

When an instruction of transferring an image (here, also referred to as scroll instruction) is supplied to the display device by the input unit, transfer of the document information 456 starts (FIG. 52B). In addition, luminance of the displayed image is gradually lowered.

Note that in the case where display is performed at the first refresh rate in the state of FIG. 52A, the refresh rate is preferably changed to the second refresh rate before transfer of the document information 456.

In this state, not only the luminance of the image displayed in the window 455 but the luminance of the whole image displayed on the display portion 450 is lowered.

Figure 52C:
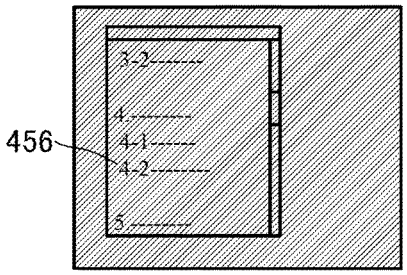

FIG. 52C illustrates a state when the document information 456 reaches a position of the predetermined coordinates. At this time, the luminance of the whole image displayed on the display portion 450 is the lowest.

Figure 52D:
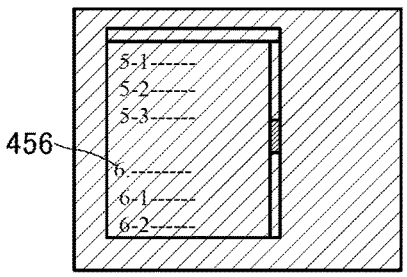

Then, the document information 456 is displayed in the window 455 while being transferred (FIG. 52D). Under this condition, the luminance of the whole image displayed on the display portion 450 is gradually increased.

Figure 52E:
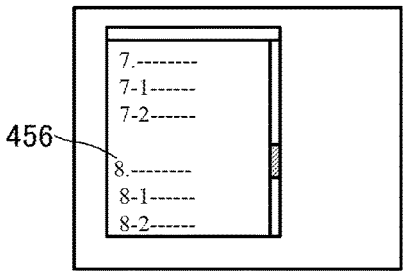

FIG. 52E illustrates a state where the document information 456 reaches a position of the final coordinates. In the window 455, a region of the document information 456, which is different from the region displayed in an initial state, is displayed with luminance equal to the initial luminance.

Note that after transfer of the document information 456 is completed, the refresh rate is preferably changed to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

In particular, display of document information or the like, which has relatively high contrast ratio, gives a user eye fatigue significantly; thus, it is preferable to apply such a driving method to the display of document information.

Note that this embodiment can be implemented in appropriate combination with any of the other embodiments disclosed in this specification.

Embodiment 8

In this embodiment, a display module, electronic devices, and a display device which include a semiconductor device of one embodiment of the present invention will be described with reference to FIG. 53, FIGS. 54A to 54G, and FIGS. 55A and 55B.

<8-1. Display Module>

Figure 53:
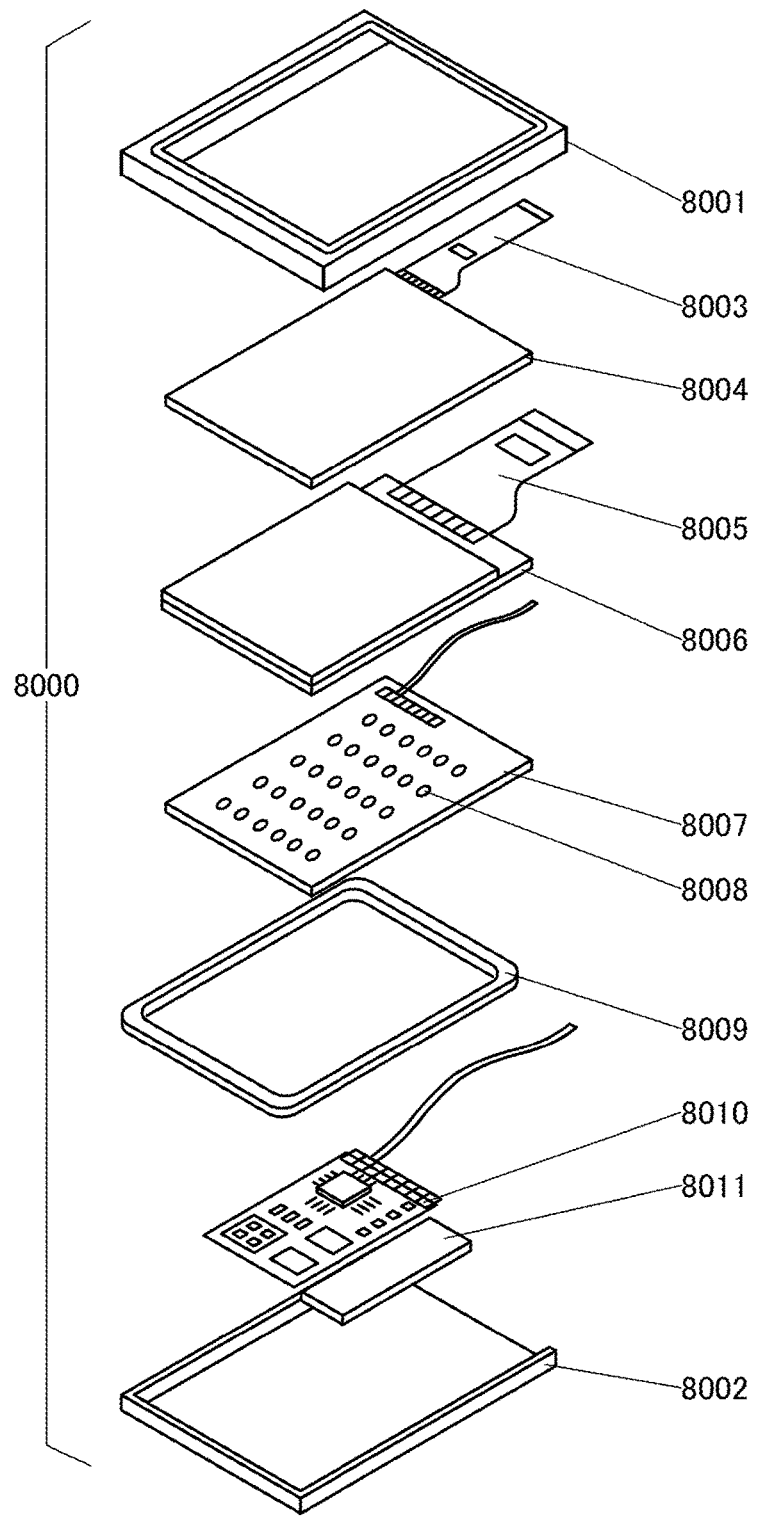
FIG. 53 illustrates a display module.

In a display module 8000 illustrated in FIG. 53, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The oxide semiconductor film or the semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 53, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective display device or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<8-2. Electronic Device>

FIGS. 54A to 54G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 54A to 54G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 54A to 54G are not limited thereto, and the electronic devices can have a variety of functions. Although not illustrated in FIGS. 54A to 54G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 54A to 54G will be described in detail below.

Figure 54A:
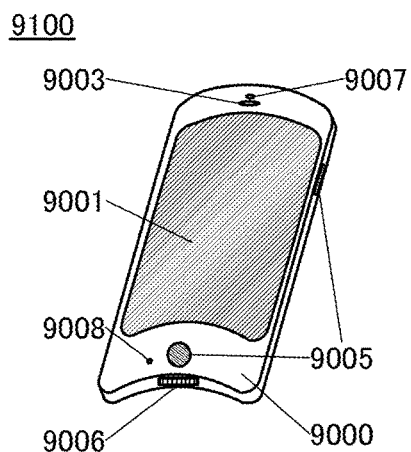
FIGS. 54A to 54G illustrate electronic devices.

FIG. 54A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 54D:
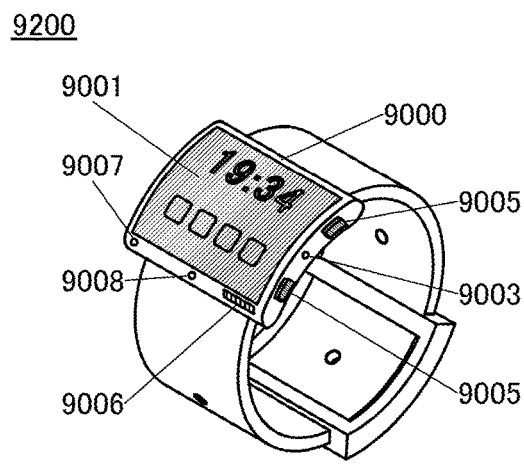
Figure 54B:
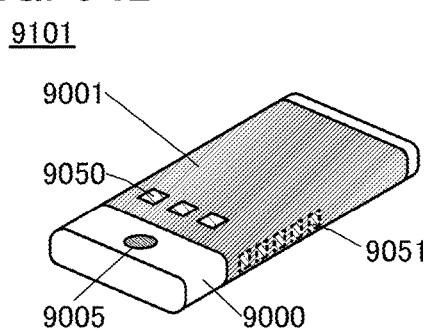

FIG. 54B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 54B, can be positioned in the portable information terminal 9101 as in the portable information terminal 9100 illustrated in FIG. 54A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, or the like; the title and sender of an e-mail, SNS message, or the like; the date; the time; remaining battery; the strength of an antenna; and the like. Instead of the information 9051, the operation buttons 9050 or the like may be displayed in the position where the information 9051 is displayed.

Figure 54E:
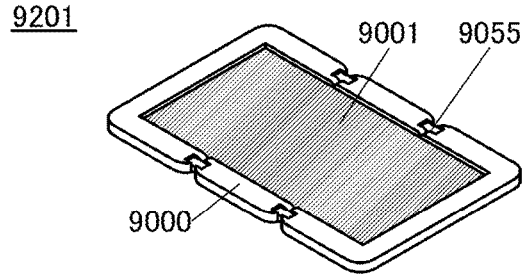
Figure 54C:
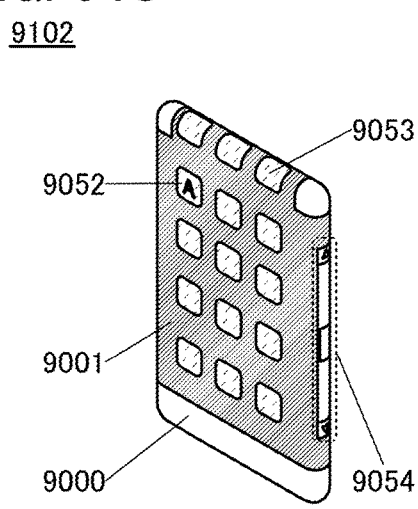

FIG. 54C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 54D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 54F:
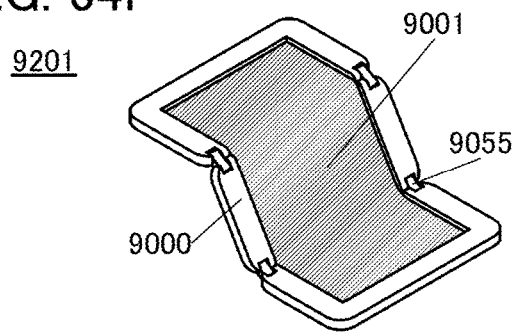
Figure 54G:
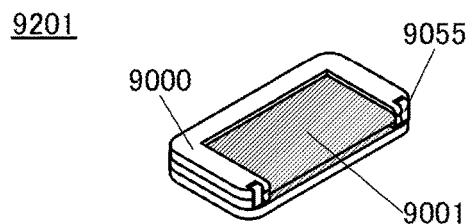

FIGS. 54E, 54F, and 54G are perspective views of a foldable portable information terminal 9201. FIG. 54E is a perspective view of the foldable portable information terminal 9201 that is opened. FIG. 54F is a perspective view of the foldable portable information terminal 9201 that is being opened or being folded. FIG. 54G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 55A:
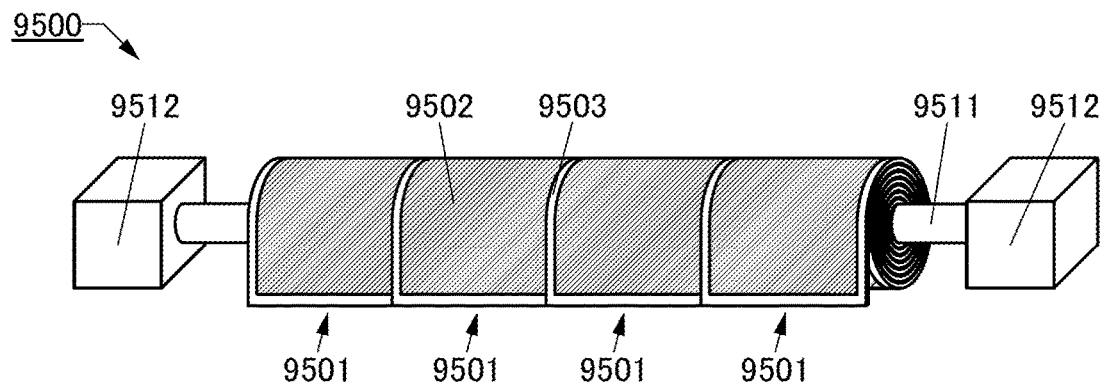
FIGS. 55A and 55B are perspective views showing a display device.
Figure 55B:
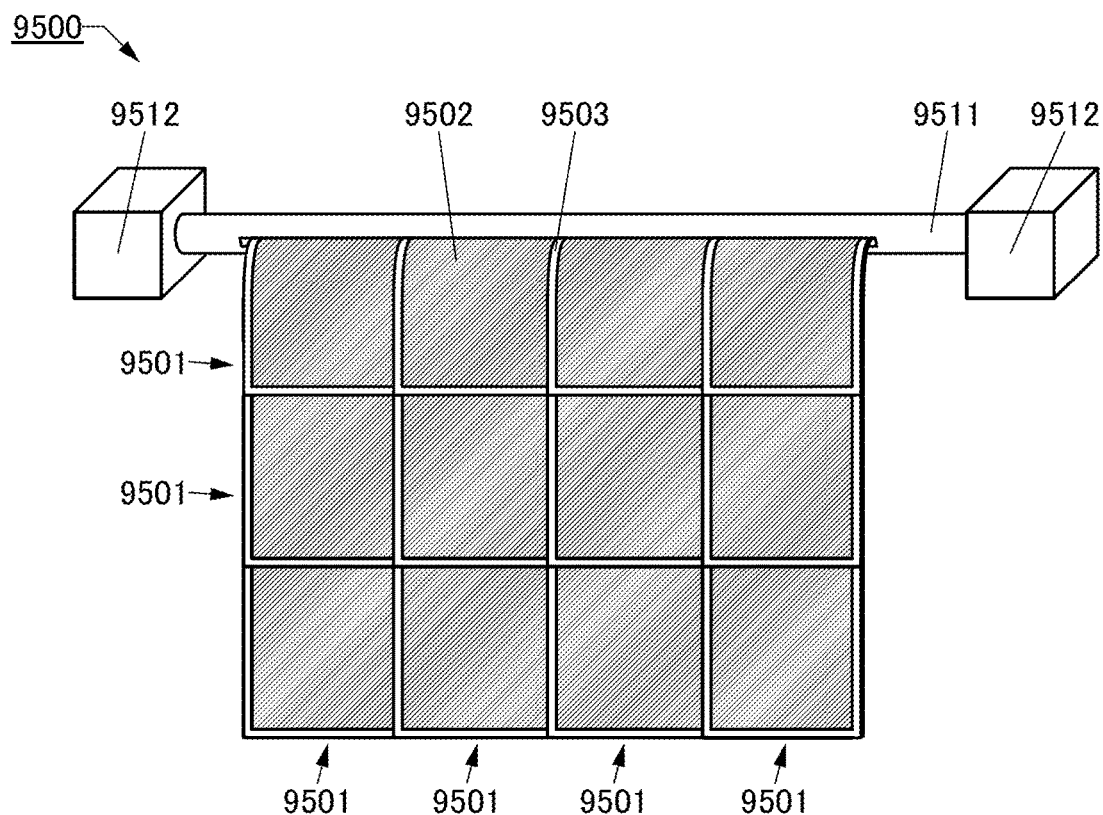

FIGS. 55A and 55B are perspective views of a display device including a plurality of display panels. Note that the plurality of display panels are wound in the perspective view in FIG. 55A, and are unwound in the perspective view in FIG. 55B.

A display device 9500 illustrated in FIGS. 55A and 55B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 55A and 55B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto, and a structure in which the display portion of the electronic device is not flexible and display is performed on a plane portion may be employed.

The structure described in this embodiment can be used in appropriate combination with the structure described in any of the other embodiments.

This application is based on Japanese Patent Application serial no. 2015-093133 filed with Japan Patent Office on Apr. 30, 2015, the entire contents of which are hereby incorporated by reference.

What is claimed is:

1. A semiconductor device comprising:
   a first transistor; and
   a second transistor,
   wherein the first transistor includes:
      a first gate electrode;
      a first insulating film over the first gate electrode;
      a first oxide semiconductor film over the first insulating film;
      a source electrode electrically connected to the first oxide semiconductor film;
      a drain electrode electrically connected to the first oxide semiconductor film;
      a second insulating film over the first oxide semiconductor film;
      a second oxide semiconductor film functioning as a second gate electrode, over the second insulating film; and
      a third insulating film over the second oxide semiconductor film,
   wherein the second transistor includes:
      a third oxide semiconductor film over the second insulating film, the third oxide semiconductor film including a channel region, a source region, and a drain region;
      a fourth insulating film over the channel region;
      a third gate electrode over the fourth insulating film; and
      the third insulating film over the source region and the drain region.

2. The semiconductor device according to claim 1,
   wherein the first oxide semiconductor film, the second oxide semiconductor film, and the third oxide semiconductor film each include In, M, and Zn, and
   wherein M is Al, Ga, Y, or Sn.

3. The semiconductor device according to claim 1,
   wherein at least one of the first oxide semiconductor film, the second oxide semiconductor film, and the third oxide semiconductor film includes a multilayer structure.

4. The semiconductor device according to claim 1,
   wherein at least one of the first oxide semiconductor film, the second oxide semiconductor film, and the third oxide semiconductor film includes a crystal part, and
   wherein the crystal part has c-axis alignment.

5. The semiconductor device according to claim 1,
wherein the first gate electrode and the second gate electrode are electrically connected to each other.

6. The semiconductor device according to claim 1,
wherein the second transistor further includes:
- a source electrode electrically connected to the source region; and
- a drain electrode electrically connected to the drain region.

7. The semiconductor device according to claim 1,
wherein the third insulating film includes one of or both hydrogen and nitrogen.

8. An electronic device comprising:
the semiconductor device according to claim 1; and
one of an operation key and a battery.

9. A display device comprising:
a driver circuit portion; and
a pixel portion,
wherein the driver circuit portion includes a first transistor, the first transistor including:
- a first gate electrode;
- a first insulating film over the first gate electrode;
- a first oxide semiconductor film over the first insulating film;
- a source electrode electrically connected to the first oxide semiconductor film;
- a drain electrode electrically connected to the first oxide semiconductor film;
- a second insulating film over the first oxide semiconductor film;
- a second oxide semiconductor film functioning as a second gate electrode, over the second insulating film; and
- a third insulating film over the second oxide semiconductor film, and wherein the pixel portion includes a second transistor, the second transistor including:
- a third oxide semiconductor film over the second insulating film, the third oxide semiconductor film including a channel region, a source region, and a drain region;
- a fourth insulating film over the channel region;
- a third gate electrode over the fourth insulating film; and
- the third insulating film over the source region and the drain region.

10. The display device according to claim 9,
wherein the first oxide semiconductor film, the second oxide semiconductor film, and the third oxide semiconductor film each include In, M, and Zn, and
wherein M is Al, Ga, Y, or Sn.

11. The display device according to claim 9,
wherein at least one of the first oxide semiconductor film, the second oxide semiconductor film, and the third oxide semiconductor film includes a multilayer structure.

12. The display device according to claim 9,
wherein at least one of the first oxide semiconductor film, the second oxide semiconductor film, and the third oxide semiconductor film includes a crystal part, and
wherein the crystal part has c-axis alignment.

13. The display device according to claim 9,
wherein the first gate electrode and the second gate electrode are electrically connected to each other.

14. The display device according to claim 9,
wherein the second transistor further includes:
- a source electrode electrically connected to the source region; and
- a drain electrode electrically connected to the drain region.

15. The display device according to claim 9,
wherein the third insulating film includes one of or both hydrogen and nitrogen.

16. A display module comprising:
the display device according to claim 9; and
a touch sensor.

17. An electronic device comprising:
the display device according to claim 9; and
one of an operation key and a battery.

* * * * *